United States Patent
Yam et al.

(10) Patent No.: US 11,770,970 B2
(45) Date of Patent: Sep. 26, 2023

(54) LUMINESCENT TETRADENTATE LIGAND-CONTAINING GOLD(III) COMPOUNDS FOR ORGANIC LIGHT-EMITTING DEVICES AND THEIR PREPARATION

(71) Applicant: THE UNIVERSITY OF HONG KONG, Hong Kong (CN)

(72) Inventors: Vivian Wing-Wah Yam, Hong Kong (CN); Man-Chung Tang, Hong Kong (CN); Lok-Kwan Li, Hong Kong (CN); Mei-Yee Chan, Hong Kong (CN)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 0 days.

(21) Appl. No.: 18/054,239

(22) Filed: Nov. 10, 2022

(65) Prior Publication Data
US 2023/0112122 A1    Apr. 13, 2023

Related U.S. Application Data

(62) Division of application No. 16/722,654, filed on Dec. 20, 2019, now Pat. No. 11,532,795.

(Continued)

(51) Int. Cl.
*H01L 51/50* (2006.01)
*H10K 85/30* (2023.01)
(Continued)

(52) U.S. Cl.
CPC ............ *H10K 85/371* (2023.02); *C07F 1/00* (2013.01); *C09K 11/06* (2013.01);
(Continued)

(58) Field of Classification Search
None
See application file for complete search history.

(56) References Cited

U.S. PATENT DOCUMENTS 11,362,287 B2    6/2022   Yam et al.
11,532,795 B2 *  12/2022  Yam .................. H10K 85/371

FOREIGN PATENT DOCUMENTS

JP    2007053132 A    3/2007

OTHER PUBLICATIONS

Adachi et al. "Endothermic energy transfer: A mechanism for generating very efficient high-energy phosphorescent emission in organic materials." Applied Physics Letters 79.13 (2001): 2082-2084.

(Continued)

*Primary Examiner* — Gregory D Clark
(74) *Attorney, Agent, or Firm* — Leason Ellis LLP

(57) ABSTRACT

A series of thermally stable and highly luminescent cyclometalated tetradentate ligand-containing gold(III) compounds was designed and synthesized. The cyclometalated tetradentate ligand-containing gold(III) compounds can be used as light-emitting material for fabrication of light-emitting devices. The cyclometalated tetradentate ligand-containing gold(III) compounds can be deposited as a layer or a component of a layer using a solution-processing technique or a vacuum deposition process. The cyclometalated tetradentate ligand-containing gold(III) compounds are robust and can provide electroluminescence with high efficiency and brightness. More importantly, the vacuum-deposited OLEDs demonstrate long operational stabilities with half-lifetime of over 29,700 hours at 100 cd m$^{-2}$.

12 Claims, 22 Drawing Sheets
(17 of 22 Drawing Sheet(s) Filed in Color)

Related U.S. Application Data

(60) Provisional application No. 62/783,829, filed on Dec. 21, 2018.

(51) Int. Cl.
    *C09K 11/06*     (2006.01)
    *C07F 1/00*     (2006.01)
    *H10K 50/11*     (2023.01)
    *H10K 71/12*     (2023.01)
    *H10K 71/16*     (2023.01)
    *H10K 101/10*     (2023.01)

(52) U.S. Cl.
    CPC .............. *C09K 2211/1007* (2013.01); *C09K 2211/1029* (2013.01); *C09K 2211/1044* (2013.01); *C09K 2211/188* (2013.01); *H10K 50/11* (2023.02); *H10K 71/12* (2023.02); *H10K 71/164* (2023.02); *H10K 2101/10* (2023.02)

(56) References Cited

OTHER PUBLICATIONS

Baldo et al. "Highly efficient phosphorescent emission from organic electroluminescent devices." Nature 395.6698 (1998): 151-154.
Baldo et al. "Very high-efficiency green organic light-emitting devices based on electrophosphorescence." Applied Physics Letters 75.1 (1999): 4-6.
Burroughes et al. "Light-emitting diodes based on conjugated polymers." Nature 347.6293 (1990): 539-541.
Burrows et al. "Prospects and applications for organic light-emitting devices." Current Opinion in Solid State and Materials Science 2.2 (1997): 236-243.
Cheng et al. "Structurally robust phosphorescent [Pt (O$^\wedge$N$^\wedge$C$^\wedge$N)] emitters for high performance organic light-emitting devices with power efficiency up to 126 Im W-1 and external quantum efficiency over 20%." Chemical Science 5.12 (2014): 4819-4830.
Helfrich et al. "Recombination Radiation in Anthracene Crystals." Physical Review Letters 14.7 (1965): 229-232.
Kaneto et al. "Electroluminescence in polyethylene terephthalate." Japanese Journal of Applied Physics 13.6 (1974): 1023.
Kawamura et al. "100% phosphorescence quantum efficiency of Ir (III) complexes in organic semiconductor films." Applied Physics Letters 86.7 (2005): 071104.
Kim et al. "Organic Light-Emitting diodes with 30% external quantum efficiency based on a horizontally oriented emitter." Advanced Functional Materials 23.31 (2013): 3896-3900.
O'Brien et al. "Improved energy transfer in electrophosphorescent devices." Applied Physics Letters 74.3 (1999): 442-444.
Rausch et al. "Matrix effects on the triplet state of the OLED emitter Ir (4, 6-dFppy) 2 (pic)(FIrpic): investigations by high-resolution optical spectroscopy." Inorganic chemistry 48.5 (2009): 1928-1937.
Tang et al. "Organic electroluminescent diodes." Applied Physics Letters 51.12 (1987): 913-915.
Udagawa et al. "Simultaneous Realization of High EQE of 30%, Low Drive Voltage, and Low Efficiency Roll-Off at High Brightness in Blue Phosphorescent OLEDs." Advanced Optical Materials 4.1 (2016): 86-90.

\* cited by examiner

LUMINESCENT TETRADENTATE LIGAND-CONTAINING GOLD(III) COMPOUNDS FOR ORGANIC LIGHT-EMITTING DEVICES AND THEIR PREPARATION

RELATED APPLICATIONS

This application is a divisional application of Ser. No. 16/722,654 filed Dec. 20, 2019, which claims priority to provisional application Ser. No. 62/783,829 filed Dec. 21, 2018 which is incorporated by reference in its entirety.

1. FIELD

Described herein are luminescent cyclometalated tetradentate ligand-containing gold(III) compounds and the syntheses of these compounds. These compounds can be used as light-emitting materials in phosphorescent organic light-emitting devices (PHOLEDs). In specific embodiments, the compounds have good operational stability with half-lifetime over 29,700 hours at 100 cd m$^{-2}$.

2. BACKGROUND

Taking the advantages of low cost, light weight, low power consumption, high brightness, excellent color tunability, wide viewing angle of up to 180 degrees as well as their ease of fabrication onto flexible substrates, organic light-emitting devices (OLEDs) are considered as remarkably attractive candidates for flat panel displays and solid-state lighting systems. Compared with the pure organic counterparts, transition metal complexes have been extensively studied over the past three decades due to the presence of the heavy metal center, which can effectively lead to a strong spin-orbit coupling and thus promotes an efficient intersystem crossing to harvest triplet excitons for generating phosphorescence. This can theoretically result in a four-fold enhancement in the internal quantum efficiency (IQE) of the OLEDs up to 100% due to the harvesting of all triplet and singlet excitons. Typically, an OLED consists of several layers of semiconductors sandwiched between two electrodes. The cathode is composed of a low work function metal or metal alloy deposited by vacuum evaporation, whereas the anode is a transparent conductor such as indium tin oxide (ITO). Upon the application of a DC voltage, holes injected by the ITO anode and electrons injected by the metal cathode will recombine to form excitons. Subsequent relaxation of excitons will then result in the generation of electroluminescence (EL).

The EL from organic materials was first discovered in anthracene crystals immersed in liquid electrolyte in 1965 [Helfruch, W.; Schneider. W. G. Phys. Rev. Lett. 14, 229 (1965)]. Although a lower operating voltage could be achieved by using a thin film of anthracene with solid electrodes, very low efficiencies were encountered with these single-layer devices. Meanwhile, EL from organic polymers was initially reported in the 1970s [Kaneto, K.; Yoshino, K.; Koa, K.; Inuishi, Y. Jpn. J. Appl. Phys. 13, 1023 (1974)], where green emission from polyethylene terephthalate was observed when an impulse voltage was applied. The breakthroughs that led to the exponential growth of this field and to its first commercialized products can be traced to two successful demonstrations. Tang and VanSlyke proposed the use of a double-layer structure of vacuum deposited, small-molecular films, in which tris(8-hydroxyquinoline)aluminum (Alq3) was utilized both as light-emitting layer and electron transporting layer [Tang, C. W.; VanSlyke, S. A. Appl. Phys. Lett. 51, 913 (1987)]. Later, the first polymeric light-emitting device was developed by Burroughs et al. in 1990 [Burroughs, J. H.; Bradley, D. D. C.; Brown, A. R.; Marks, N.; Friend, R. H.; Burn, P. L.; Holmes, A. B. Nature 347, 539 (1990)], in which a yellow-green EL from poly(p-phenylenenvinylene) (PPV) was achieved. Since then, a number of new electroluminescent small molecular and polymeric light-emitting materials have been investigated with improved light-emitting properties. The key advantage of using polymers as light-emitting materials is their high solubility in most of the common organic solvents, and thus OLEDs can be easily fabricated by using low-cost and efficient wet processing techniques, such as spin-coating, screen-printing, or inkjet printing [Burrows, P. E.; Forrest, S. R.; Thompson, M. E. Curr. Opin. Solid State Mat. Sci. 2, 236 (1997)].

In 1998, Baldo et al. demonstrated an efficient PHOLED with high IQE by using platinum(II) 2,3,7,8,12,13,17,18-octaethyl-21H,23H-porphyrin (PtOEP) as a dopant [Baldo, M. A.; O'Brien, D. F.; You, Y.; Shoustikow, A.; Sibley, S.; Thompson, M. E.; Forrest, S. R. Nature 395, 151 (1998); O'Brien, D. F.; Baldo, M. A.; Thompson, M. E.; Forrest, S. R. Appl. Phys. Lett. 74, 442 (1999)]. Such multilayer device consisted of an emitting layer of Alq$_3$ doped with PtOEP and showed a strong emission at 650 nm arising from the triplet excitons of PtOEP. Since then, a large number of metal complexes have been demonstrated with excellent photophysical properties. Particularly, cyclometalated iridium(III) compounds are one of the most widely investigated classes of metal complexes. Most of the cyclometalated iridium(III) complexes show intense phosphorescence and have been extensively investigated for the fabrication of high efficiency OLEDs. Of particular interest is the development of iridium (III) complexes with 2-phenylpyridine ligand(s). In 1999, Thompson, Forrest and co-workers have demonstrated more efficient PHOLEDs based on fac-tris(2-phenylpyridine) iridium(III) [Ir(ppy)3] as phosphorescent emitting material doped in a 4,4'-N,N'-dicarbazole-biphenyl (CBP) host [Baldo, M. A.; Lamansky, S.; Burrows, P. E.; Thompson. M. E.; Forrest, S. R. Appl. Phys. Lett. 75, 4 (1999)]. Another successful iridium(III) complex is sky-blue-emitting iridium (III) bis[2-(4',6'-difluorophenyl)pyridinato-N,C$^2$]-picolinate [FIr(pic)], which exhibits a higher photoluminescence quantum yield (PLQY) of about 60% in solution and nearly 100% in a solid-state thin film when doped into a high triplet energy host [Rausch, A. F.; Thompson, M. E.; Yersin, H. Inorg. Chem. 48, 1928 (2009); Adachi, C; Kwong, R. C.; Djurovich, P. I.; Adamovich, V.; Baldo, M. A.; Thompson, M. E.; Forrest, S. R. Appl. Phys. Lett. 79, 2082 (2001); Kawamura, Y; Goushi, K.; Brooks, J.; Brown, J. J.; Sasabe, H.; Adachi, C. Appl. Phys. Lett. 86, 071104 (2005)]. Highly efficient OLEDs with external quantum efficiencies (EQEs) of up to 30% have recently been demonstrated based on the iridium(III) systems [Kim, S.-Y; Jeong, W.-I.; Mayr, C.; Park, Y.-S.; Kim, K.-H.; Lee, J.-H.; Moon, C.-K.; Brutting, W.; Kim, J.-J. Adv. Funct. Mater. 23, 3829 (2013); Udagawa, K.; Sasabe, H.; Igarashi, F.; Kido, J. Adv. Opt. Mater. 4, 86 (2015)].

Apart from the iridium(III) systems with d$^6$ electronic configuration and octahedral geometry, the coordination-unsaturated nature of d$^8$ transition metal complexes with square-planar structures has been found to provide intriguing spectroscopic and luminescence properties related to the unique tendency of these metal centers to exhibit non-covalent metal . . . metal interactions. Of particular interest is the platinum(II) compounds due to their rich luminescence properties, associated with their strong propensity to from Pt . . . Pt and π-π interactions. Notably, unlike the case of the iridium(III) systems, the use of bidentate cyclometalated ligands will not lead to isomerization during synthesis or sublimation. Moreover, further stabilization of these platinum(II) complexes can be accomplished through the use of tridentate and tetradentate ligands to give highly robust metal complex systems. To date, highly efficient OLEDs with power efficiencies of up to 126 lm $W^{-1}$ and EQEs of up to 26.5% have been achieved [Cheng, G.; Kui, S. C.-F.; Ang, W.-H.; Ko, M.-Y; Chow, P.-K.; Kwong, C.-L.; Kwok, C.-C.; Ma, C.; Guan, X.; Low, K.-H.; Su, S.-J.; Che, C.-M. *Chem. Sci.* 5, 4819 (2014)]. In contrast to the isoelectronic platinum(II) compounds, luminescent gold(III) complexes are relatively less explored, probably due to the presence of low-energy d-d ligand field (LF) states and the electrophilicity of the gold(III) metal center. It is difficult to coordinate cyclometalated tetradentate ligands to the gold (III) metal center through successive C—H activations, unlike the case for the isoelectronic platinum(II) complexes where cyclometalated tetradentate ligands can be easily incorporated into the platinum(II) center via one-pot reaction. Thus, there is a need to provide gold(III) complexes that have more enhanced photophysical properties and involve less steps during synthesis.

3. SUMMARY

The present disclosure provides a luminescent gold(III) compound having the chemical structure shown in the generic formula (I):

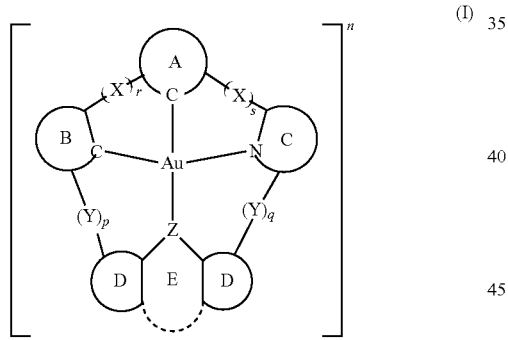

wherein:
(a) Z is selected from the group consisting of B, C, N, O, Si, P, P(=O), S and Se;
(b) rings A and B are each coordinated to the Au atom through a carbon atom, and are each independently a substituted or unsubstituted aryl group, preferably a phenyl group, or a substituted or unsubstituted heteroaryl group;
(c) ring C is coordinated to the Au atom through a nitrogen atom, and is selected from the group consisting of a substituted or unsubstituted pyridyl group, a substituted or unsubstituted quinolinyl group, a substituted or unsubstituted isoquinolinyl group, a substituted or unsubstituted pyrazinyl group, a substituted or unsubstituted pyrimidinyl group, a substituted or unsubstituted pyridazinyl group, a substituted or unsubstituted triazinyl group, a substituted or unsubstituted carbolinyl group, a substituted or unsubstituted imidazolyl group, a substituted or unsubstituted benzimidazolyl group, a substituted or unsubstituted pyrazolyl group, a substituted or unsubstituted thienopyridinyl, a substituted or unsubstituted furopyridinyl group, a substituted or unsubstituted selenophenopyridinyl group, a substituted or unsubstituted thiazolyl group, a substituted or unsubstituted thiadiazolyl group, a substituted or unsubstituted oxadiazolyl group, a substituted or unsubstituted triazolyl group, a substituted or unsubstituted oxazolyl group and a substituted or unsubstituted isoxazolyl group,
(d) each D is independently at each occurrence absent or a cyclic or acyclic moiety wherein:
the cyclic moiety is selected from the group consisting of a substituted or unsubstituted aryl group, preferably a phenyl group, a substituted or unsubstituted heteroaryl group, preferably a pyridyl group, a substituted or unsubstituted cycloalkyl group, and a substituted or unsubstituted polycyclic group; and
the acyclic moiety is selected from the group consisting of a substituted or unsubstituted alkynyl, a substituted or unsubstituted arylalkynyl, a substituted or unsubstituted alkyl, a substituted or unsubstituted alkylaryl, a substituted or unsubstituted alkoxy, a substituted or unsubstituted arylalkoxy, a substituted or unsubstituted acene, and a substituted or unsubstituted a heteroacene;
(e) E is absent, an acyclic moiety selected from the group consisting of a substituted or unsubstituted alkynyl, a substituted or unsubstituted arylalkynyl, a substituted or unsubstituted alkyl, a substituted or unsubstituted alkylaryl, a substituted or unsubstituted alkoxy, a substituted or unsubstituted arylalkoxy, a substituted or unsubstituted thiolate, a substituted or unsubstituted arylthiolate, a substituted or unsubstituted phosphide, a substituted or unsubstituted arylphosphide, a substituted or unsubstituted boride, a substituted or unsubstituted arylboride, a substituted or unsubstituted acene and a substituted or unsubstituted heteroacene,
or E, together with Z and the atoms to which they are respectfully attached forms a cyclic moiety selected from the group consisting of a substituted or unsubstituted pyridyl group, a substituted or unsubstituted pyrrolyl group, a substituted or unsubstituted thiophenyl group, a substituted or unsubstituted furanyl group, a substituted or unsubstituted pyrazolyl group, a substituted or unsubstituted oxazolyl group, a substituted or unsubstituted imidazolyl group, a substituted or unsubstituted pyrazinyl group, a substituted or unsubstituted pyrimidinyl group, a substituted or unsubstituted pyridazinyl group, a substituted or unsubstituted piperazinyl group, a substituted or unsubstituted oxazinyl group, a substituted or unsubstituted morpholinyl group, a substituted or unsubstituted thiomorpholinyl group, a substituted or unsubstituted thiazinyl group, and a substituted or unsubstituted piperidinyl group;
or D, E and Z together represent a substituted or unsubstituted, monocyclic or fused polycyclic aryl or heteroaryl group;
(f) or D, Y and C, and/or D, Y and B, together represent a substituted or unsubstituted, monocyclic or fused polycyclic aryl or heteroaryl group; X and Y are each independently at each occurrence non-coordination sites selected from the group consisting of, —CRR', —C=O, —NR, —O, —PR, —P(=O)R, —BR, S, —SO, —SO$_2$, —SiRR', Se, —AsR, —CH=CH— and —CR=CR—', wherein R and R' are independently selected from the group consisting of hydrogen, halogen, aryl, alkyl, heteroaryl, nitro, trifluoromethyl, cyano, arylether, alkylether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonateester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, a heterocyclic group and derivatives thereof;

(g) wherein p, q, r and s are each independently 0, 1, 2 or 3; and (h) n is zero, a positive integer or a negative integer.

It is apparent to a person of skill in the art that n represents a charge of the complex and is zero (i.e., neutral complex), a positive integer (i.e., positively charged complex) or a negative integer (i.e., negatively charged complex).

In certain embodiments, the gold(III) compound is deposited as a thin layer on a substrate layer.

In certain embodiments, the gold(III) compound comprises a thin layer that is prepared by vacuum deposition, spin-coating, or inkjet printing.

In certain embodiments, the gold(III) compound has photoluminescence properties within a range of about 380 to 1050 nm.

In certain embodiments, the gold(III) compound emits light in response to the passage of an electric current or to a strong electric field.

In certain embodiments, the gold(III) compound is used to fabricate an OLED.

In certain embodiments, the gold(III) compound serves as the light-emitting layer of the OLED.

In certain embodiments, the gold(III) compound serves as a dopant in the light-emitting layer or emissive layer of the OLED.

Disclosed herein is a method for preparing a luminescent compound with cyclometalated tetradentate ligand comprising the following reaction:

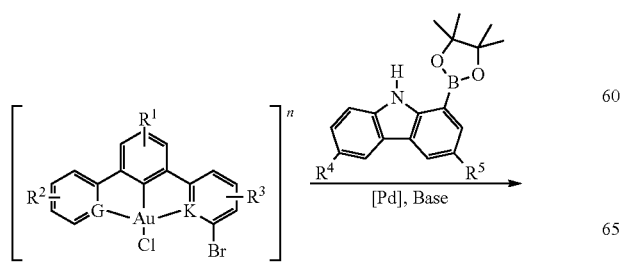

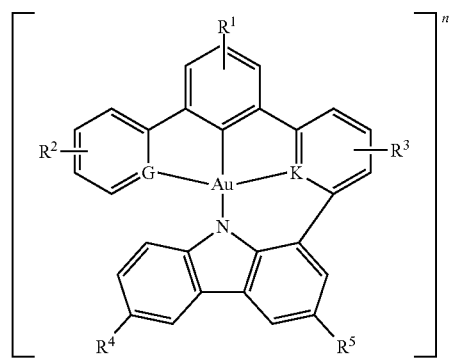

wherein:
(a) G and K are each independently C or N, with G and K are not the same;
(b) $R^1$, $R^2$, $R^3$, $R^4$ and $R^5$ groups are each independently selected from the group consisting of OR, NR2, SR, C(O)R, C(O)OR, C(O)NR$_2$, CN, CF$_3$, NO$_2$, SO$_2$, SOR, SO$_2$R, SO$_3$R, halo, or alkyl, alkenyl, alkynyl, alkylaryl, aryl and cycloalkyl with one or more alkyl, alkenyl, alkynyl, alkylaryl, aryl and cycloalkyl being optionally substituted with one or more OR, NR$_2$, SR, C(O)R, C(O)OR, C(O)NR$_2$, CN, CF$_3$, NO$_2$, SO$_2$, SOR, SO$_2$R, SO$_3$R, halo, aryl, substituted aryl, heteroaryl, substituted heteroaryl or a heterocyclic group, wherein R is independently at each occurrence alkyl, alkynyl, alkylaryl, aryl or cycloalkyl; and
(c) n is zero, a positive integer or a negative integer.

In certain embodiments, a luminescent compound is prepared.

In certain embodiments, the gold(III) metal center comprises a light-emitting layer of a light-emitting device.

In certain embodiments, the gold(III) metal group comprises a layer of a light-emitting device.

In certain embodiments, the gold(III) metal compound is a dopant included in the light-emitting layer or emissive layer of the light-emitting device.

In certain embodiments, the gold(III) metal compound is a dopant included in a light-emitting device.

Provided in this disclosure is a light-emitting device with an ordered structure comprising an anode, a hole-transporting layer, a light-emitting layer, an electron-transporting layer and a cathode wherein the light-emitting layer comprises a gold(III) compound having a chemical structure represented by the following general formula (I), (I)

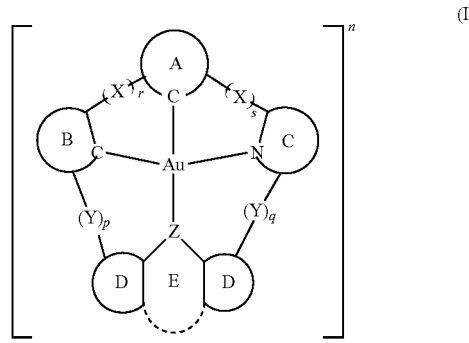

wherein:
(a) Z is selected from the group consisting of B, C, N, O, Si, P, P(=O), S and Se;
(b) rings A and B are each coordinated to the Au atom through a carbon atom, and are each independently a substituted or unsubstituted aryl group, preferably a phenyl group, or a substituted or unsubstituted heteroaryl group;
(c) ring C is coordinated to the Au atom through a nitrogen atom, and is selected from the group consisting of a substituted or unsubstituted pyridyl group, a substituted or unsubstituted quinolinyl group, a substituted or unsubstituted isoquinolinyl group, a substituted or unsubstituted pyrazinyl group, a substituted or unsubstituted pyrimidinyl group, a substituted or unsubstituted pyridazinyl group, a substituted or unsubstituted triazinyl group, a substituted or unsubstituted carbolinyl group, a substituted or unsubstituted imidazolyl group, a substituted or unsubstituted benzimidazolyl group, a substituted or unsubstituted pyrazolyl group, a substituted or unsubstituted thienopyridinyl, a substituted or unsubstituted furopyridinyl group, a substituted or unsubstituted selenophenopyridinyl group, a substituted or unsubstituted thiazolyl group, a substituted or unsubstituted thiadiazolyl group, a substituted or unsubstituted oxadiazolyl group, a substituted or unsubstituted triazolyl group, a substituted or unsubstituted oxazolyl group and a substituted or unsubstituted isoxazolyl group,
(d) each D is independently at each occurrence absent or a cyclic or acyclic moiety wherein:
  the cyclic moiety is selected from the group consisting of a substituted or unsubstituted aryl group, preferably a phenyl group, a substituted or unsubstituted heteroaryl group, preferably a pyridyl group, a substituted or unsubstituted cycloalkyl group, and a substituted or unsubstituted polycyclic group; and
  the acyclic moiety is selected from the group consisting of a substituted or unsubstituted alkynyl, a substituted or unsubstituted arylalkynyl, a substituted or unsubstituted alkyl, a substituted or unsubstituted alkylaryl, a substituted or unsubstituted alkoxy, a substituted or unsubstituted arylalkoxy, a substituted or unsubstituted acene, and a substituted or unsubstituted a heteroacene;
(e) E is absent, an acyclic moiety selected from the group consisting of a substituted or unsubstituted alkynyl, a substituted or unsubstituted arylalkynyl, a substituted or unsubstituted alkyl, a substituted or unsubstituted alkylaryl, a substituted or unsubstituted alkoxy, a substituted or unsubstituted arylalkoxy, a substituted or unsubstituted thiolate, a substituted or unsubstituted arylthiolate, a substituted or unsubstituted phosphide, a substituted or unsubstituted arylphosphide, a substituted or unsubstituted boride, a substituted or unsubstituted arylboride, a substituted or unsubstituted acene and a substituted or unsubstituted heteroacene,
  or E, together with Z and the atoms to which they are respectfully attached forms a cyclic moiety selected from the group consisting of a substituted or unsubstituted pyridyl group, a substituted or unsubstituted pyrrolyl group, a substituted or unsubstituted thiophenyl group, a substituted or unsubstituted furanyl group, a substituted or unsubstituted pyrazolyl group, a substituted or unsubstituted oxazolyl group, a substituted or unsubstituted imidazolyl group, a substituted or unsubstituted pyrazinyl group, a substituted or unsubstituted pyrimidinyl group, a substituted or unsubstituted pyridazinyl group, a substituted or unsubstituted piperazinyl group, a substituted or unsubstituted oxazinyl group, a substituted or unsubstituted morpholinyl group, a substituted or unsubstituted thiomorpholinyl group, a substituted or unsubstituted thiazinyl group, and a substituted or unsubstituted piperidinyl group;
  or D, E and Z together represent a substituted or unsubstituted, monocyclic or fused polycyclic aryl or heteroaryl group;
(f) or D, Y and C, and/or D, Y and B, together represent a substituted or unsubstituted, monocyclic or fused polycyclic aryl or heteroaryl group;X and Y are each independently at each occurrence non-coordination sites selected from the group consisting of, —CRR', —C=O, —NR, —O, —PR, —P(=O)R, —BR, S, —SO, —SO$_2$, —SiRR', Se, —AsR, —CH=CH— and —CR=CR—', wherein R and R' are independently selected from the group consisting of hydrogen, halogen, aryl, alkyl, heteroaryl, nitro, trifluoromethyl, cyano, arylether, alkylether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonateester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, a heterocyclic group and derivatives thereof;
(g) wherein p, q, r and s are each independently 0, 1, 2 or 3; and
(h) n is zero, a positive integer or a negative integer.

In certain embodiments, the light-emitting layer or emissive layer is prepared using vacuum deposition or solution processing technique.

Provided in this disclosure is an apparatus comprising: a compound disclosed herein, wherein the apparatus is selected from the group consisting of a television, a copier, a printer, a liquid crystal display, a measuring instrument, a display board, a marker lamp, an electrophotographic photoreceptor, a photoelectric transducer, a solar cell or an image sensor, such that the apparatus incorporates the compound for light emission purposes.

In one or more embodiments, a new class of gold(III) complexes with tetradentate ligands that can be obtained from a simple one-pot reaction is provided. Particularly, the claimed compounds can be prepared by Suzuki-Miyaura cross-coupling followed by Buchwald-Hartwig cross-coupling of the gold(III) precursor complex and the precursor ligand, with intramolecular cyclization occurring spontaneously to generate the gold(III) complexes with tetradentate ligands in one pot. This can significantly increase the ease of preparation and reduction in the number of steps for synthesis and purification, as well as improve the product yield. This will no doubt be of great benefit to display and solid-state lighting companies. The more rigid tetradentate ligand framework can effectively rigidify the molecule and reduce the non-radiative decay, and thus improve the chemical and thermal stabilities of the claimed gold(III) complexes, as exemplified by their high decomposition temperatures of 350-500° C. In addition, the emission color of the tetradentate gold(III) complexes can be effectively tuned by changing the N-donor atoms on the cyclometalating tetradentate ligand. This opens up a possibility to fabricate the devices by either vacuum deposition or solution-processing techniques, such as spin-coating and ink-jet printing. High performance vacuum-deposited and solution-processable OLEDs with EQEs of 5-30% and 2-20%, respectively, have been demonstrated. More importantly, such vacuum-deposited devices show satisfactory long operational stabilities with half-lifetime of 5000-30,000 hours at 100 cd m$^{-2}$.

4. BRIEF DESCRIPTION OF THE DRAWINGS

The patent or application file contains at least one drawing executed in color. Copies of this patent or patent application publication with color drawings will be provided by the Office upon request and payment of the necessary fee.

The disclosure is illustrated in the figures of the accompanying drawings which are meant to be exemplary and not limiting, in which like references are intended to refer to like or corresponding parts, and in which.

Figure 4:
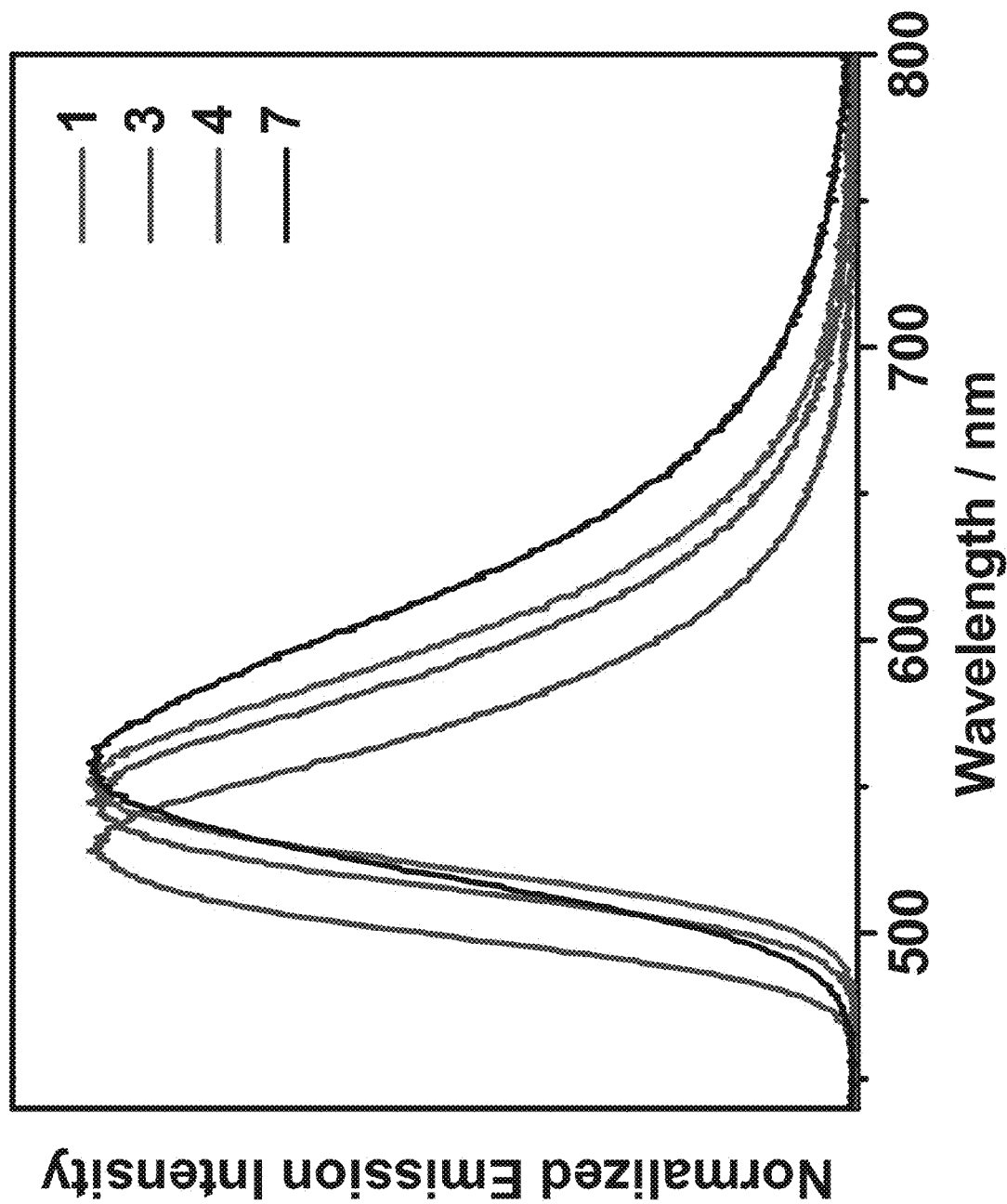

FIG. 4 shows the normalized PL spectra of thin films of compounds 1, 3, 4 and 7 doped into 1,3-bis(carbazol-9-yl) benzene (MCP) at 10 wt % at 298 K, in accordance with one or more embodiments herein.

Figure 5:
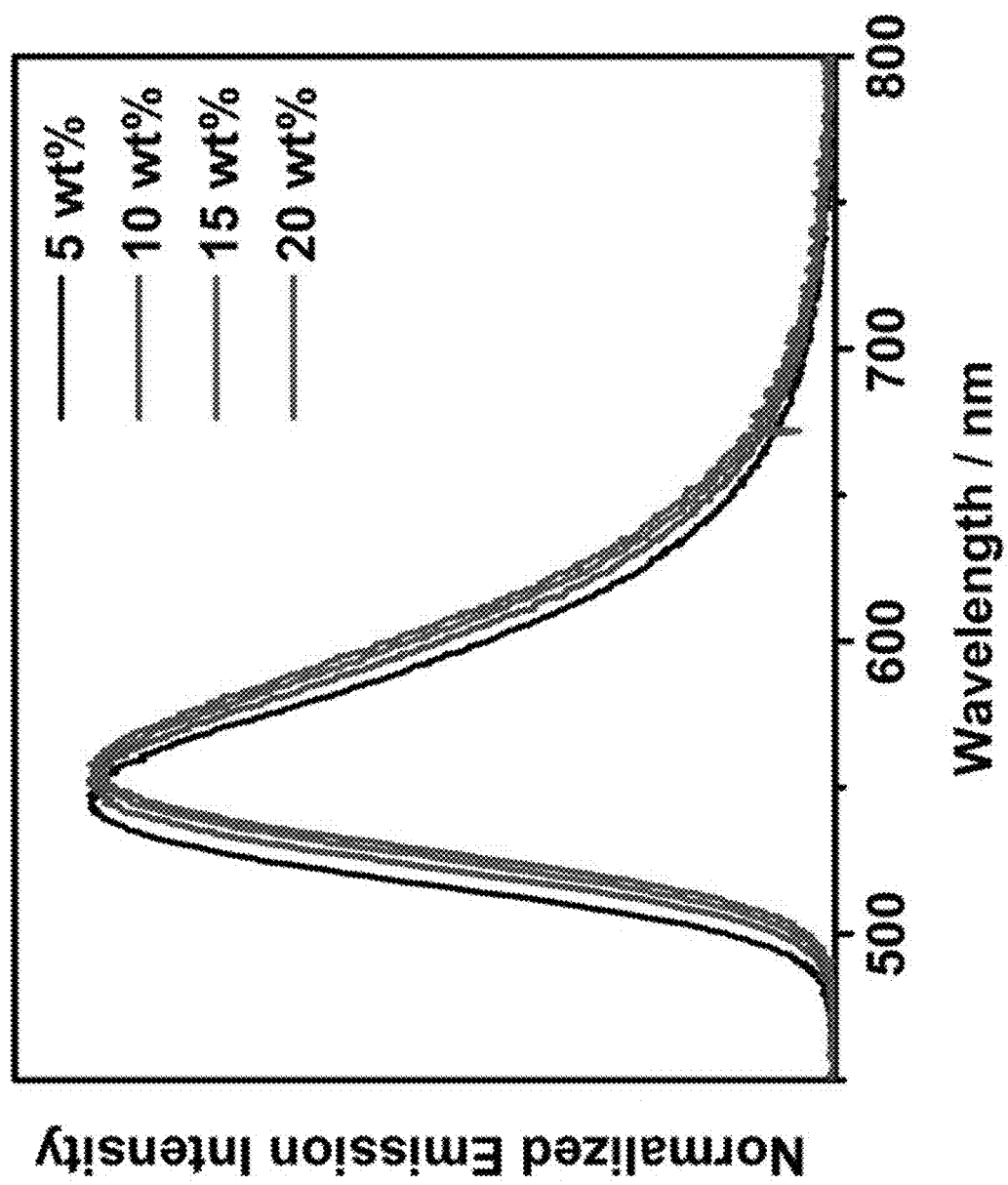

FIG. 5 shows the solid-state thin film emission spectra of compound 1 doped into MCP at 5, 10, 15 and 20 wt % at 298 K, in accordance with one or more embodiments herein.

Figure 6:
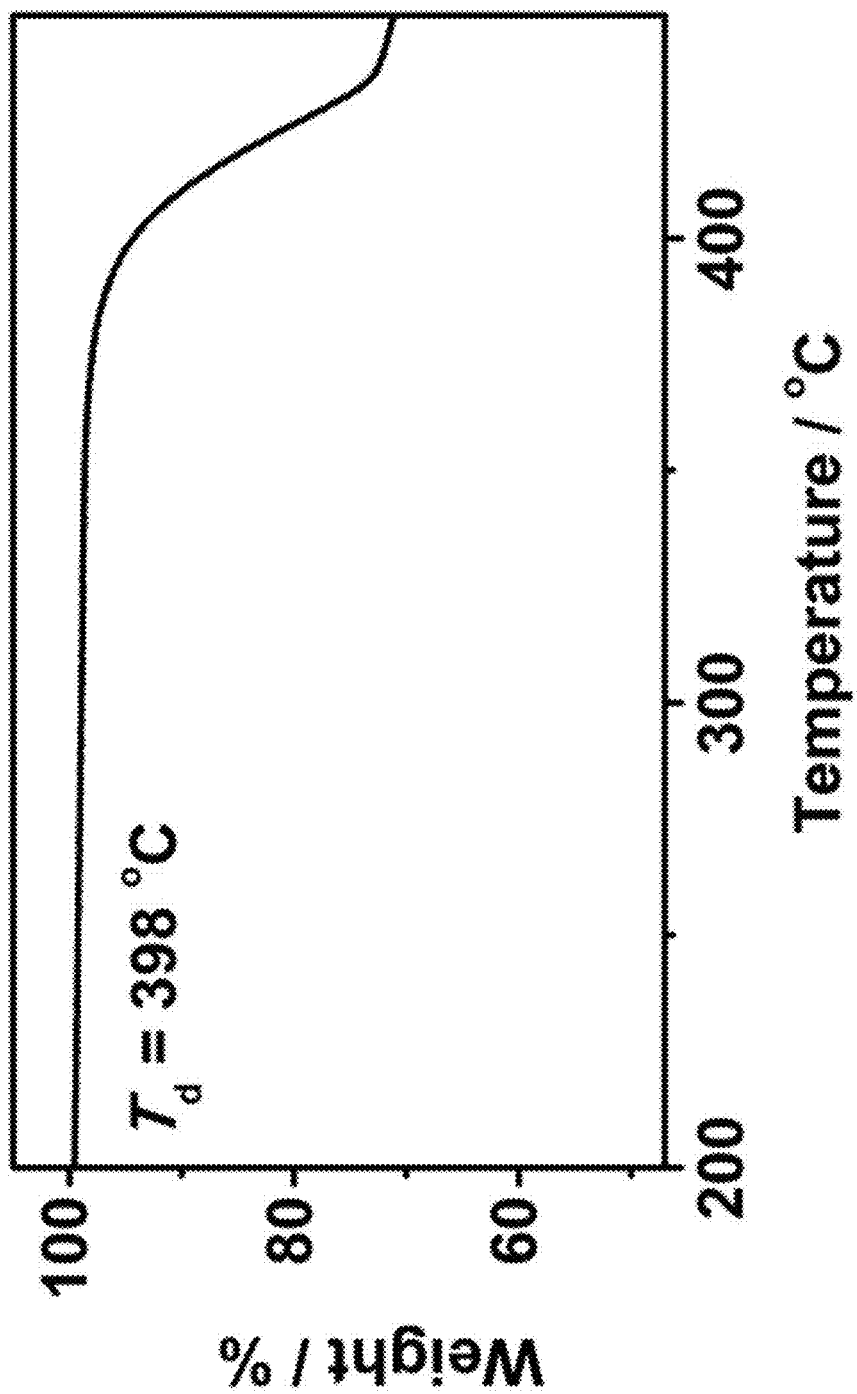

FIG. 6 shows the thermogravimetric analysis (TGA) trace of compound 1, in accordance with one or more embodiments herein.

Figure 7:
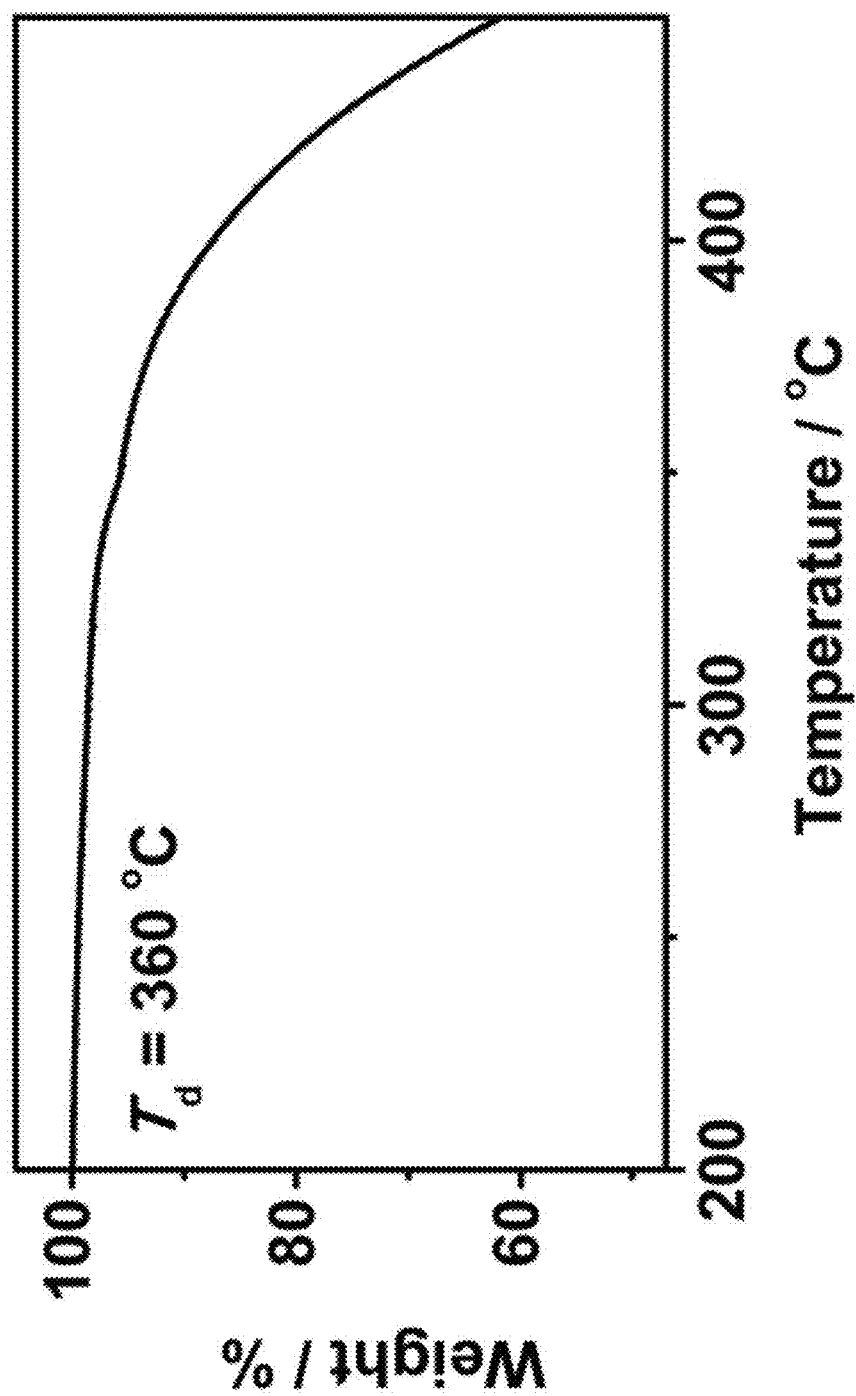

FIG. 7 shows the TGA trace of compound 2, in accordance with one or more embodiments herein.

Figure 8:
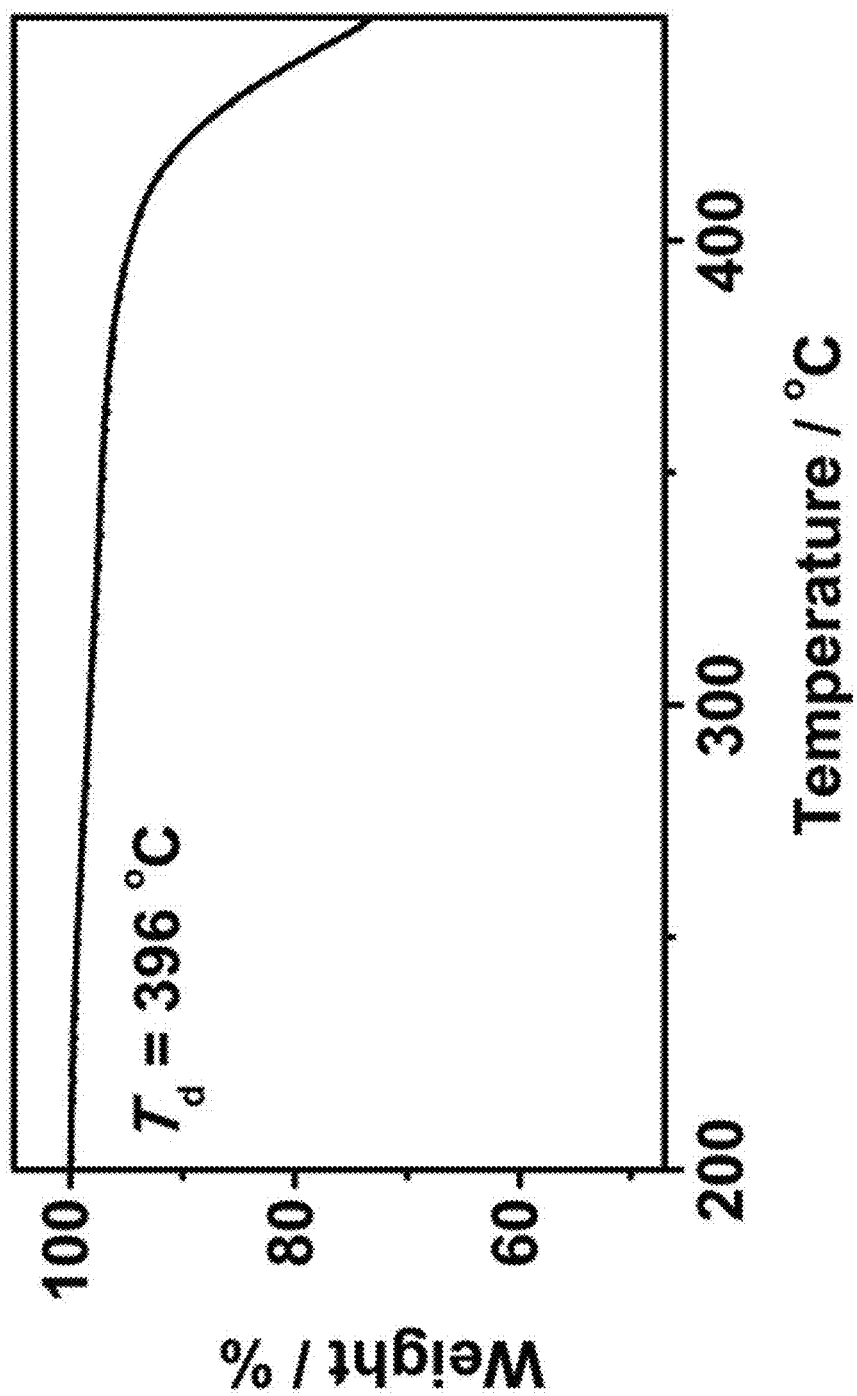

FIG. 8 shows the TGA trace of compound 3, in accordance with one or more embodiments herein.

Figure 9:
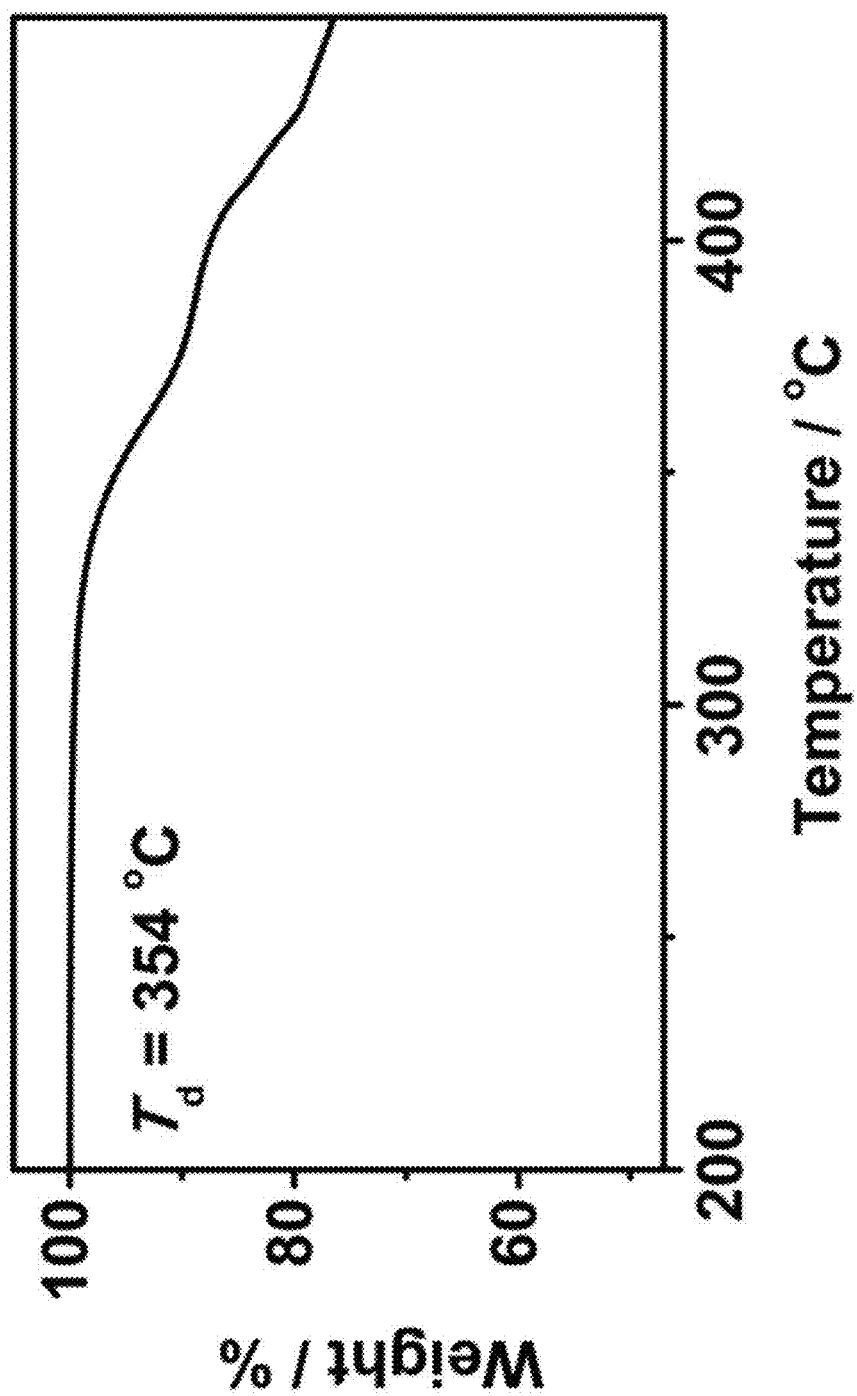

FIG. 9 shows the TGA trace of compound 4, in accordance with one or more embodiments herein.

Figure 10:
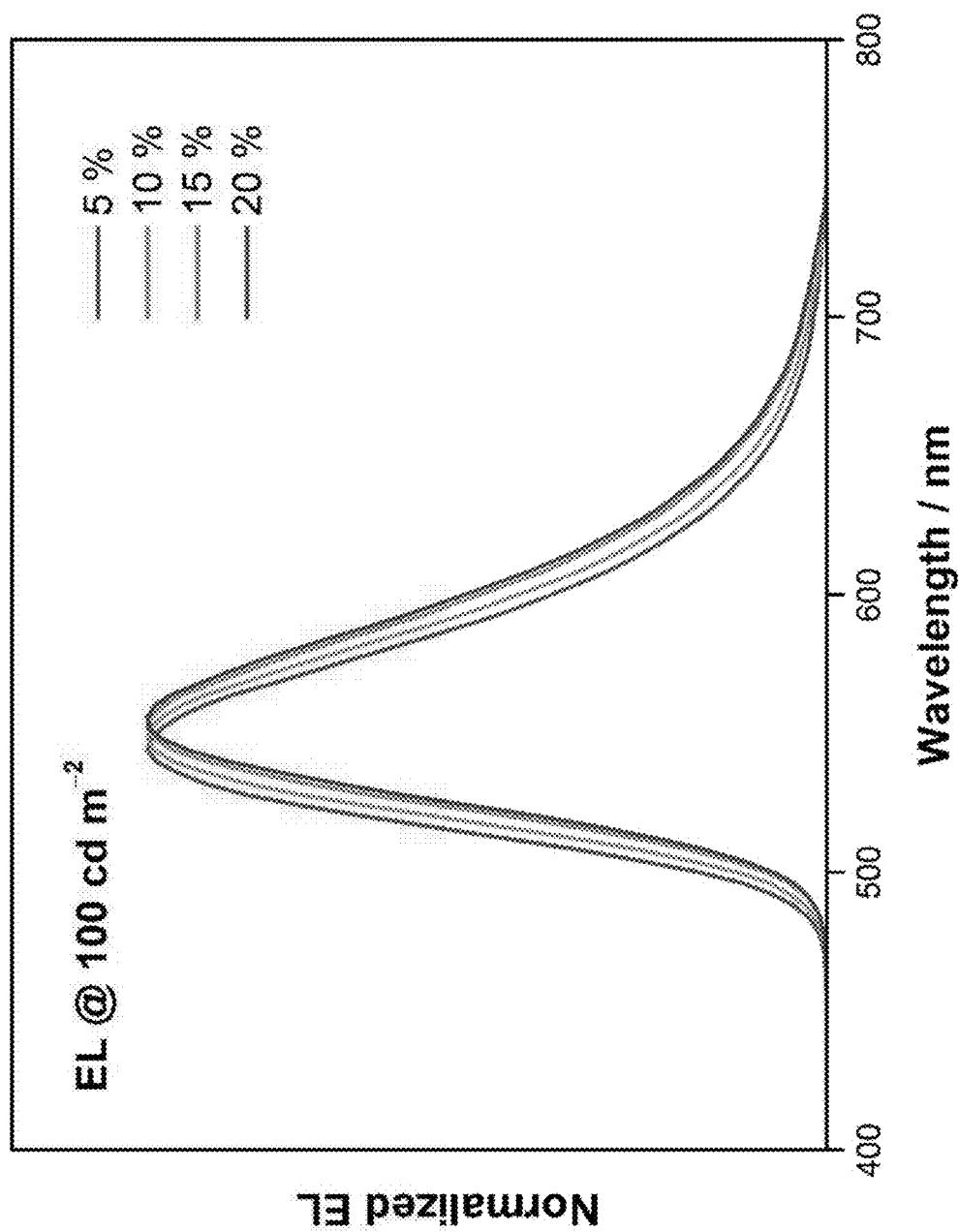

FIG. 10 shows the normalized EL spectra of the solution-processable devices made with compound 1.

Figure 11:
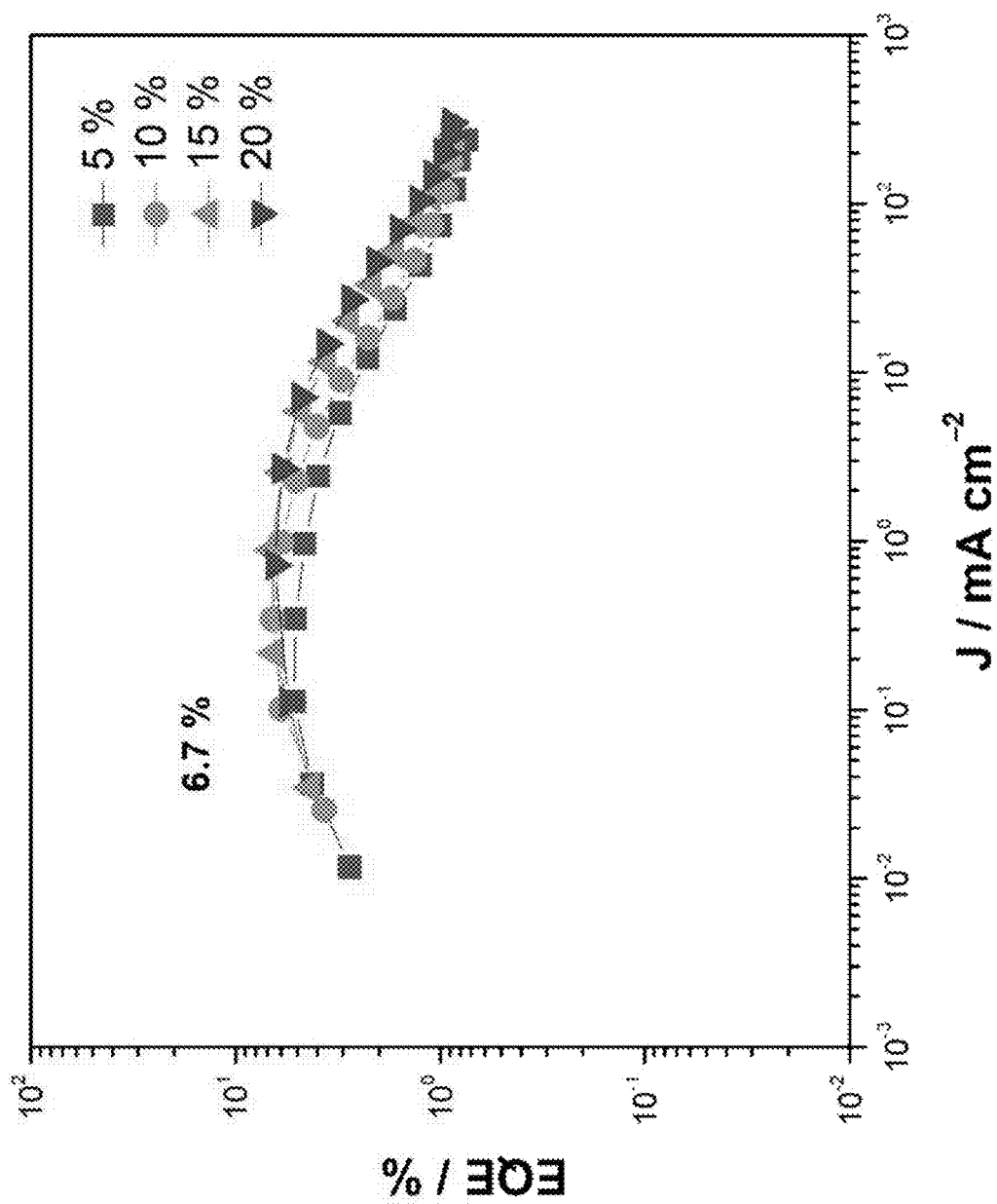

FIG. 11 shows the EQEs of the solution-processable devices made with compound 1.

Figure 12:
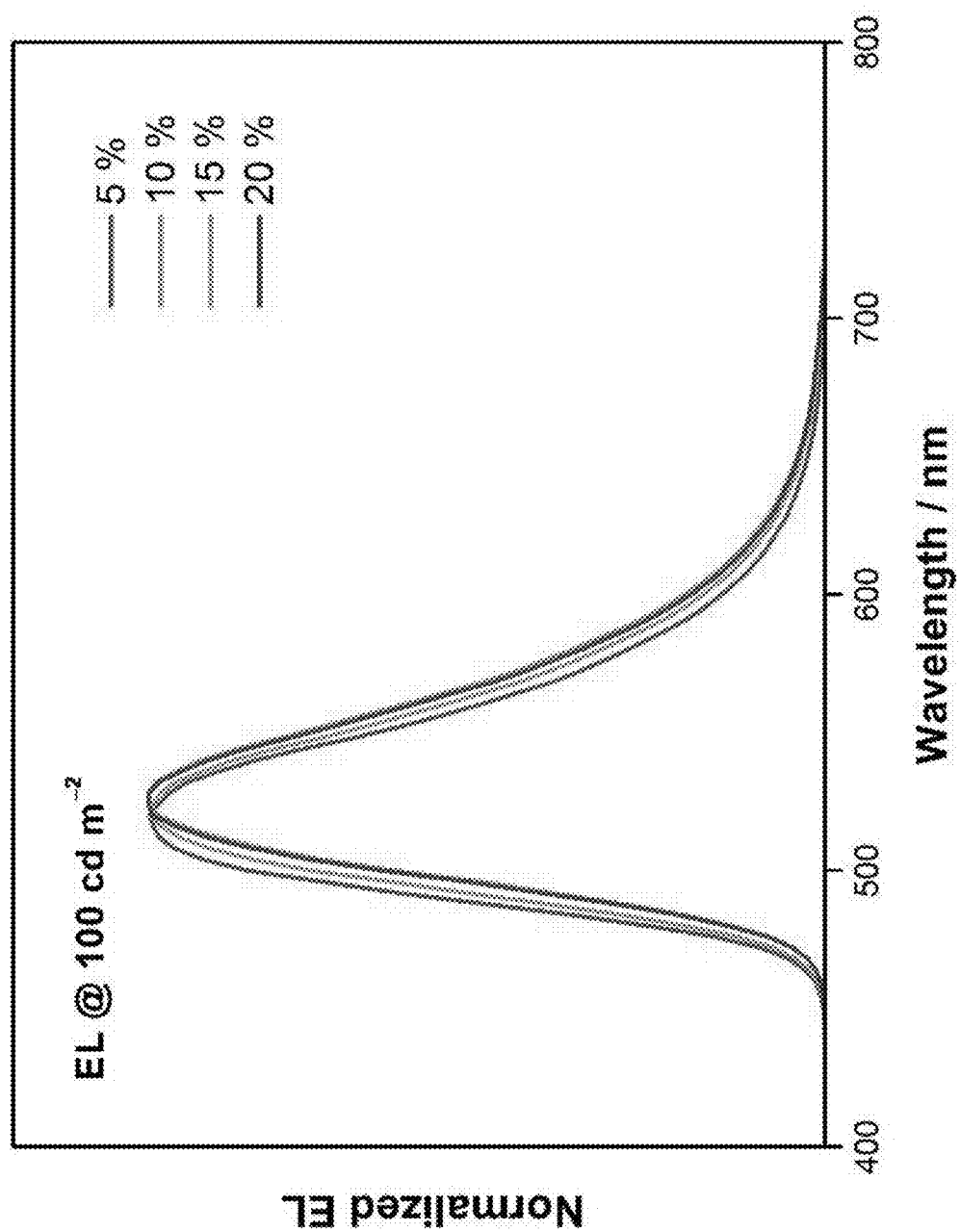

FIG. 12 shows the normalized EL spectra of the solution-processable devices made with compound 3.

Figure 13:
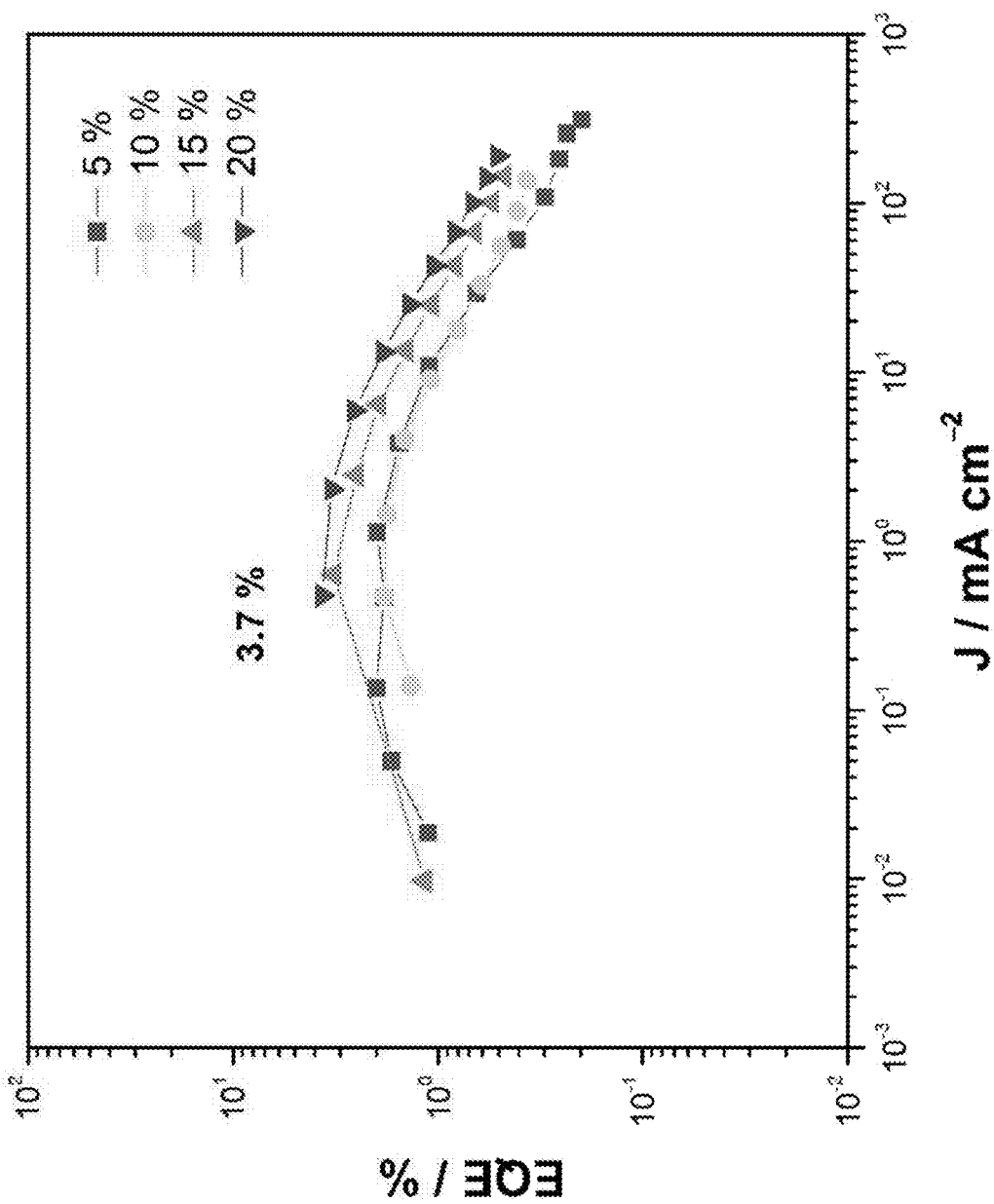

FIG. 13 shows the EQEs of the solution-proces sable devices made with compound 3.

Figure 14:
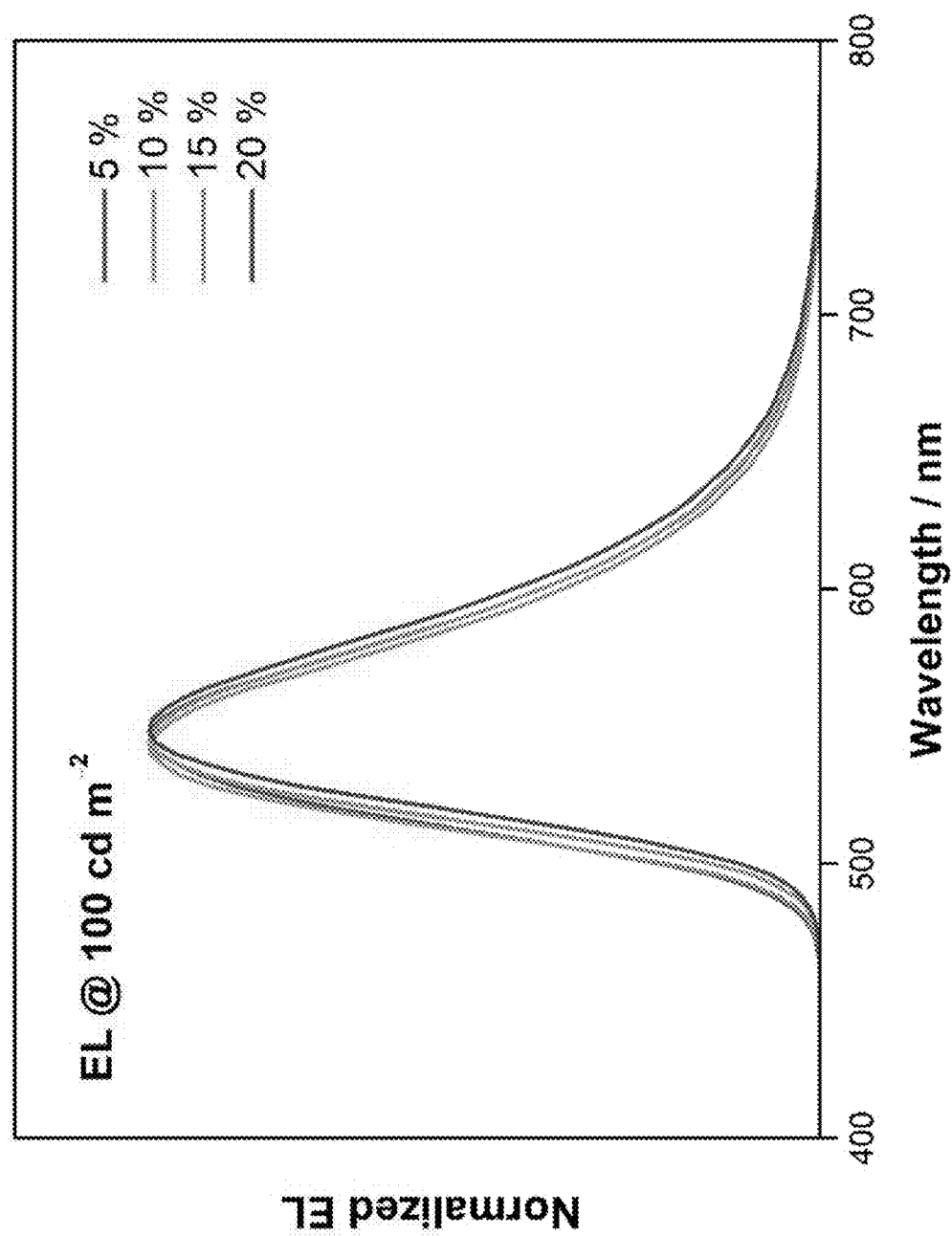

FIG. 14 shows the normalized EL spectra of the solution-processable devices made with compound 4.

Figure 15:
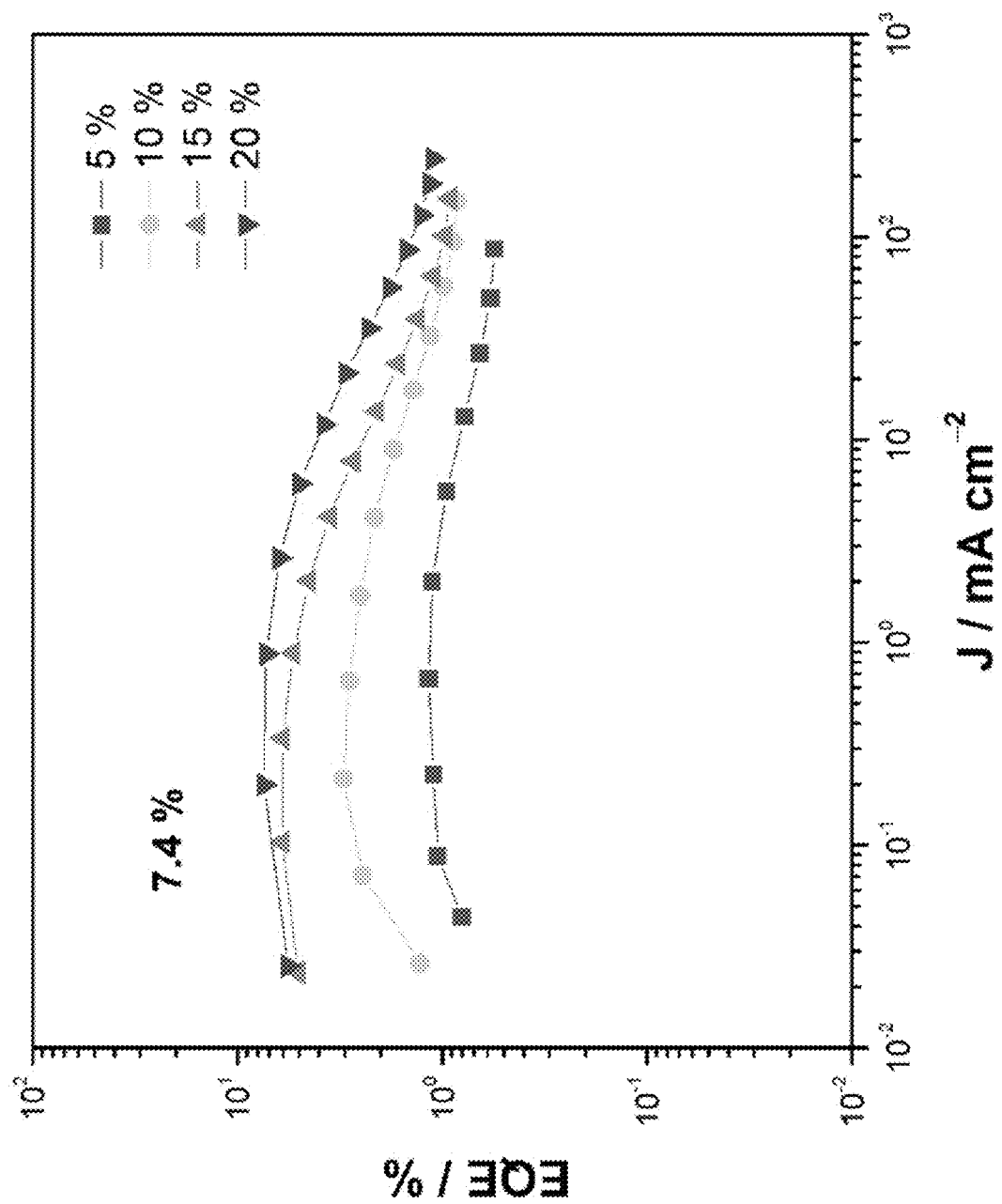

FIG. 15 shows the EQEs of the solution-proces sable devices made with compound 4.

Figure 16:
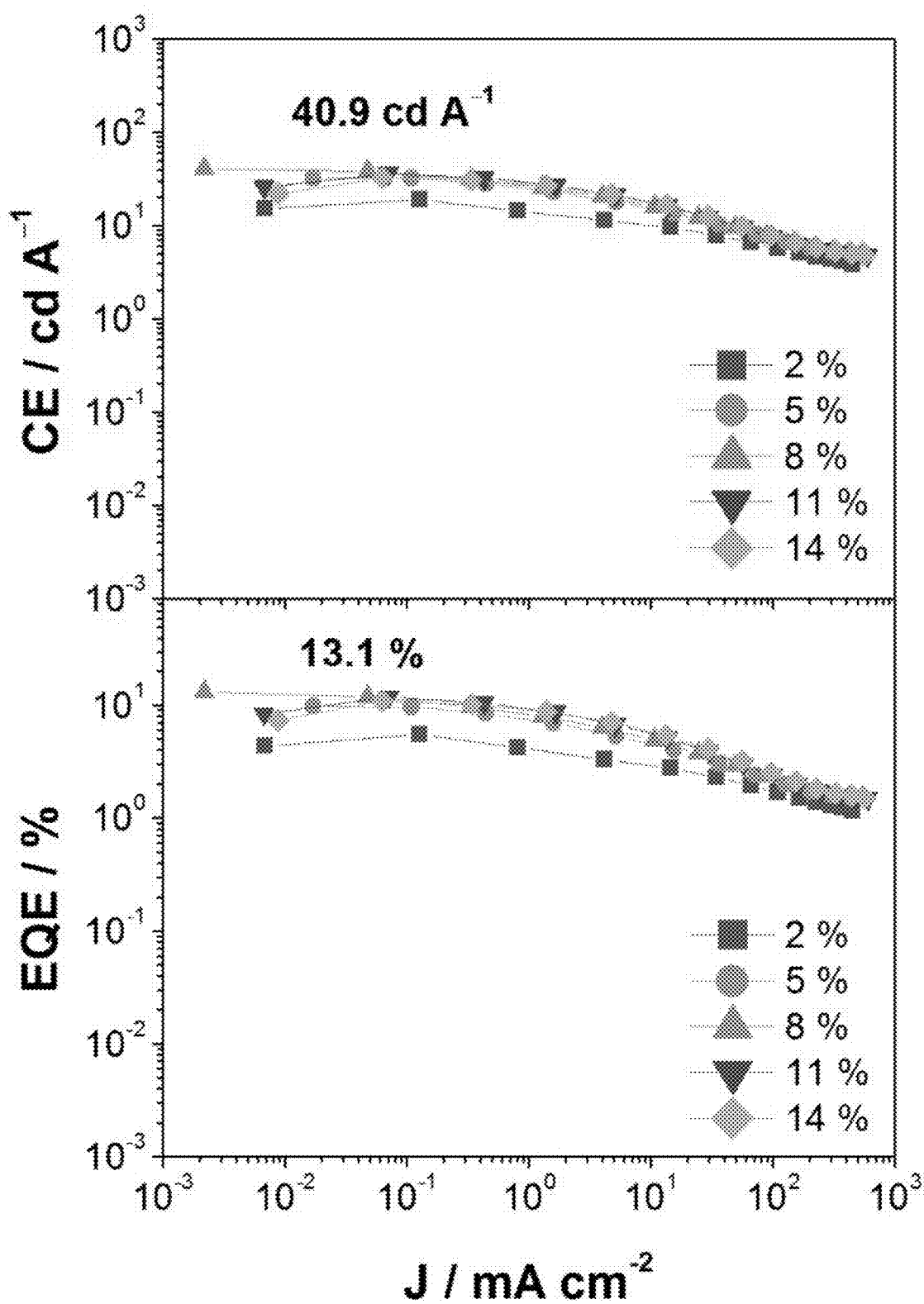

FIG. 16 shows the EQEs of the vacuum-deposited devices made with compound 1.

Figure 17:
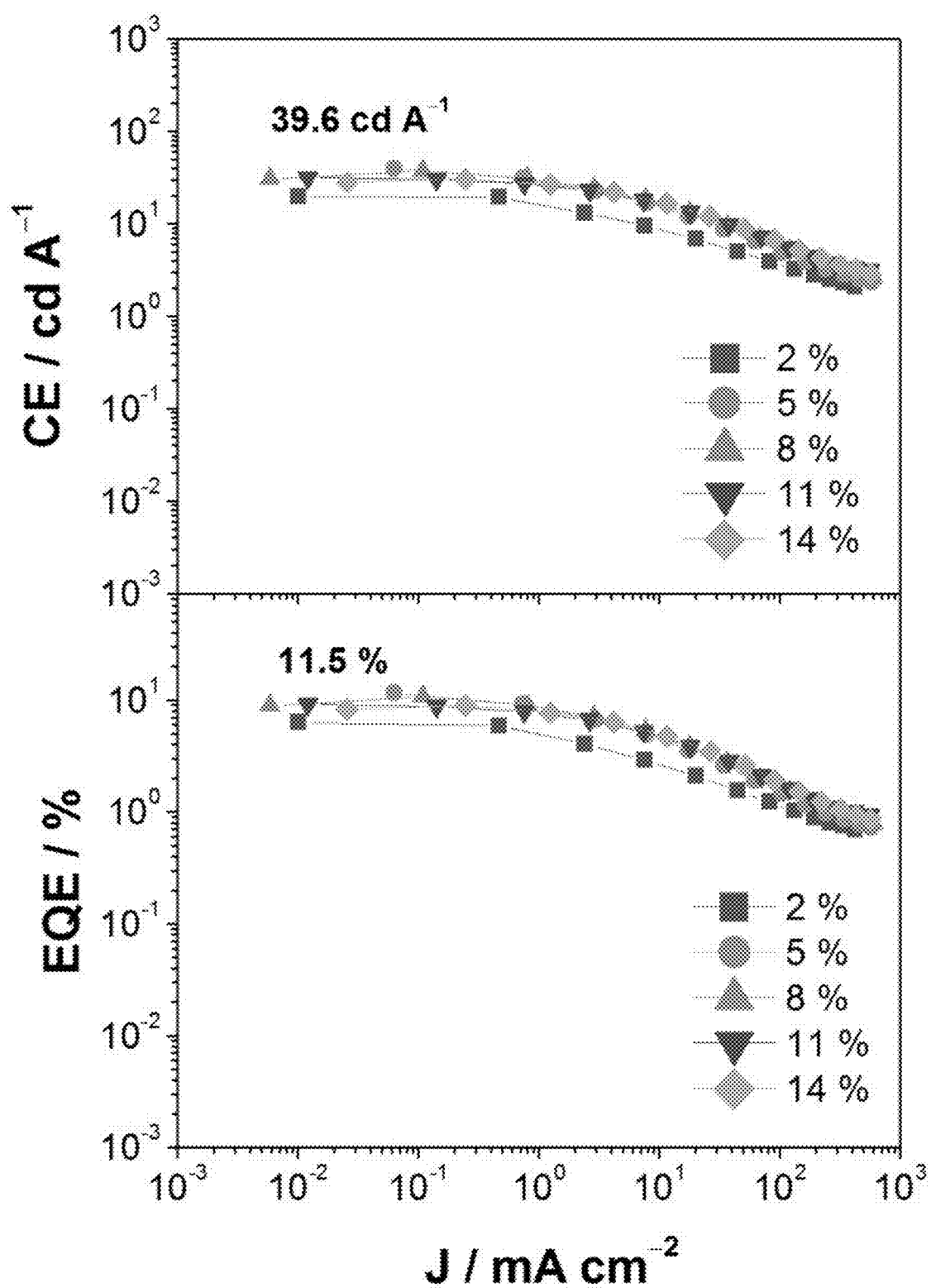

FIG. 17 shows the EQEs of the vacuum-deposited devices made with compound 2.

Figure 18:
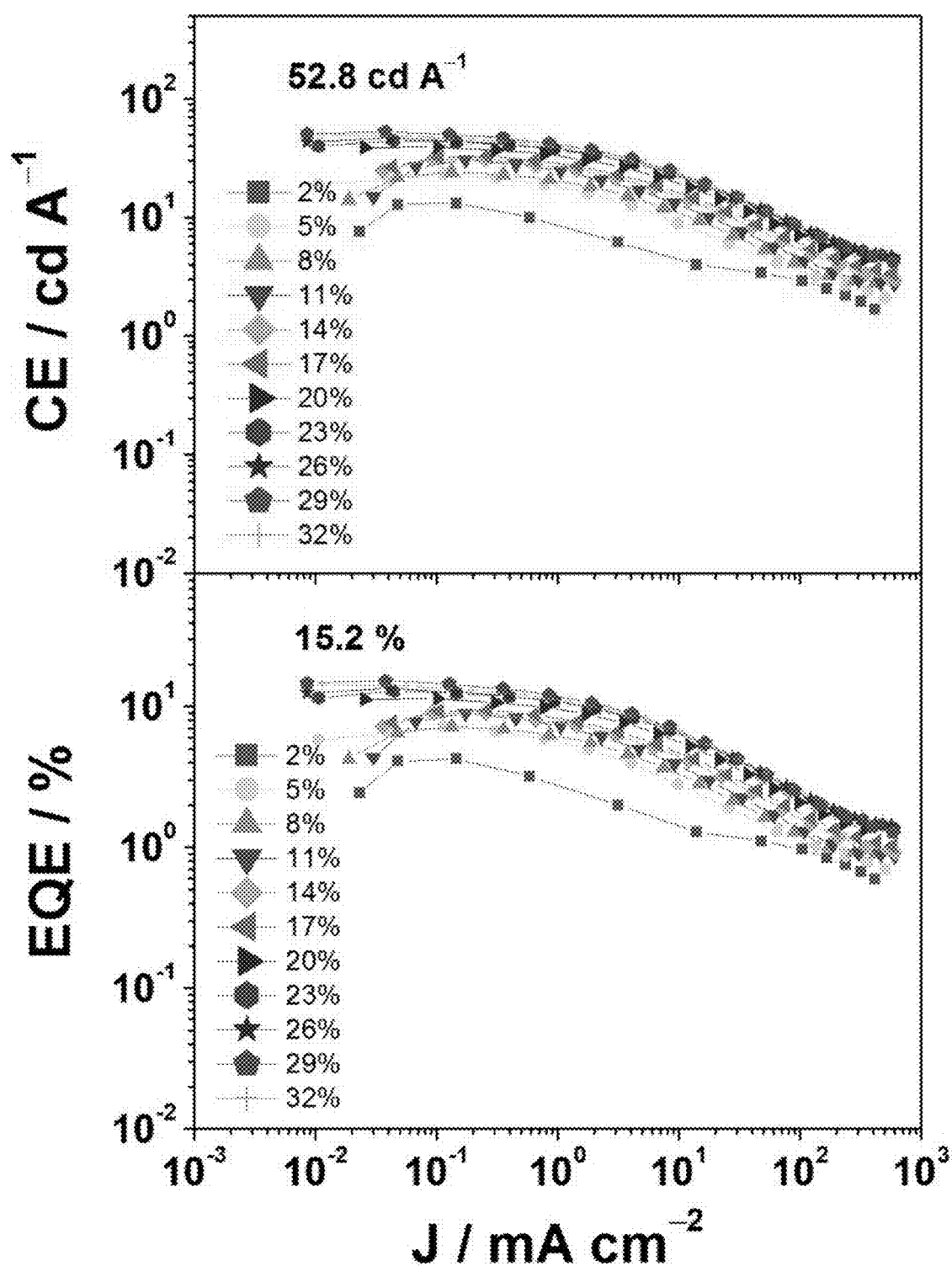

FIG. 18 shows the EQEs of the vacuum-deposited devices made with compound 3.

Figure 19:
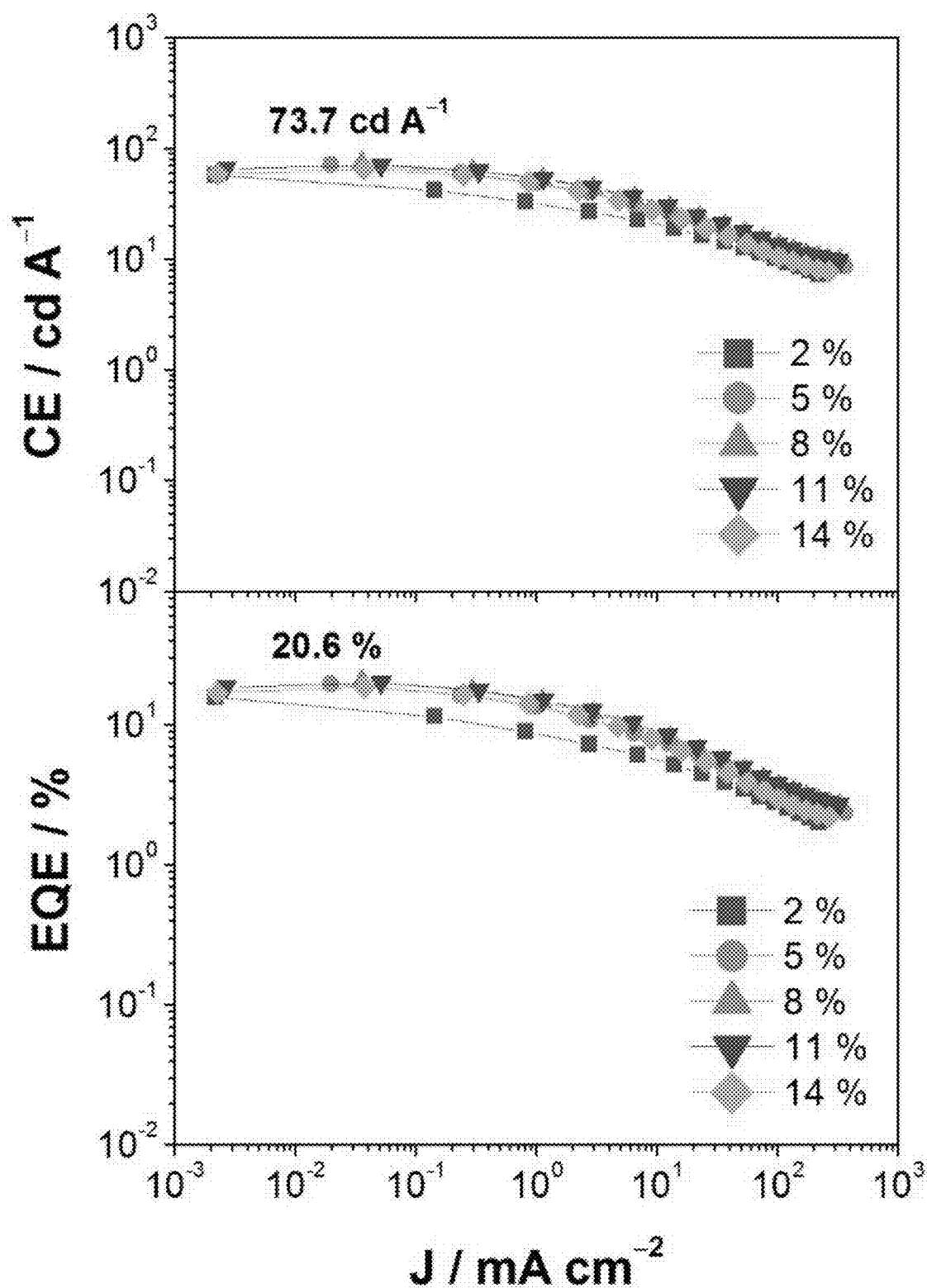

FIG. 19 shows the EQEs of the vacuum-deposited devices made with compound 4.

Figure 20:
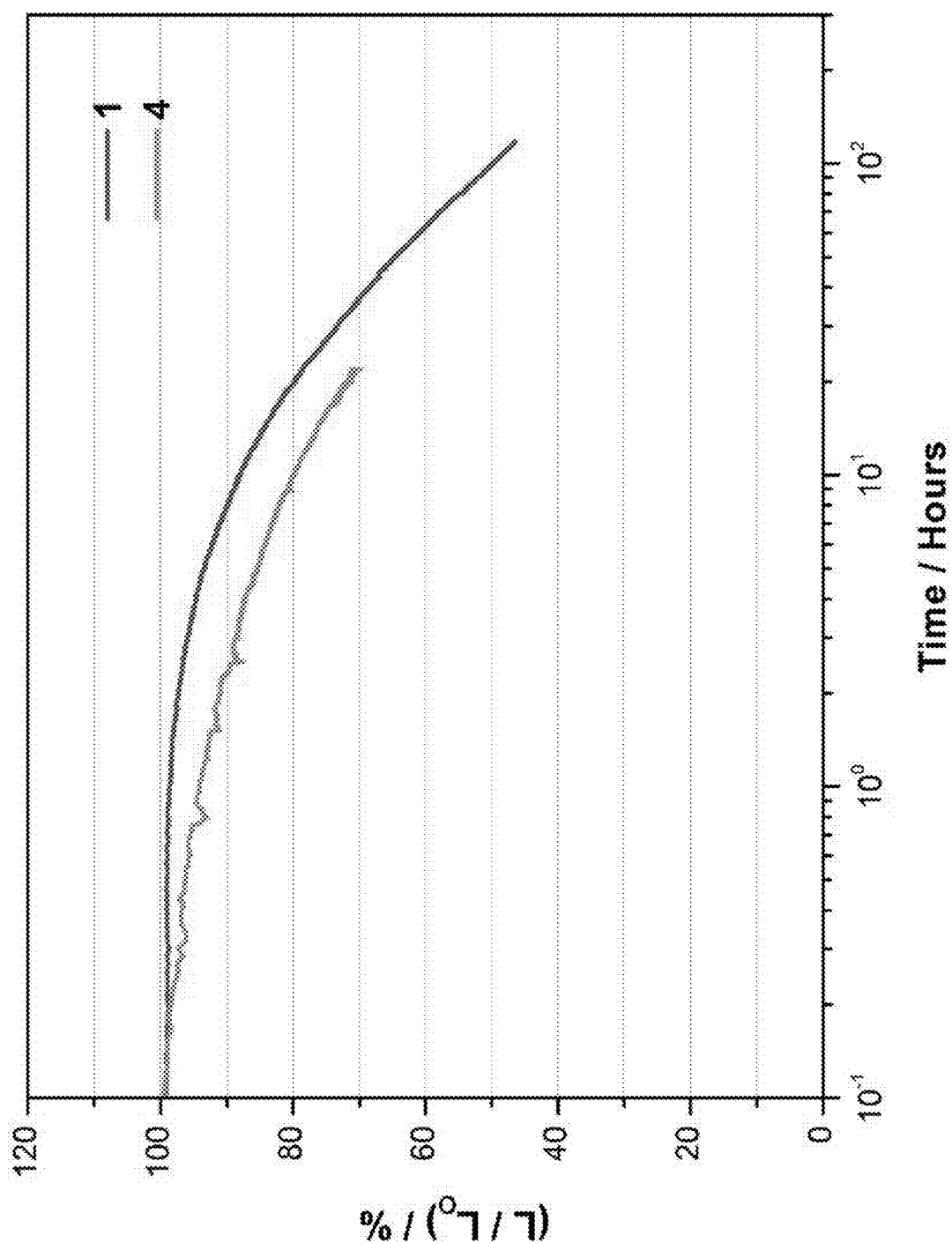

FIG. 20 shows the relative luminance of devices made with compounds 1 and 4 as a function of time.

Figure 21:
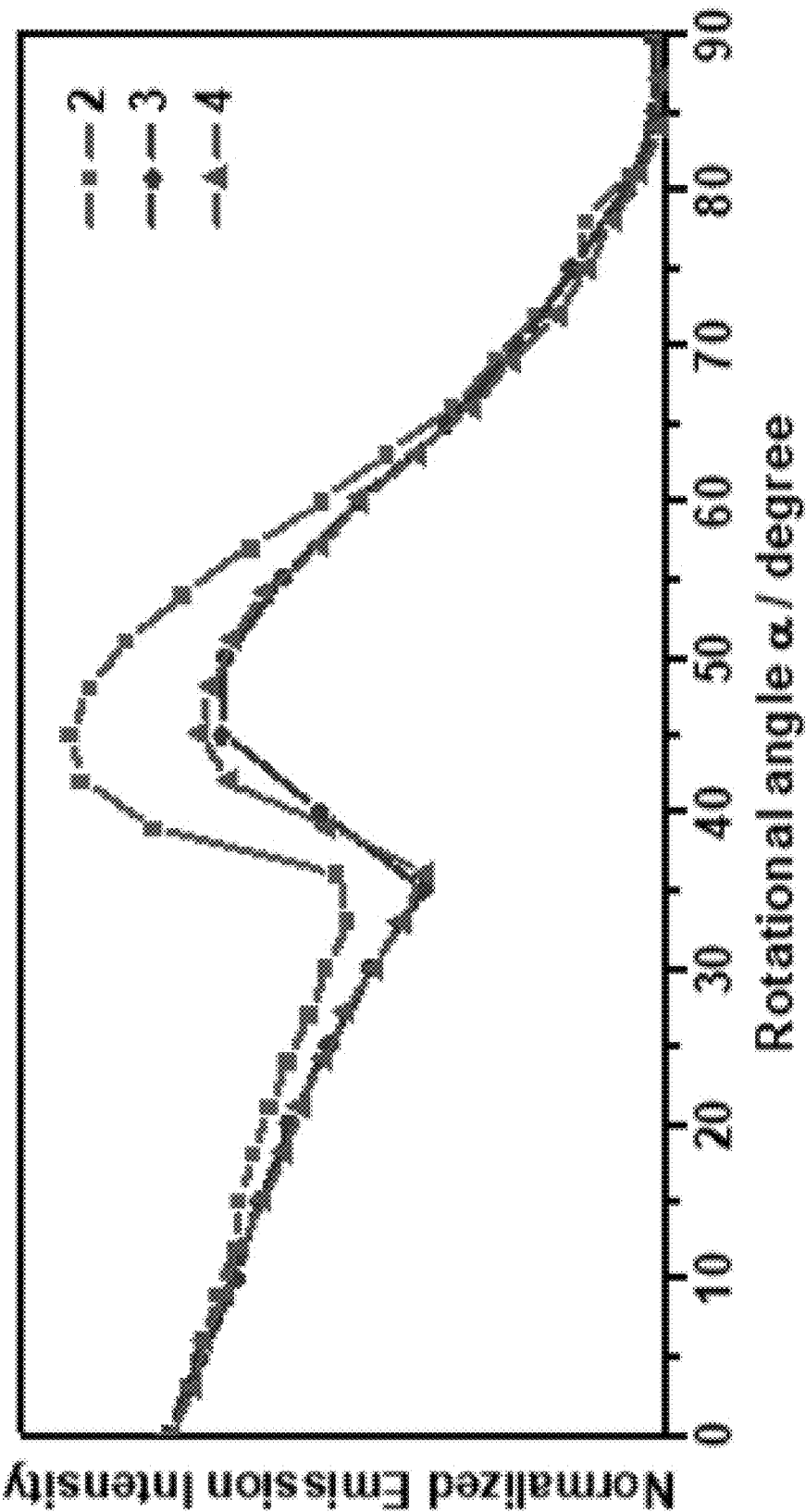

FIG. 21 shows the angular-dependent PL intensities of p-polarized light of 1, 3 and 4 doped into 3,3'-di(9H-carbazol-9-yl)-1,1'-biphenyl (m-CBP) thin films.

Figure 22:
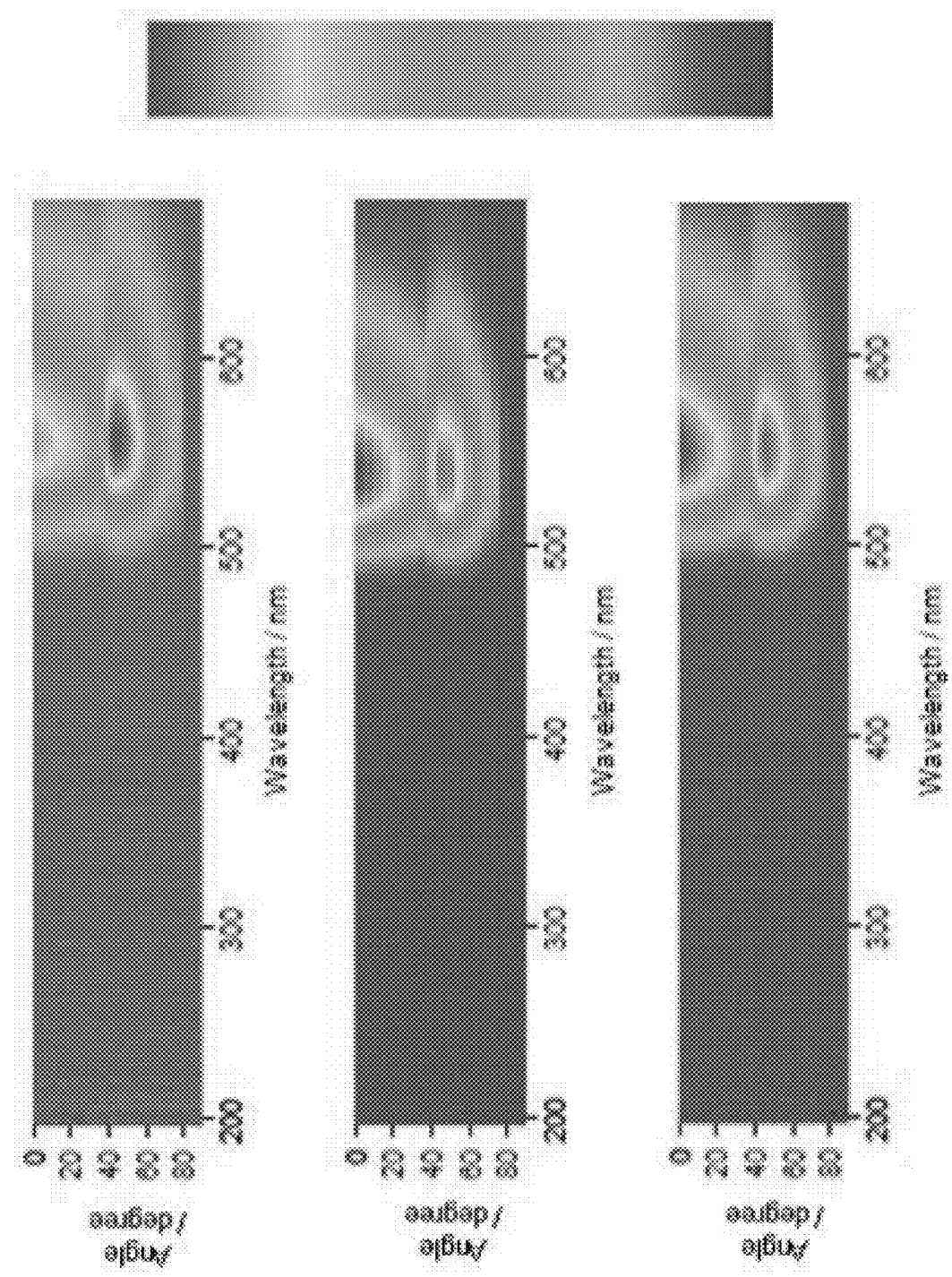

FIG. 22 shows the two-dimensional distribution of the emission spectra vs. the angle of the m-CBP thin films doped with 1, 3 and 4.

DETAILED DESCRIPTION

4.1. Definitions

In the present disclosure the following terms are used.

The term "halo" or "halogen" or "halide" as used herein includes fluorine, chlorine, bromine and iodine.

The term "pseudohalide" as used herein includes, but are not limited to, cyanate, thiocyanate and cyanide.

The term "alkyl" as used herein includes straight and branched chain alkyl groups. Preferred alkyl groups are those containing between one to eighteen carbon atoms and includes methyl, ethyl, propyl, isopropyl, butyl, isobutyl, tert-butyl, and other similar compounds. In addition, the alkyl group may be optionally substituted with one or more substituents selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, tri alkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkenyl" as used herein includes both straight and branched chain alkene radicals. Preferred alkenyl groups are those containing between two and eighteen carbon atoms. In addition, the alkenyl group may be optionally substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR, SOR, SOR, BRR" and derivatives thereof; and R and R' are independently selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkynyl" as used herein includes both straight and branched chain alkyne radicals. Preferred alkynyl groups are those containing between two and eighteen carbon atoms. In addition, the alkynyl group may be optionally substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR, SOR, SOR, BRR" and derivatives thereof; and R and R' are independently selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkylaryl" as used herein includes an aryl group which has an alkyl group as a substituent. In addition, the alkylaryl group may be optionally substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR, SOR, SOR, BRR" and derivatives thereof; and R and R' are independently selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkenylaryl" as used herein includes an aryl group which has an alkenyl group as a substituent. In addition, the alkenylaryl group may be optionally substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR, SOR, SOR, BRR" and derivatives thereof; and R and R' are independently selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkynylaryl" as used herein includes an aryl group which has an alkynyl group as a substituent. In addition, the alkynylaryl group may be optionally substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR, SOR, SOR, BRR" and derivatives thereof; and R and R' are independently selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkylalkenyl" as used herein includes an alkenyl group which has an alkynyl group as a substituent. In addition, the alkylalkenyl group may be optionally substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR, SOR, SOR, BRR" and derivatives thereof; and R and R' are independently selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "arylalkenyl" as used herein includes an alkenyl group has an aryl group as a substituent. In addition, the arylalkenyl group may be optionally substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR, SOR, SOR, BRR" and derivatives thereof; and R and R' are independently selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkynylalkenyl" as used herein includes an alkenyl group which has an alkynyl group as a substituent. In addition, the alkynylalkenyl group may be optionally substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR, SOR, SOR, BRR" and derivatives thereof; and R and R' are independently selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkylalkynyl" as used herein includes an alkynyl group which has an alkyl group as a substituent. In addition, the alkylalkynyl group may be optionally substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR, SOR, SOR, BRR" and derivatives thereof; and R and R' are independently selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "arylalkynyl" as used herein includes an alkynyl group which has an aryl group as a substituent. In addition, the arylalkynyl group may be optionally substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR, SOR, SOR, BRR" and derivatives thereof; and R and R' are independently selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "cycloalkyl" as used herein includes cyclic alkylgroups. Cycloalkyl groups can contain 3 to 7 or more carbon atoms and includes cyclopropyl, cyclopentyl, cyclohexyl, and the like. Cycloalkyl group can be unsubstituted or substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR, SOR, SOR, BRR" and derivatives thereof; and R and R' are independently selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkoxy" or "alkyloxy" as used herein interchangeably includes linear or branched alkyl group of 1 to 18 or more carbon atoms bonded to an oxy (O) group, and unsubstituted or substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR, SOR, SOR, BRR" and derivatives thereof; and R and R' are independently selected from the group consisting of hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "aryl," alone or in combination, includes carbocyclic aromatic systems. The systems may contain one, two or three rings wherein each ring may be attached together in a pendant manner or may be fused. For example, the rings can be 5- or 6-membered rings. Aryl groups include, but not exclusive to, unsubstituted or substituted derivatives of benzene (phenyl), naphthylene, pyrene, anthracene, pentacene, benzo[a]pyrene, chrysene, coronene, corannulene, naphthacene, phenanthrene, triphenyklene, ovalene, benzophenanthrene, perylene, benzo[g,h,i] perylene, antanthrene, pentaphene, picene, dibenzo [3,4:9,10]pyrene, benzo[3,4]pyrene, dibenzo[3,4:8,9]pyrene, dibenzo[3,4;6,7]pyrene, dibenzo[1,2:3,4]pyrene, and naphto[2,3;3,4]pyrene; wherein the positions of attachment and substitution can be at any carbon of the group that does not sterically inhibit formation of compound of formula (I), as can be appreciated by one skilled in the art.

The term "heteroaryl," alone or in combination, includes heterocyclic aromatic systems. The systems may contain one, two or three rings wherein each ring may be attached together in a pendant manner or may be fused. For example, the rings can be 5- or 6-membered rings. Heterocyclic and heterocycle refer to a 3 to 7-membered ring containing at least one heteroatom. Heteroaryl groups include, but not exclusive to, unsubstituted or substituted derivatives of pyridine, thiophene, furan, pyrazole, imidazole, oxazole, isoxazole, thiazole, isothiazole, pyrole, pyrazine, pyridazine, pyrimidine, benzimidazole, benzofuran, benzothiazole, benzopyrrolizinophenoxazine, indolocarbazole, oxadiazole, thiadiazole, indole, triazole, tetrazole, pyran, thiapyran, oxadiazole, triazine, tetrazine, carbazole, dibenzothiophene, dibenzofuran, isoindole, quinoline, isoquinoline, chromene, isochromene, thienopyridine, furopyridine, selenophenopyridine, and non-aromatic rings piperazine, piperidine, pyrolidine and thereof; wherein the position of attachment or substitution can be at any carbon of the group that does not sterically inhibit formation of compound of formula (I), as can be appreciated by one skilled in the art.

The terms "heterocyclic" and "heterocycle" refer to a 3 to 7-membered non-aromatic ring containing at least one heteroatom, and includes piperazine, piperidine, pyrrolidine, morpholine, thiomorpholine, pyran, thiopyran, dihydrofuranyl, tetrahydrofuranyl, dihydrothiophenyl, tetrahydrothiophenyl, dihydropyranyl, tetrahydropyranyl, dihydrothiazolyl and the like. The groups of the present disclosure can be substituted or unsubstituted. Preferred substituents include but are not limited to alkyl, alkoxy, aryl.

The term "heteroatom" as used herein includes S, O, N, P, Se, Te, As, Sb, Bi, B, Si, Ge, Sn and Pb.

The term "substituted" refers to any level of substitution although mono-, di- and tri-substitutions are preferred. Substituents including hydrogen, halogen, aryl, alkyl, heteroaryl, nitro group, trifluoromethane group, cyano group, arylether, alkylether, heteroarylether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, oxadiazole, thiadiazole, phosphine, phosphate, phosphono, pyridyl, sulfonyl, sulfo, sulfinyl, sulfhydryl, halo, aryl, substituted aryl, heteroaryl, substituted heteroaryl, heterocyclic group and thereof, that are readily prepared.

Benzene includes substituted or unsubstituted benzene. Pyridine includes substituted or unsubstituted pyridine. Thiophene includes substituted or unsubstituted thiophene. Furan includes substituted or unsubstituted furan. Pyrazole includes substituted or unsubstituted pyrazole. Imidazole includes substituted or unsubstituted imidazole. Oxazole includes substituted or unsubstituted oxazole. Isoxazole includes substituted or unsubstituted isoxazole. Thiazole includes substituted or unsubstituted thiazole. Isothiazole includes substituted or unsubstituted isothiazole. Pyrrole includes substituted or unsubstituted pyrole. Pyrazine includes substituted or unsubstituted pyrazine. Pyridazine includes substituted or unsubstituted pyridazine. Pyrimidine includes substituted or unsubstituted pyrimidine. Benzimidazole includes substituted or unsubstituted benzimidazole. Benzofuran includes substituted or unsubstituted benzofuran. Benzothiazole includes substituted or unsubstituted benzothiazole. Indole includes substituted or unsubstituted indole. Naphthalene includes substituted or unsubstituted naphthalene. Triazole includes substituted or unsubstituted triazole. Tetrazole includes substituted or unsubstituted tetrazole. Pyran includes substituted or unsubstitutedpyran. Thiapyran includes substituted or unsubstituted thiapyran. Oxadiazole includes substituted or unsubstituted oxadiazole. Triazine includes substituted or unsubstituted triazine. Tetrazine includes substituted or unsubstituted tetrazine. Carbazole includes substituted or unsubstituted carbazole. Dibenzothiophene includes substituted or unsubstituted dibenzothiophene. Dibenzofuran includes substituted or unsubstituted dibenzofuran. Piperazine includes substituted or unsubstituted piperazine. Piperidine includes substituted or unsubstituted piperidine. Pyrrolidine includes substituted or unsubstituted pyrolidine. Indolocarbazole includes substituted or unsubstituted indolocarbazole. Benzopyrrolizinophenoxazine includes substituted or unsubstituted benzopyrrolizinophenoxazine. Thiadiazole includes substituted or unsubstituted thiadiazole.

5. DETAILED DESCRIPTION

Embodiments of the subject matter described herein are directed towards thermally stable gold(III) compounds comprising highly rigid tetradentate ligands. Other embodiments of the subject matter described herein are directed to modification of luminescent tetradentate ligand-containing gold (III) compounds. The luminescent gold(III) compounds comprise a tetradentate ligand containing four ligating sites coordinated to a gold(III) metal center. The ligation site consists of coordinating atoms that can be, for example, nitrogen, carbon, or a-donating groups, for example, aryl groups.

The luminescent tetradentate ligand-containing gold(III) compounds comprise:
  at least one gold metal center having a +3 oxidation state and four coordination sites;
  a tetradentate ligand bearing coordinating atoms or functional groups as ligating site to coordinate to the gold center; and the coordinating sites are connected directly or via an aromatic system or spacer to form a rigid tetradentate ligand having four coordination sites.

The luminescent gold(III) compounds of the present invention exhibit high PLQY of 5-80% in solid-state thin films, and have been demonstrated to serve as phosphorescent dopants in the fabrication of solution-processable and vacuum-deposited OLEDs. The gold(III) compounds disclosed herein, when implemented in a high performance solution-processable OLED, produce superior EL with high current efficiencies of 10-80 cd $A^{-1}$, and high EQEs of 2-20%. This EQE value improves upon the values reported by other solution-processable OLEDs based on gold(III) complexes. The compounds disclosed herein produce results that are comparable to the state-of-the-art solution-processable OLEDs based on iridium(III) complexes and thermally activated delayed fluorescence (TADF) materials. In this way, the present invention provides new classes of phosphors for the OLED display and solid-state lighting industries that can be fabricated by using low-cost and high efficiency solution-processing techniques to obtain phosphorescence-based OLEDs.

The novel class of gold(III) compounds described herein further shows either strong photoluminescence via a triplet excited state upon photo-excitation, or EL via a triplet exciton upon applying a DC voltage. According to one or more embodiments herein, these gold(III) compounds are highly soluble in common organic solvents such as dichloromethane, chloroform and toluene. Alternatively, the compounds can be doped into a host matrix for thin film deposition by spin-coating or ink-jet printing or other known fabrication methods. In one or more embodiments, the compounds can be used for the fabrication of OLEDs as phosphorescent emitters or dopants to generate EL.

While the gold(III) compounds described herein are described with use in OLEDs, the compounds have additional applications as would be understood to those who are skilled in the art. The gold(III) compounds described herein have strong light-emitting and light absorption properties that make them suitable for inclusion into common apparatuses for which light emission or absorption are desired. For example, the gold(III) compounds may be used as, but not limited to, the backlighting of flat panel displays of wall-mounted televisions, copiers, printers, liquid crystal displays, measuring instruments, display boards, marker lamps, electrophotographic photoreceptors, photoelectric transducers, solar cells and image sensors.

The luminescent tetradentate ligand-containing gold(III) compounds have the chemical structure shown in generic formula (I),

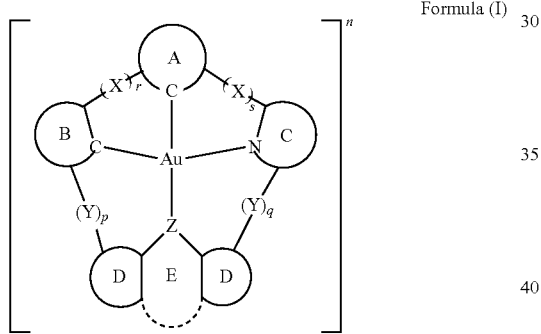

Formula (I)

wherein:
(a) Z is selected from the group consisting of B, C, N, O, Si, P, P(=O), S and Se;
(b) rings A and B are each coordinated to the Au atom through a carbon atom, and are each independently a substituted or unsubstituted aryl group, preferably a phenyl group, or a substituted or unsubstituted heteroaryl group;
(c) ring C is coordinated to the Au atom through a nitrogen atom, and is selected from the group consisting of a substituted or unsubstituted pyridyl group, a substituted or unsubstituted quinolinyl group, a substituted or unsubstituted isoquinolinyl group, a substituted or unsubstituted pyrazinyl group, a substituted or unsubstituted pyrimidinyl group, a substituted or unsubstituted pyridazinyl group, a substituted or unsubstituted triazinyl group, a substituted or unsubstituted carbolinyl group, a substituted or unsubstituted imidazolyl group, a substituted or unsubstituted benzimidazolyl group, a substituted or unsubstituted pyrazolyl group, a substituted or unsubstituted thienopyridinyl, a substituted or unsubstituted furopyridinyl group, a substituted or unsubstituted selenophenopyridinyl group, a substituted or unsubstituted thiazolyl group, a substituted or unsubstituted thiadiazolyl group, a substituted or unsubstituted oxadiazolyl group, a substituted or unsubstituted triazolyl group, a substituted or unsubstituted oxazolyl group and a substituted or unsubstituted isoxazolyl group,
(d) each D is independently at each occurrence absent or a cyclic or acyclic moiety wherein:
the cyclic moiety is selected from the group consisting of a substituted or unsubstituted aryl group, preferably a phenyl group, a substituted or unsubstituted heteroaryl group, preferably a pyridyl group, a substituted or unsubstituted cycloalkyl group, and a substituted or unsubstituted polycyclic group; and
the acyclic moiety is selected from the group consisting of a substituted or unsubstituted alkynyl, a substituted or unsubstituted arylalkynyl, a substituted or unsubstituted alkyl, a substituted or unsubstituted alkylaryl, a substituted or unsubstituted alkoxy, a substituted or unsubstituted arylalkoxy, a substituted or unsubstituted acene, and a substituted or unsubstituted a heteroacene;
(e) E is absent, an acyclic moiety selected from the group consisting of a substituted or unsubstituted alkynyl, a substituted or unsubstituted arylalkynyl, a substituted or unsubstituted alkyl, a substituted or unsubstituted alkylaryl, a substituted or unsubstituted alkoxy, a substituted or unsubstituted arylalkoxy, a substituted or unsubstituted thiolate, a substituted or unsubstituted arylthiolate, a substituted or unsubstituted phosphide, a substituted or unsubstituted arylphosphide, a substituted or unsubstituted boride, a substituted or unsubstituted arylboride, a substituted or unsubstituted acene and a substituted or unsubstituted heteroacene,
or E, together with Z and the atoms to which they are respectfully attached forms a cyclic moiety selected from the group consisting of a substituted or unsubstituted pyridyl group, a substituted or unsubstituted pyrrolyl group, a substituted or unsubstituted thiophenyl group, a substituted or unsubstituted furanyl group, a substituted or unsubstituted pyrazolyl group, a substituted or unsubstituted oxazolyl group, a substituted or unsubstituted imidazolyl group, a substituted or unsubstituted pyrazinyl group, a substituted or unsubstituted pyrimidinyl group, a substituted or unsubstituted pyridazinyl group, a substituted or unsubstituted piperazinyl group, a substituted or unsubstituted oxazinyl group, a substituted or unsubstituted morpholinyl group, a substituted or unsubstituted thiomorpholinyl group, a substituted or unsubstituted thiazinyl group, and a substituted or unsubstituted piperidinyl group;
or D, E and Z together represent a substituted or unsubstituted, monocyclic or fused polycyclic aryl or heteroaryl group;
(f) or D, Y and C, and/or D, Y and B, together represent a substituted or unsubstituted, monocyclic or fused polycyclic aryl or heteroaryl group;X and Y are each independently at each occurrence non-coordination sites selected from the group consisting of, —CRR', —C=O, —NR, —O, —PR, —P(=O)R, —BR, S, —SO, —SO₂, —SiRR', Se, —AsR, —CH=CH— and —CR=CR—', wherein R and R' are independently selected from the group consisting of hydrogen, halogen, aryl, alkyl, heteroaryl, nitro, trifluoromethyl, cyano, arylether, alkylether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonateester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, a heterocyclic group and derivatives thereof;

(g) wherein p, q, r and s are each independently 0, 1, 2 or 3; and (h) n is zero, a positive integer or a negative integer.

Specific examples of the luminescent tetradentate ligand-containing gold(III) compounds of formula (I) include the following:

Compound 1

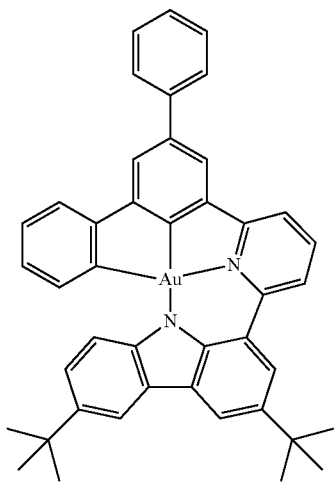

Compound 2

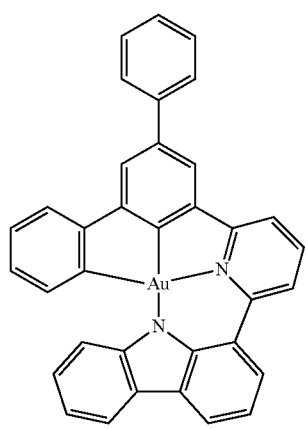

-continued

Compound 3

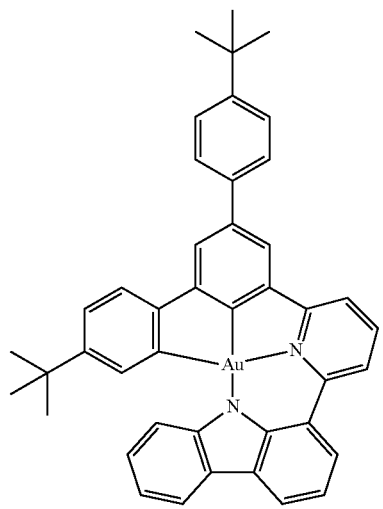

Compound 4

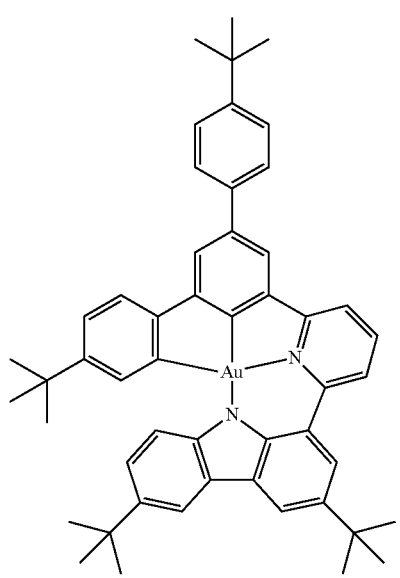

Compound 5

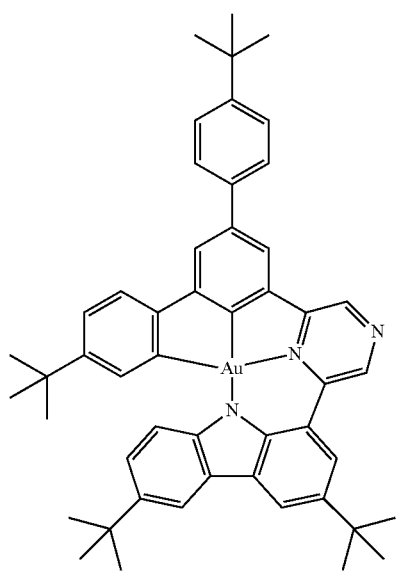

Compound 6
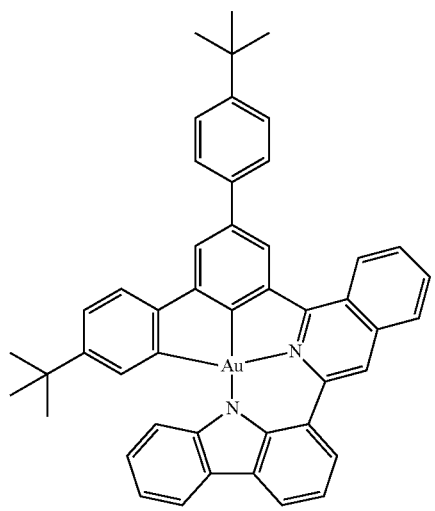
Compound 7
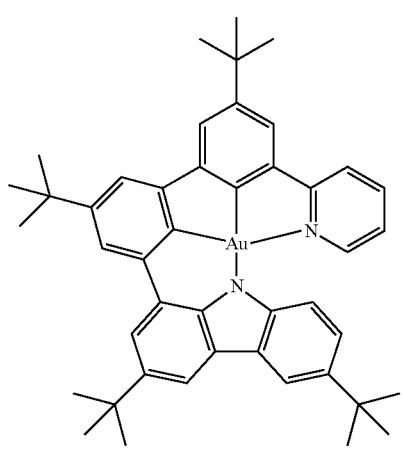
Compound 8
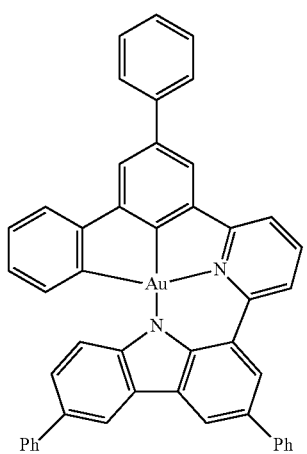
Compound 9
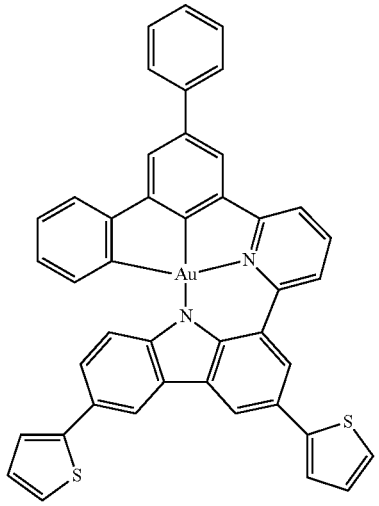
Compound 10
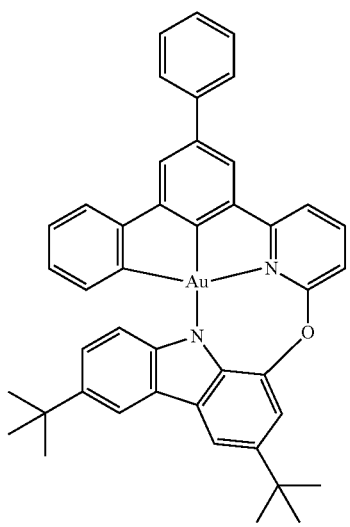
Compound 11
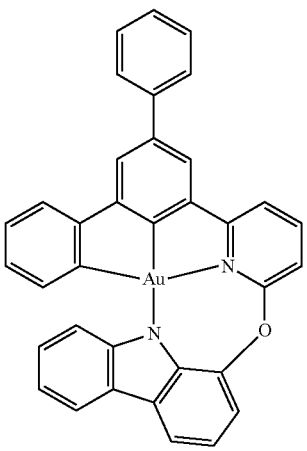

Compound 12
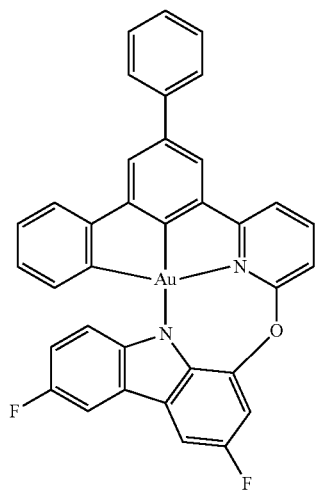
Compound 13
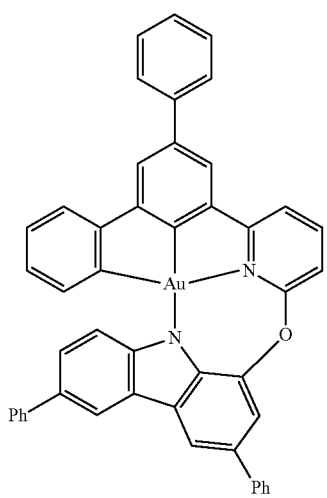
Compound 14
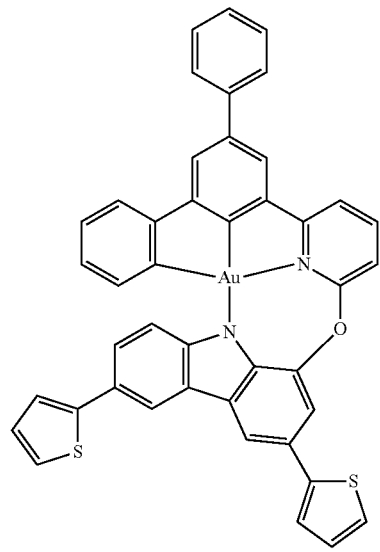
Compound 15
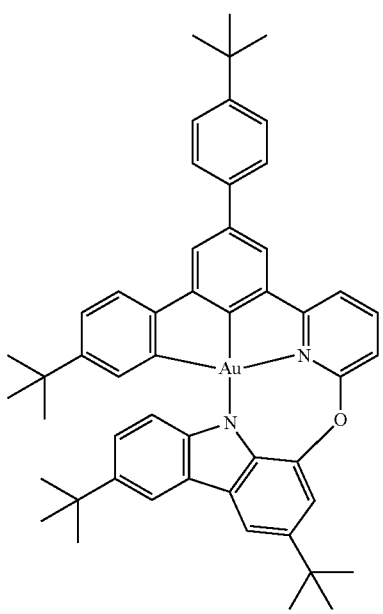
Compound 16
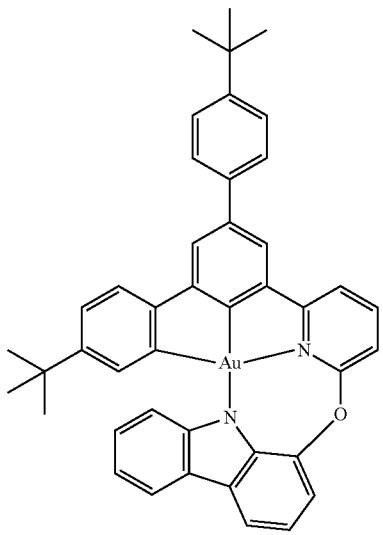

Compound 17
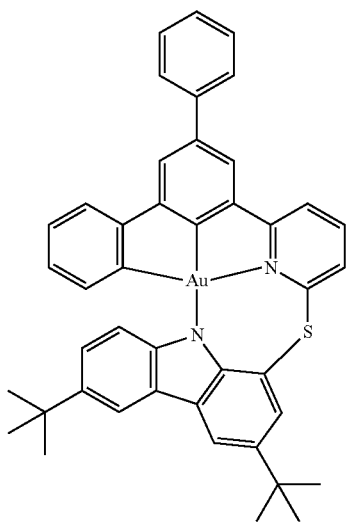
Compound 18
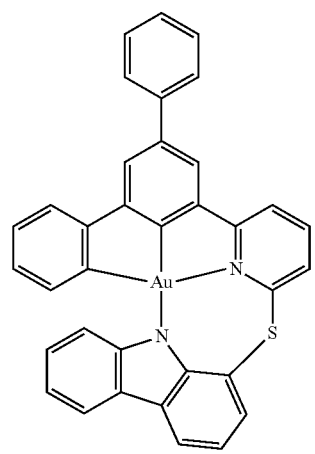
Compound 19
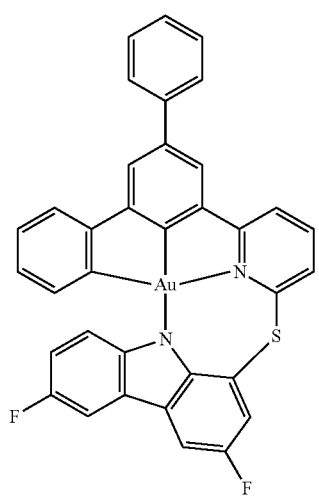
Compound 20
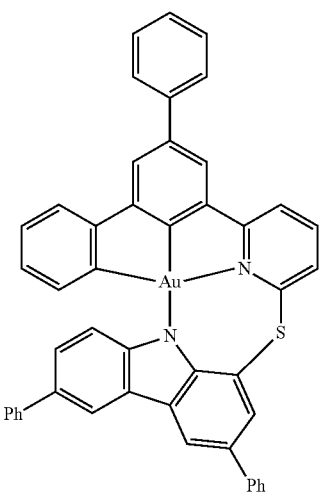
Compound 21
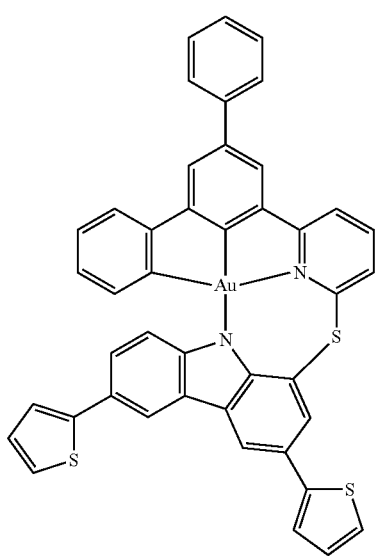
Compound 22
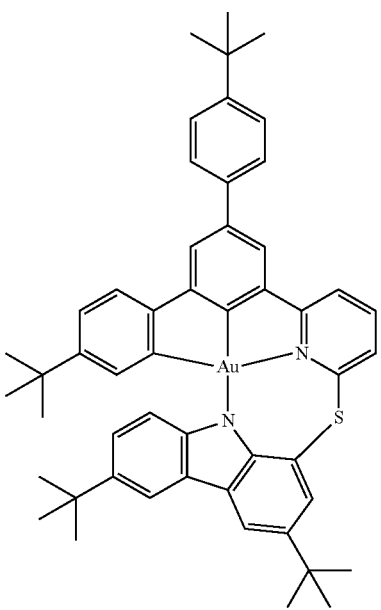

Compound 23
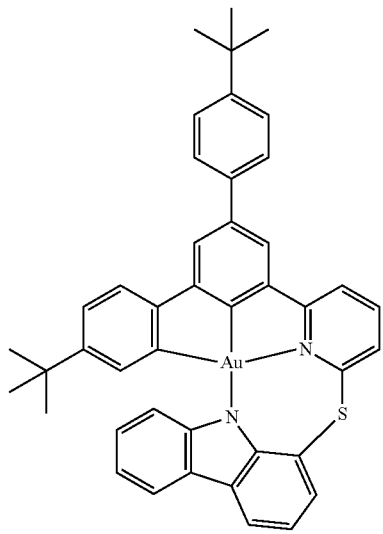
Compound 24
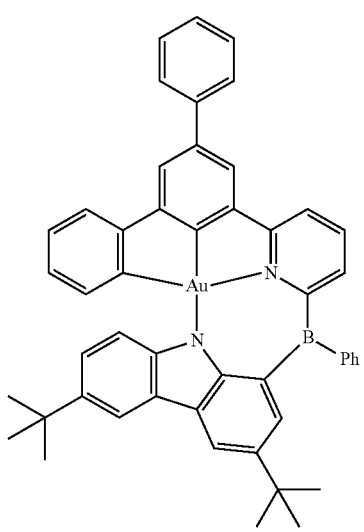
Compound 26
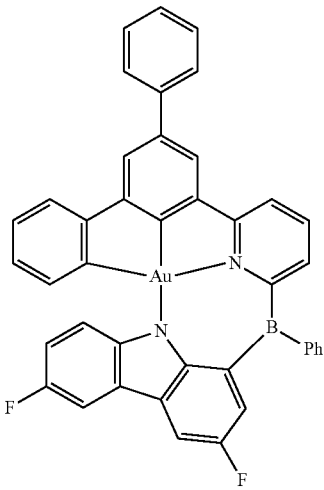
Compound 27
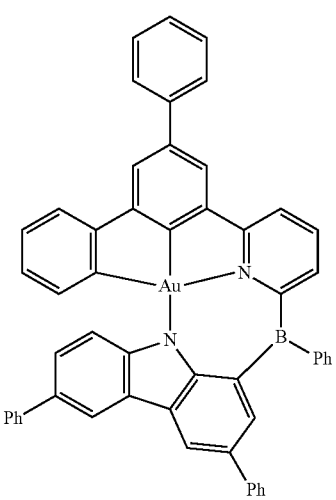
Compound 25
Compound 28
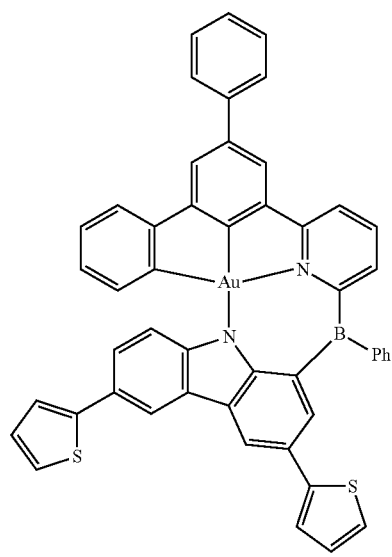

Compound 29
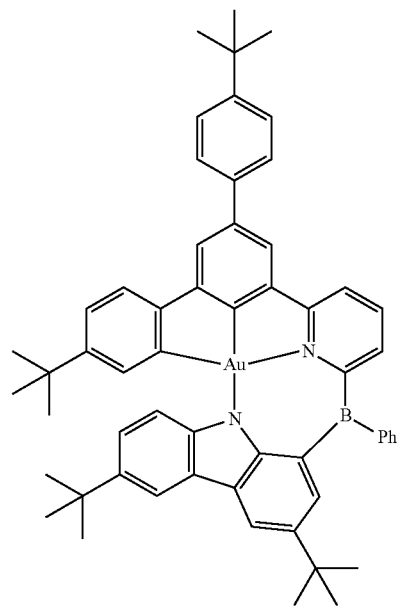
Compound 30
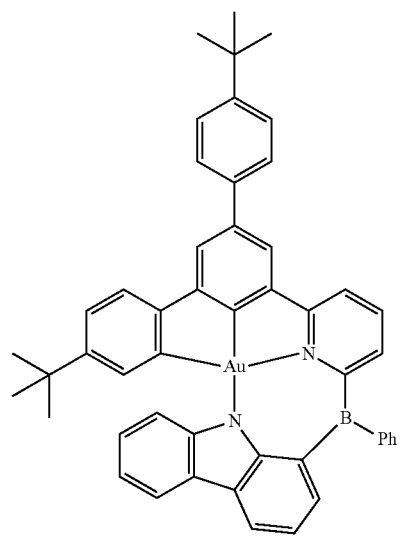
Compound 31
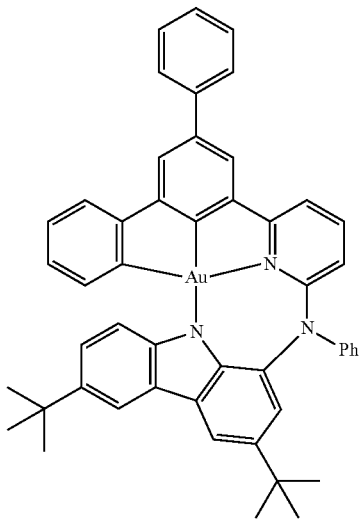
Compound 32
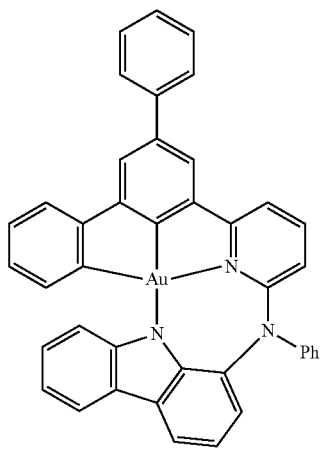
Compound 33
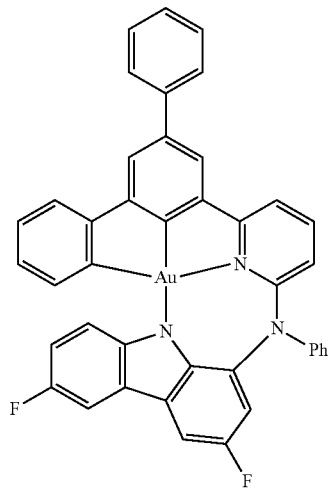

Compound 34
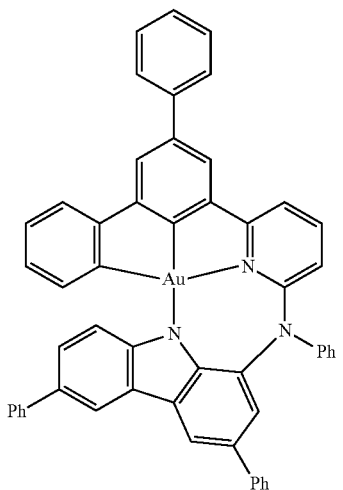
Compound 35
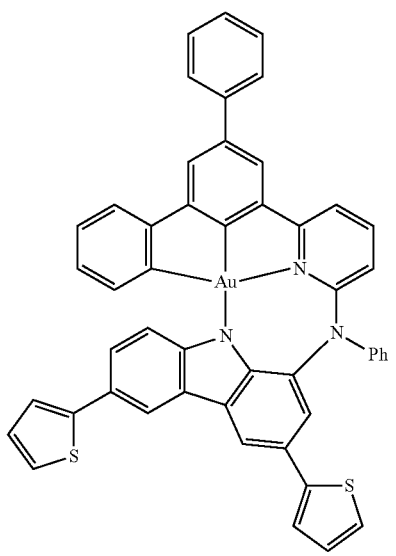
Compound 36
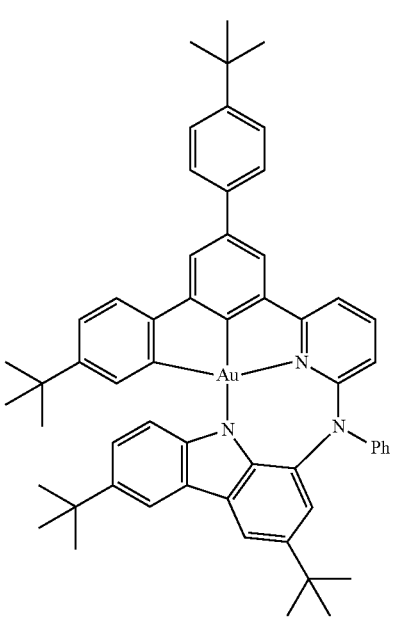
Compound 37
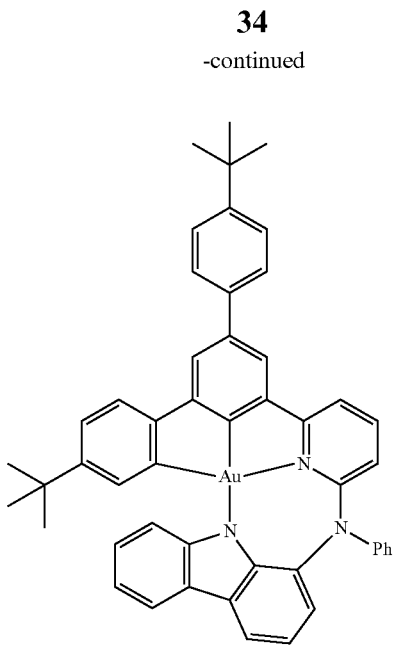
Compound 38
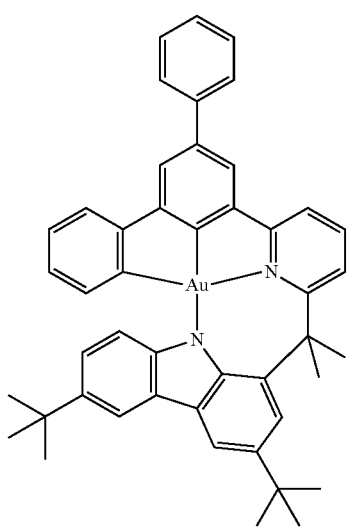
Compound 39
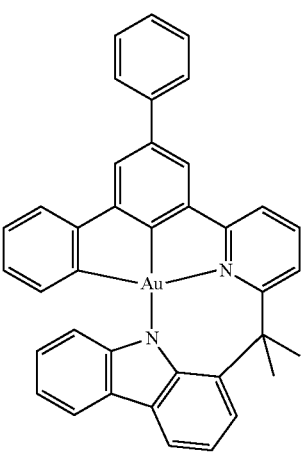

Compound 40
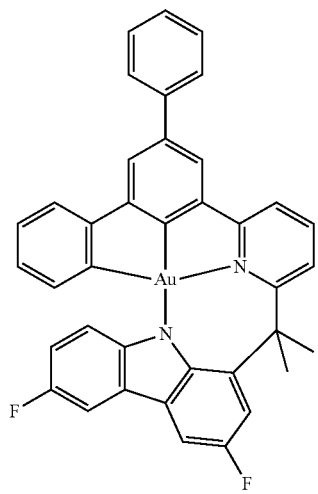
Compound 41
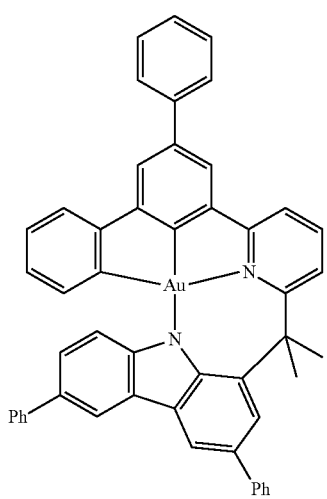
Compound 42
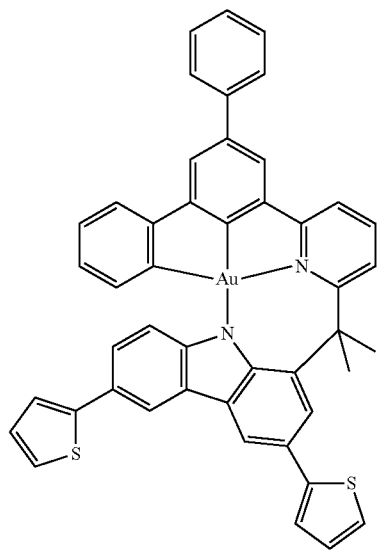
Compound 43
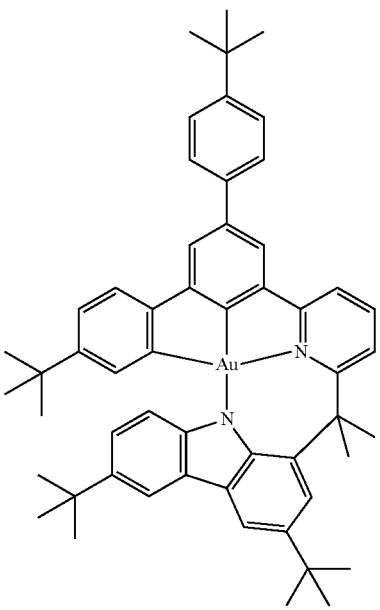
Compound 44
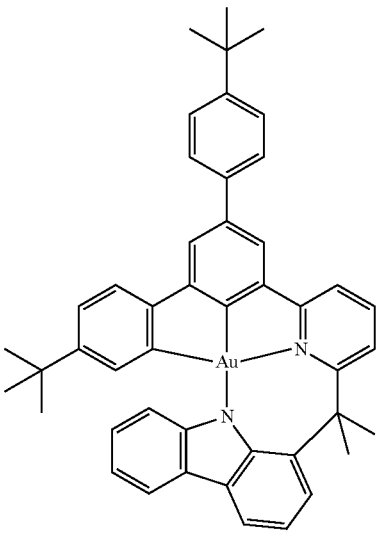
Compound 45
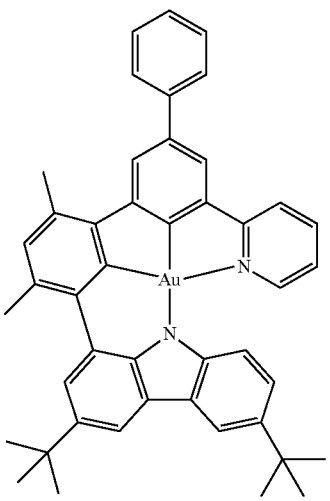

Compound 46
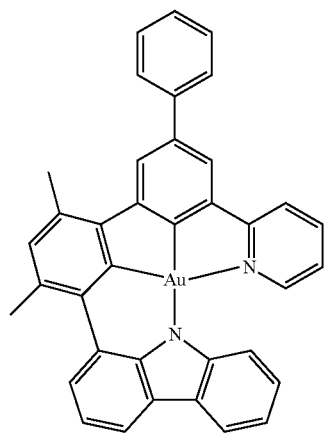
Compound 47
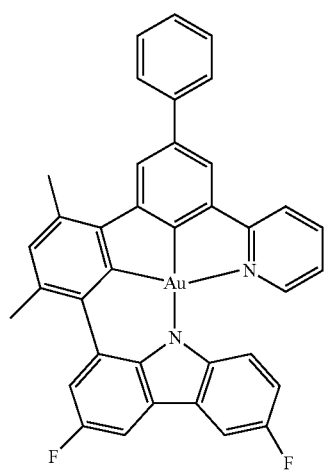
Compound 48
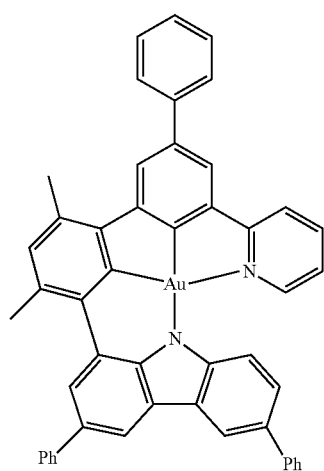
Compound 49
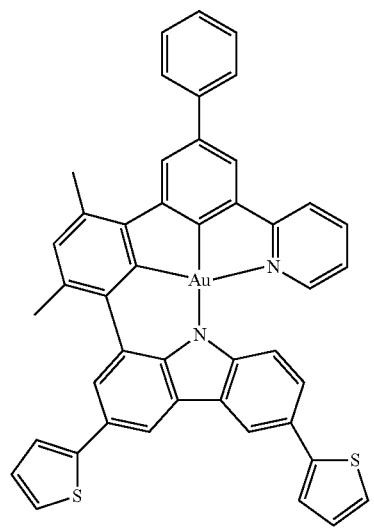
Compound 50
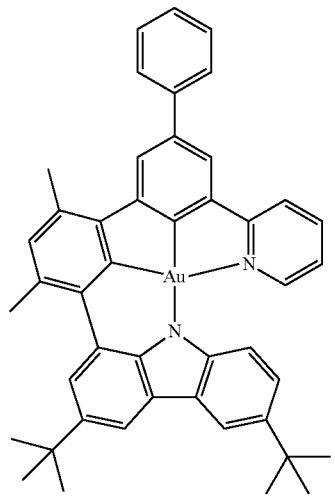
Compound 51
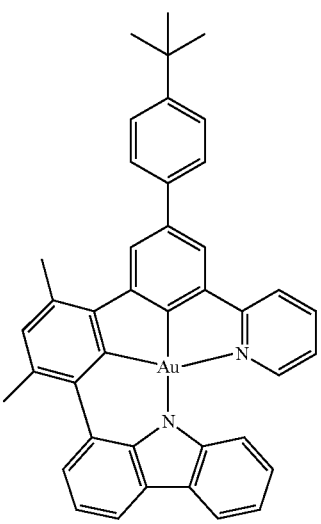

Compound 52
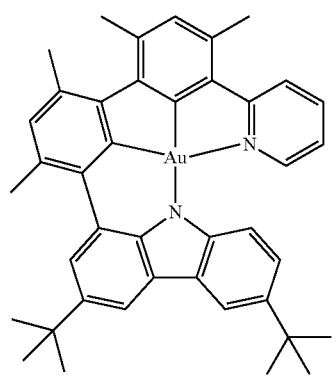
Compound 56
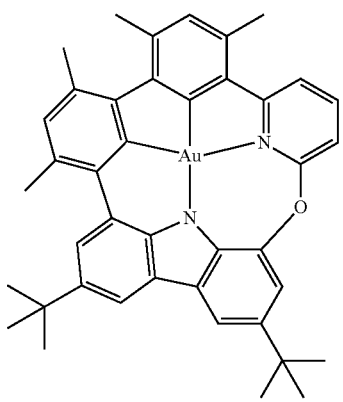
Compound 53
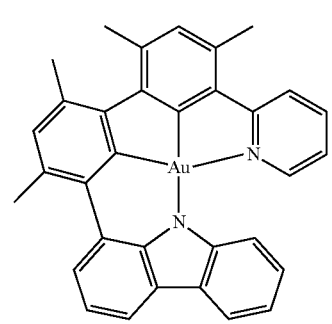
Compound 57
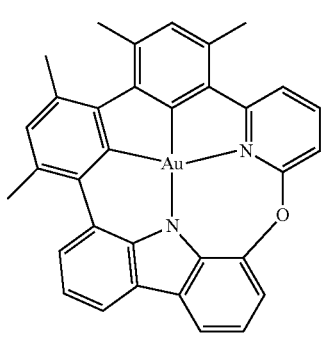
Compound 58
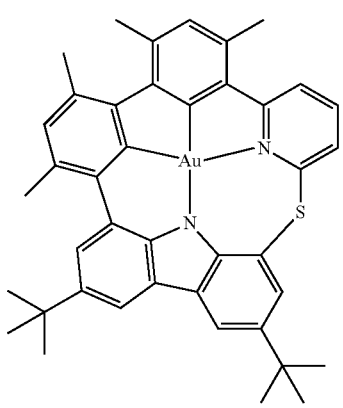
Compound 54
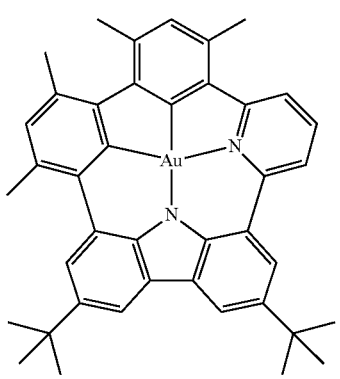
Compound 55
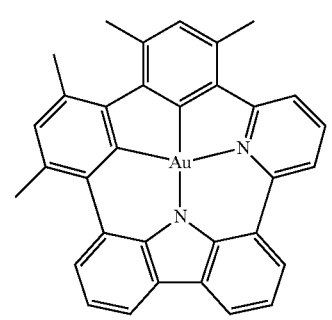
Compound 59
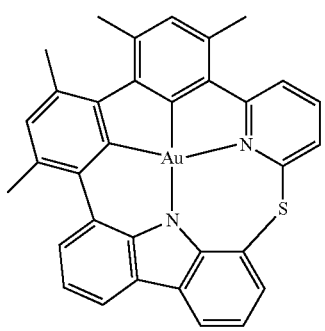

Compound 60
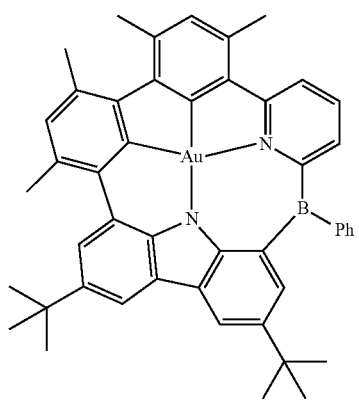
Compound 64
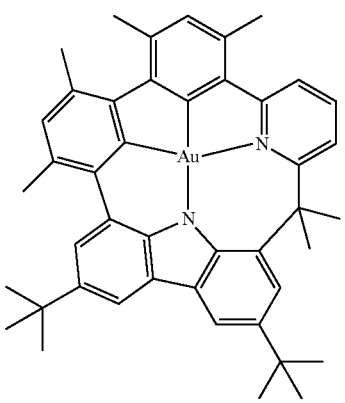
Compound 61
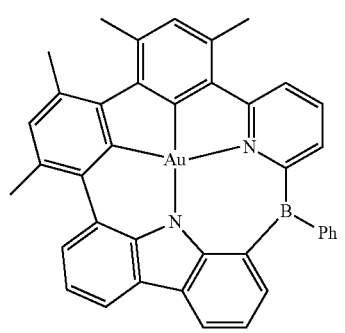
Compound 65
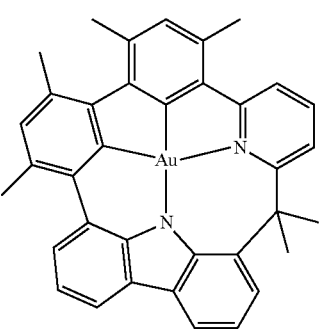
Compound 62
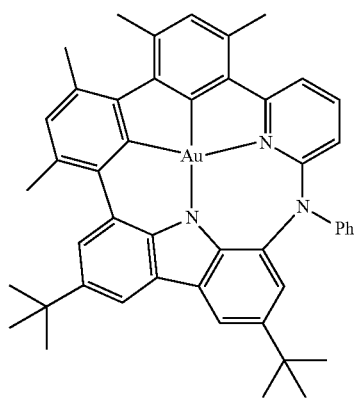
Compound 66
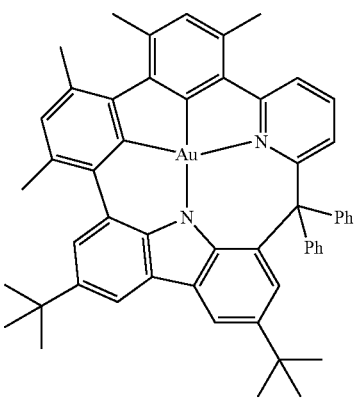
Compound 63
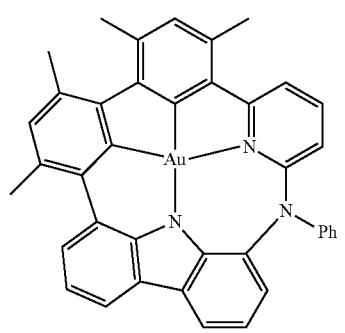
Compound 67
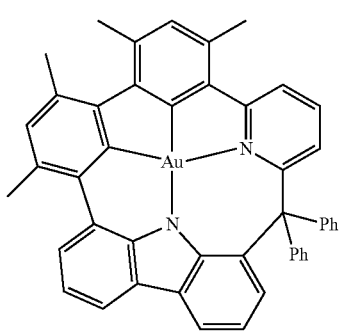

Compound 68
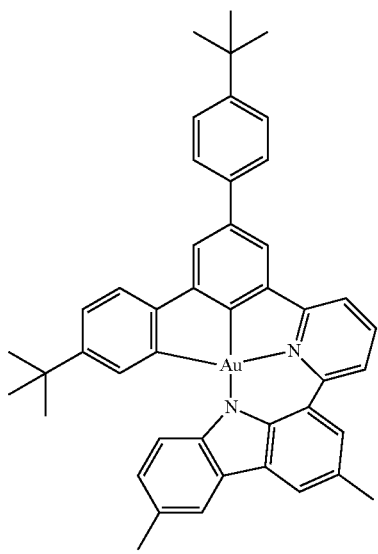
Compound 69
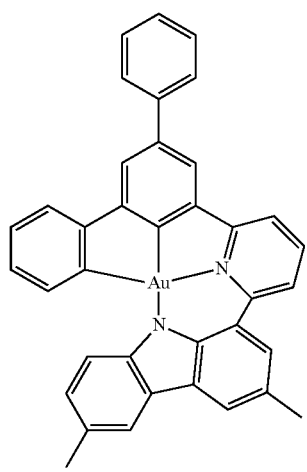
Compound 70
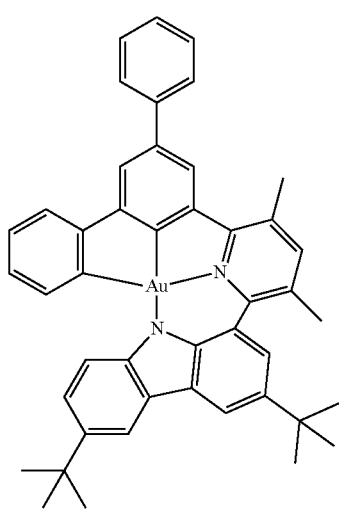
Compound 71
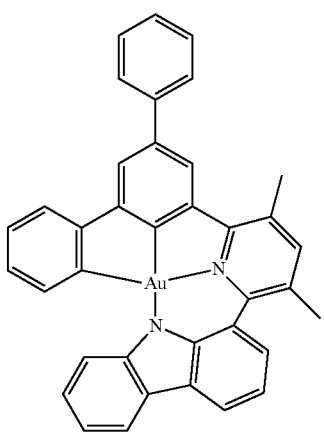
Compound 72
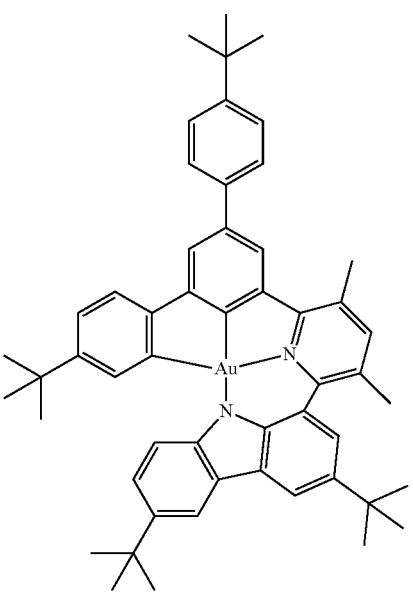
Compound 73
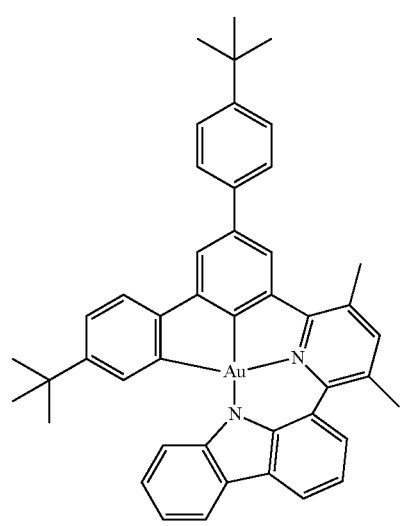

Compound 74
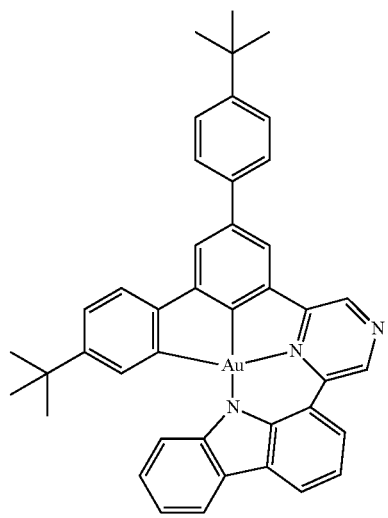
Compound 75
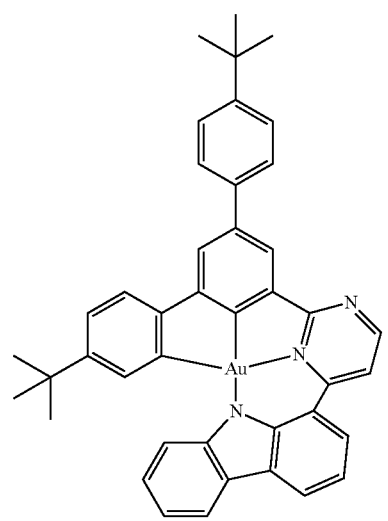
Compound 76
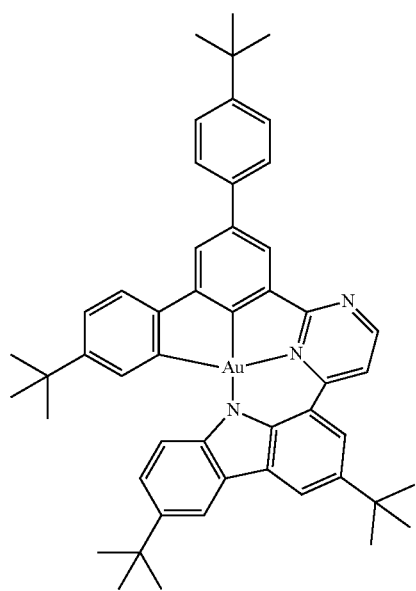
Compound 77
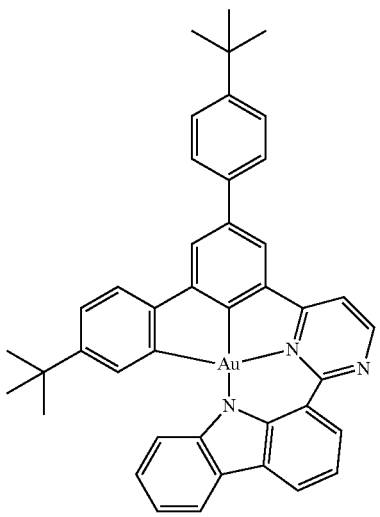
Compound 78
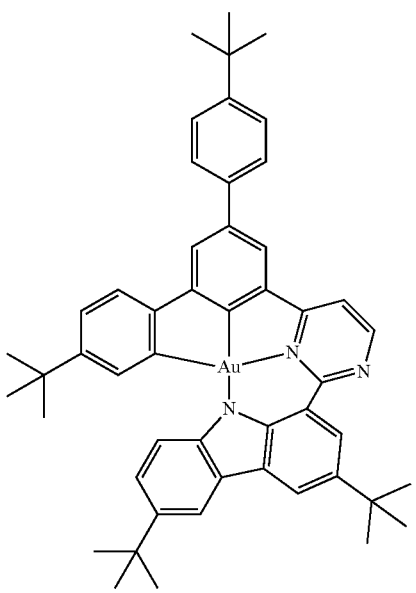
Compound 79
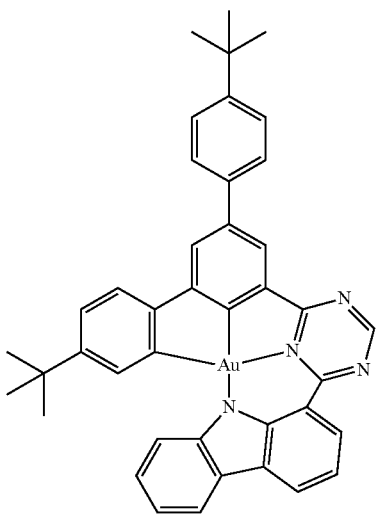

Compound 80
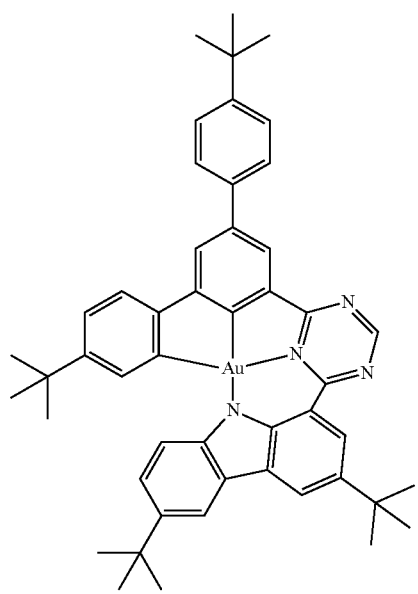
Compound 81
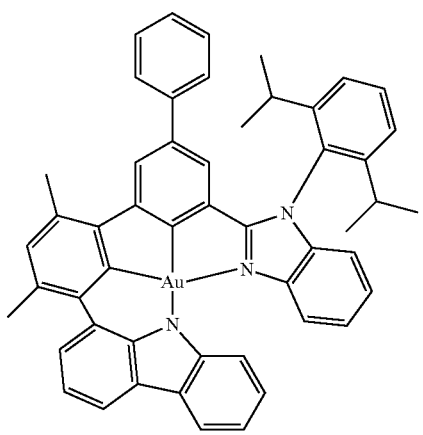
Compound 82
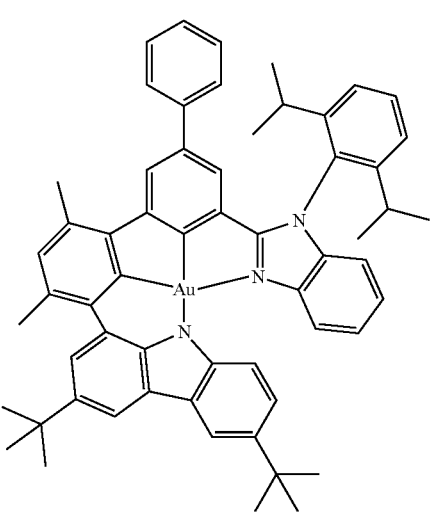
Compound 83
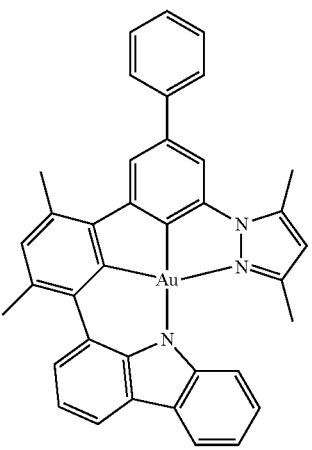
Compound 84
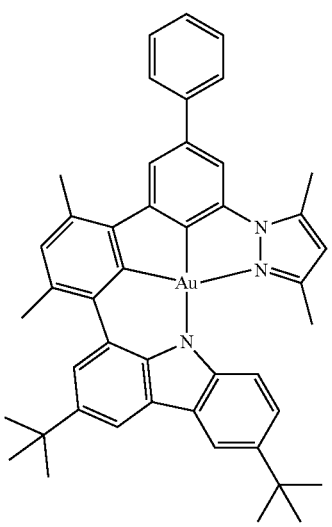
Compound 85
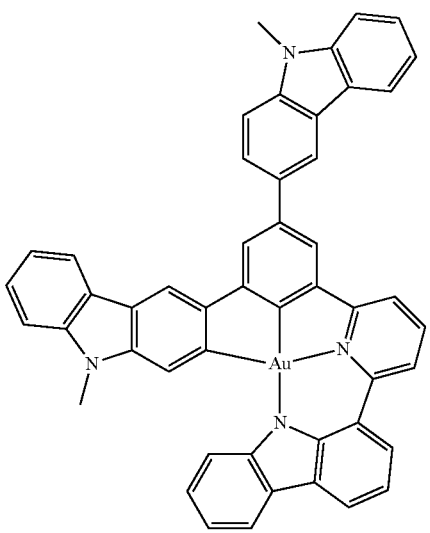

Compound 86
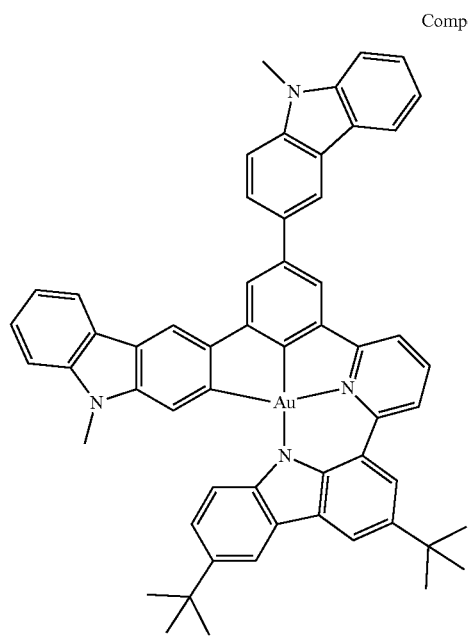
Compound 88
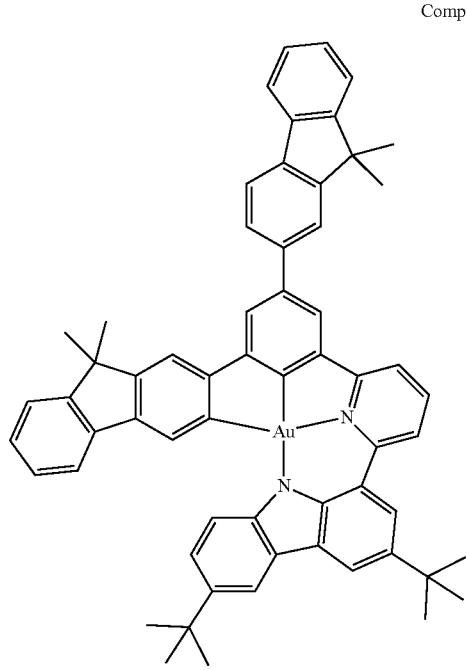
Compound 87
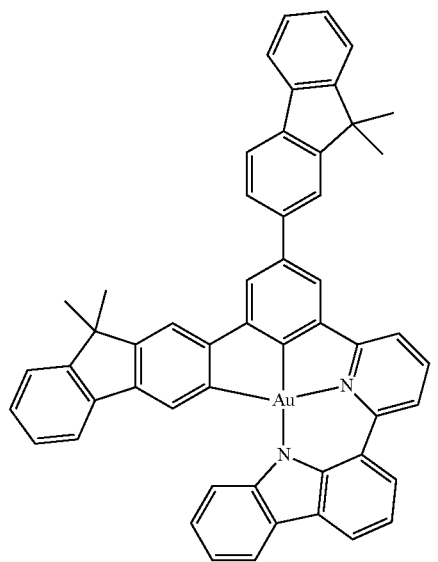
Compound 89
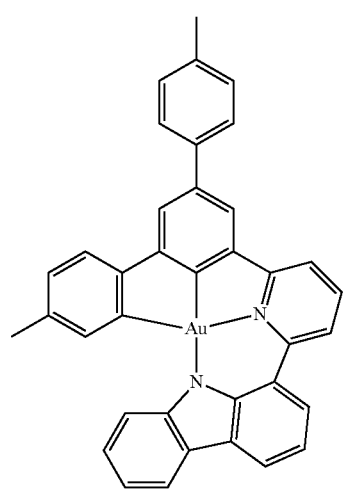

Compound 90
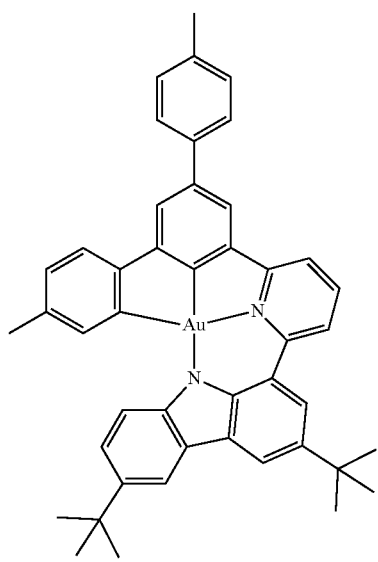
Compound 91
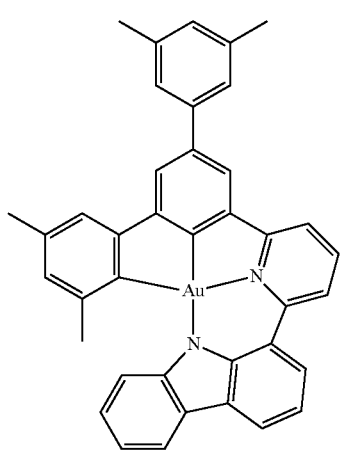
Compound 92
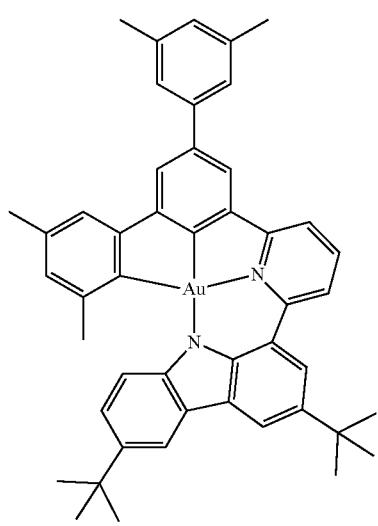
Compound 93
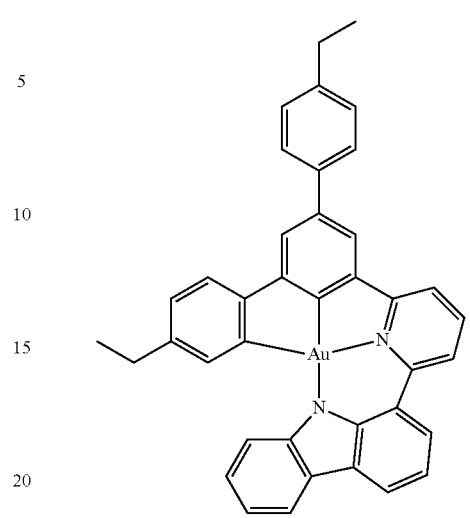
Compound 94
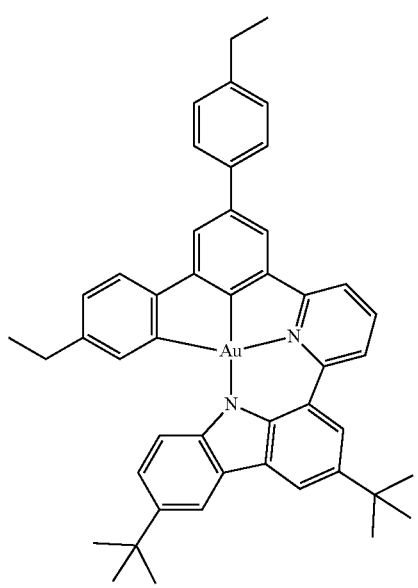
Compound 95
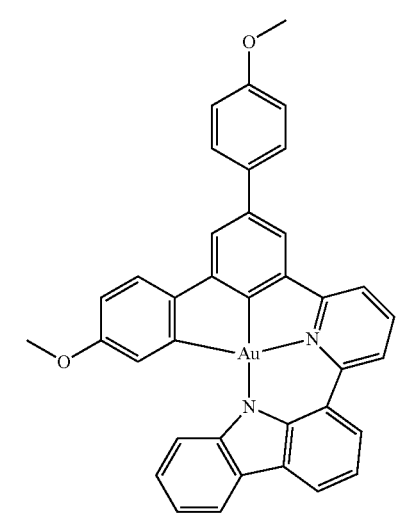

Compound 96
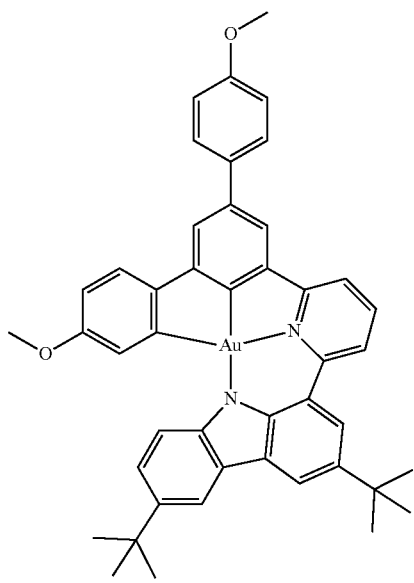
Compound 98
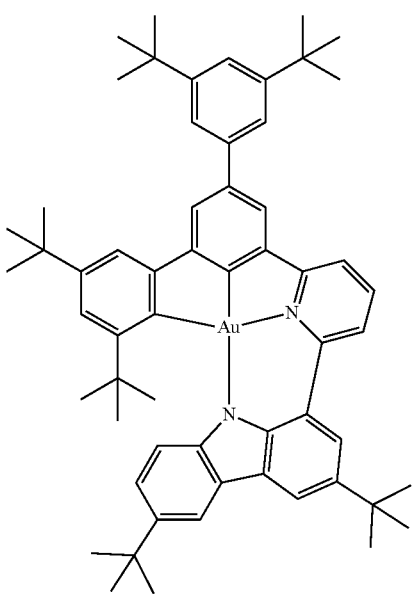
Compound 97
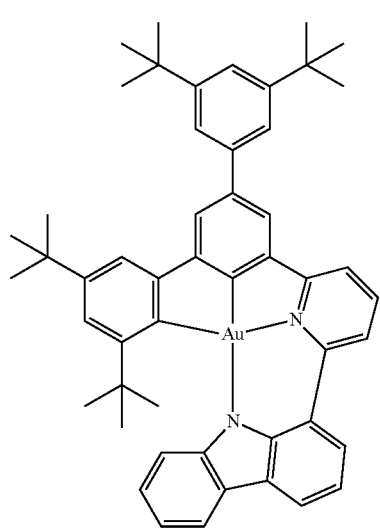
Compound 99
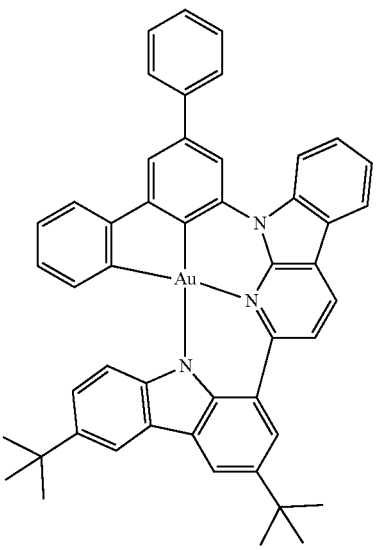

Compound 100
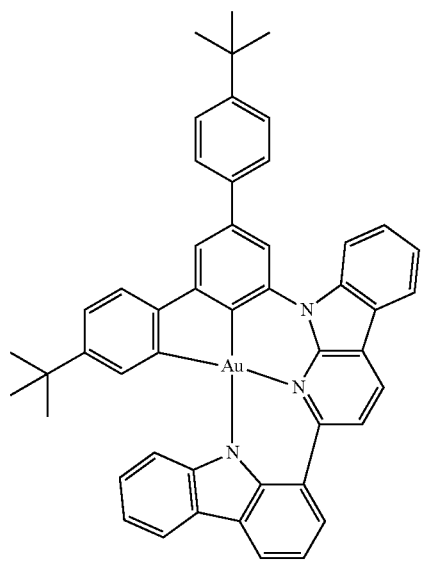
Compound 101
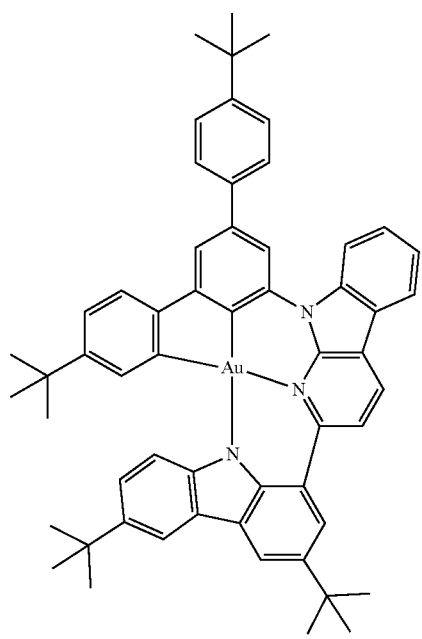
Compound 102
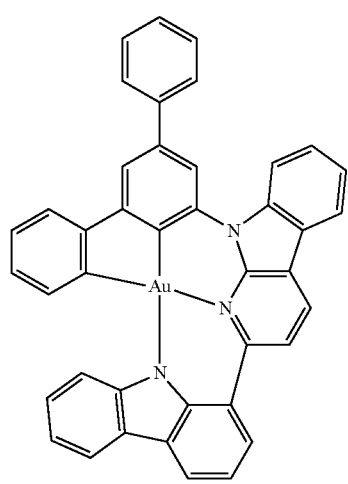
Compound 103
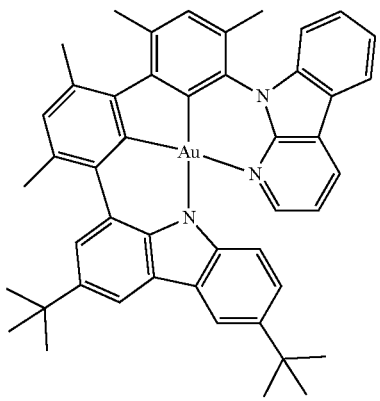
Compound 104
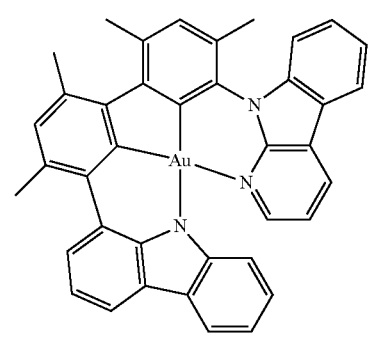
Compound 105
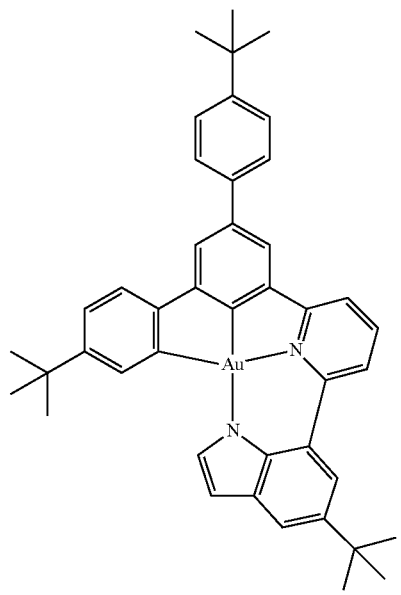

Compound 106
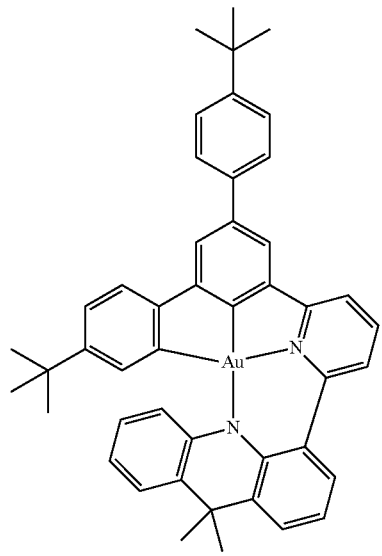
Compound 107
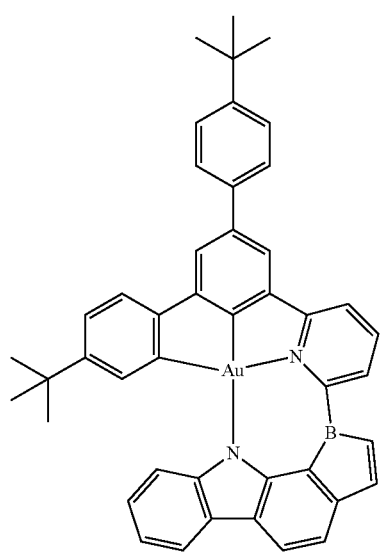
Compound 108
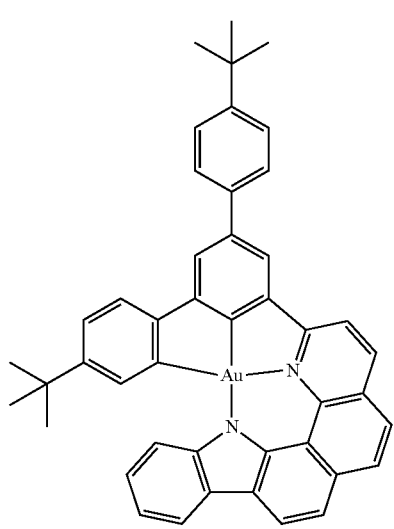
Compound 109
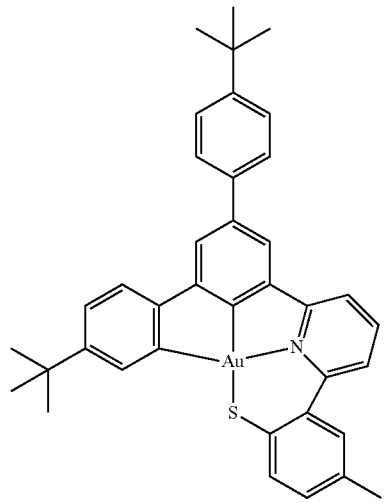
Compound 110
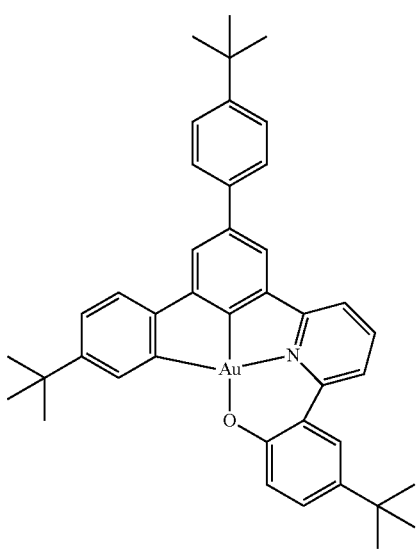
Compound 111
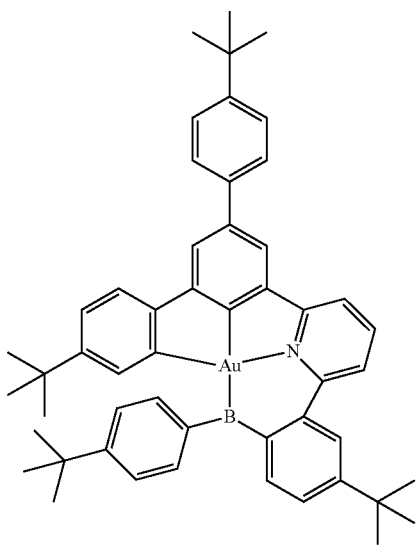

Compound 112
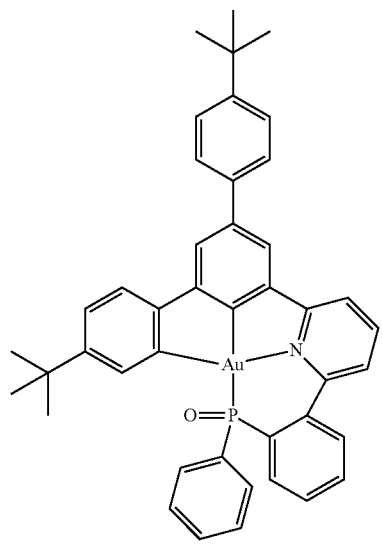
Compound 113
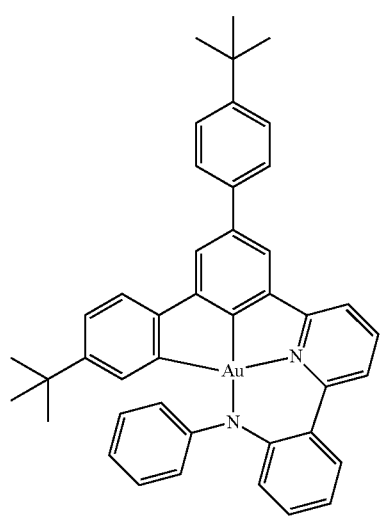
Compound 114
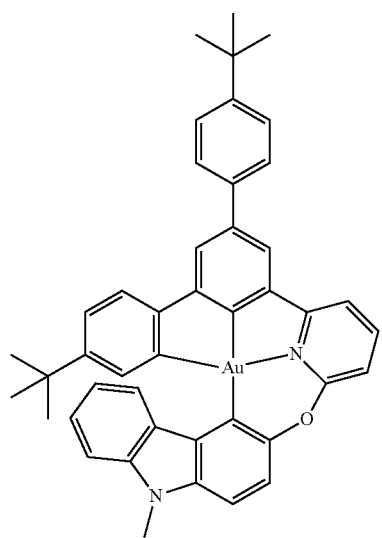
Compound 115
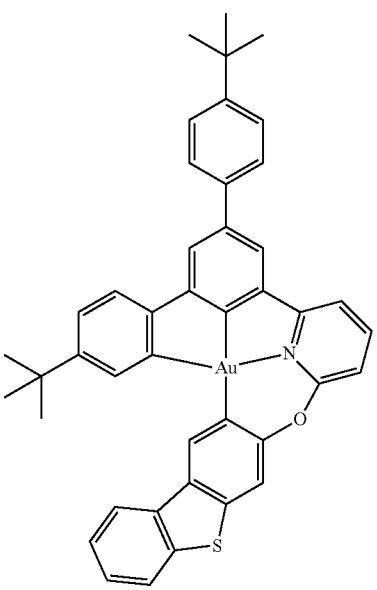
Compound 116
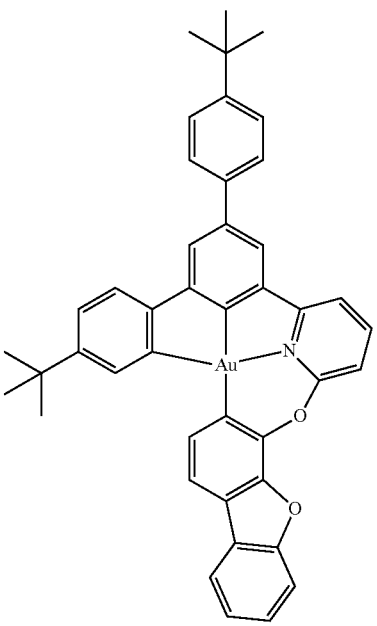

Compound 117
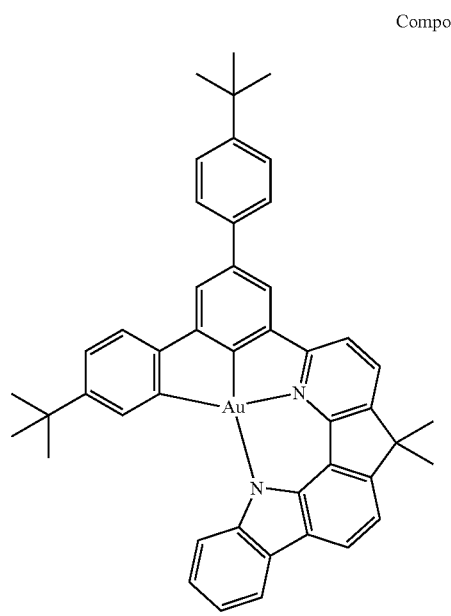
Compound 118
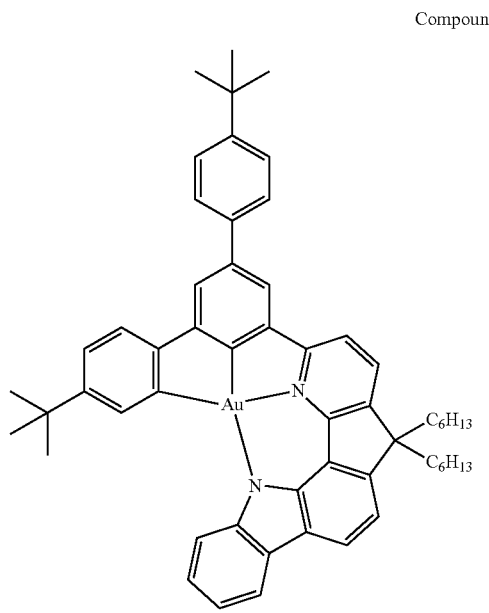
Compound 119
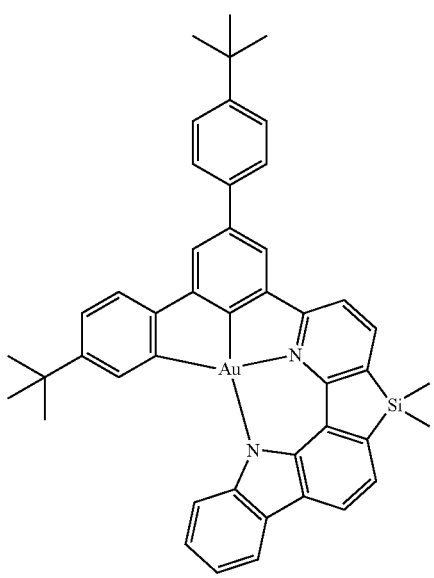
Compound 120
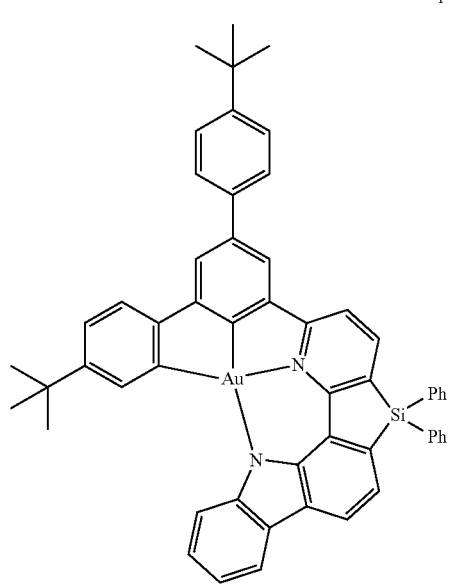

Compound 121
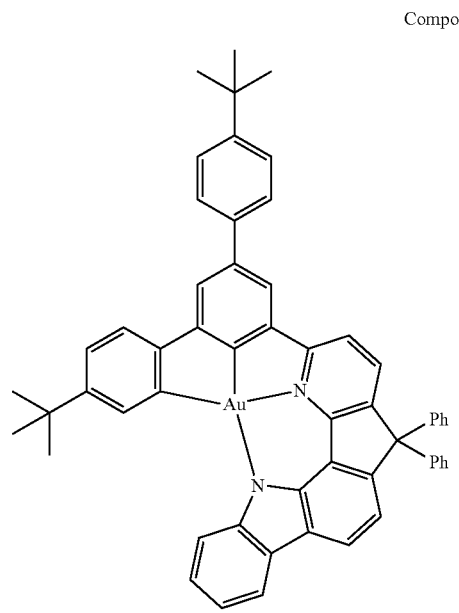
Compound 123
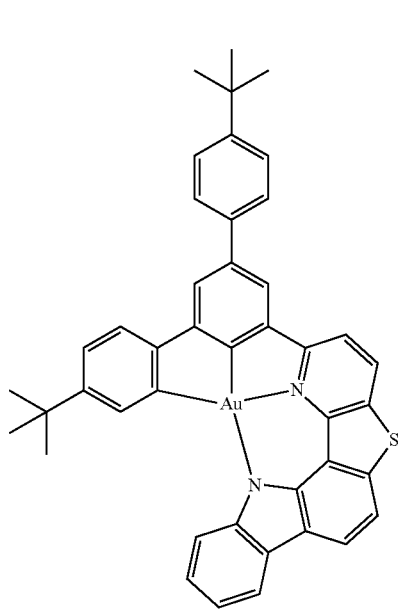
Compound 122
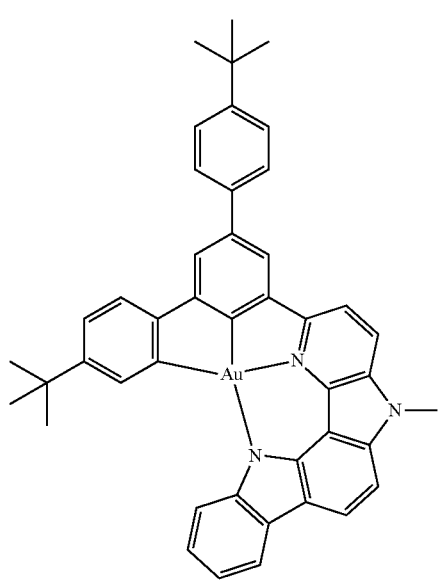
Compound 124
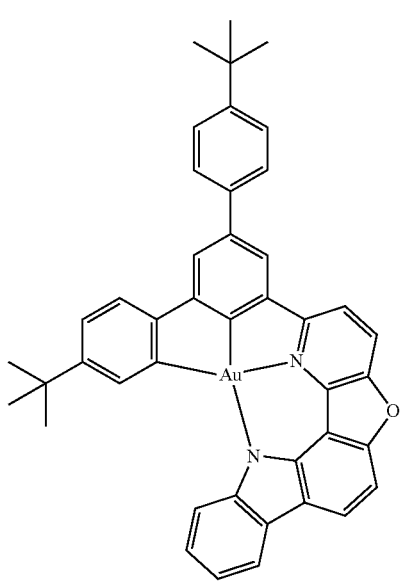

Compound 125
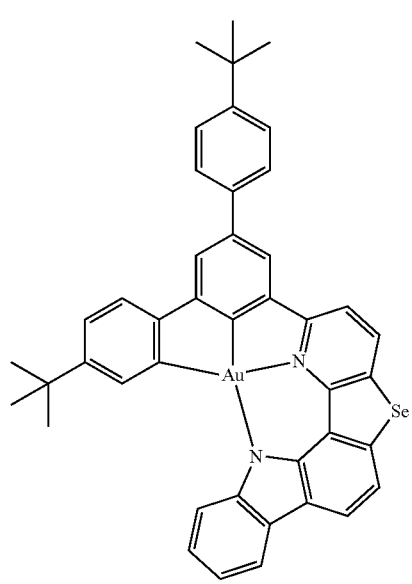
Compound 127
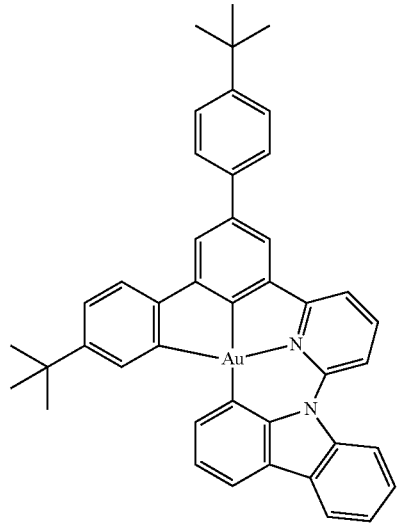
Compound 128
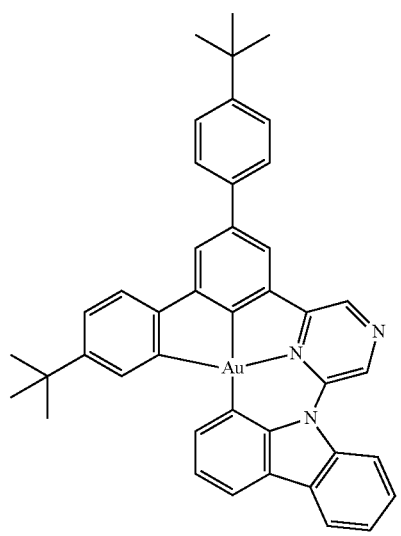
Compound 126
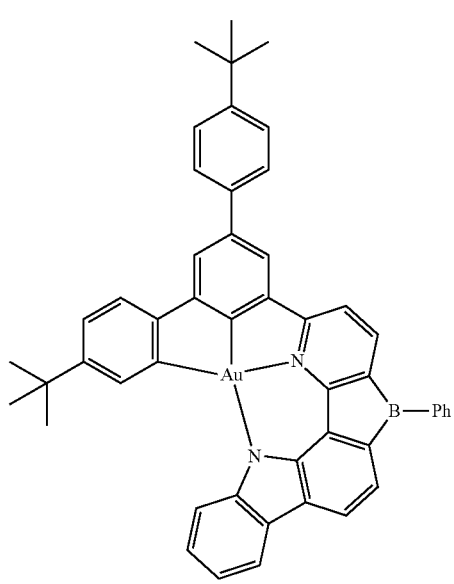
Compound 129
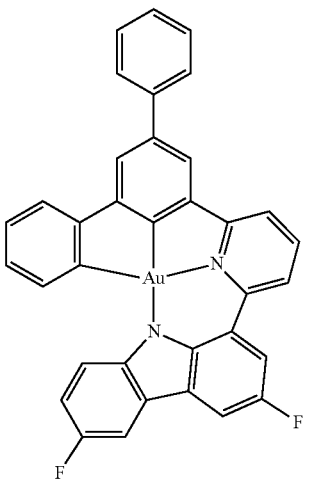

Compound 130
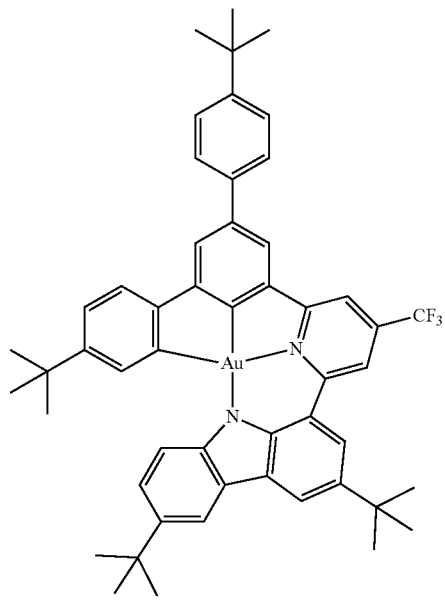
Compound 131
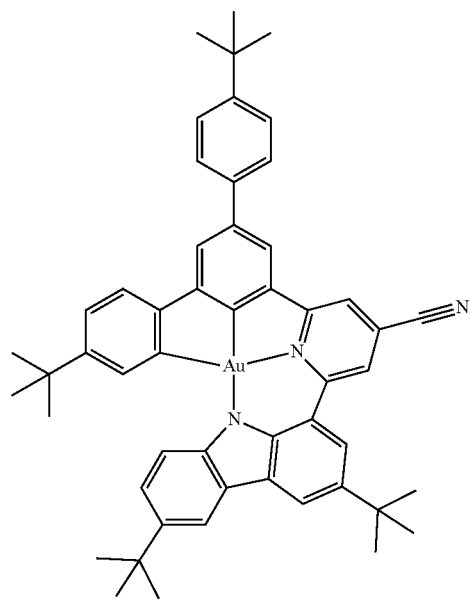
Compound 132
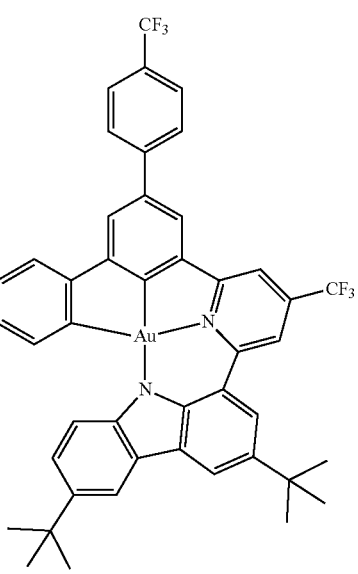
Compound 133
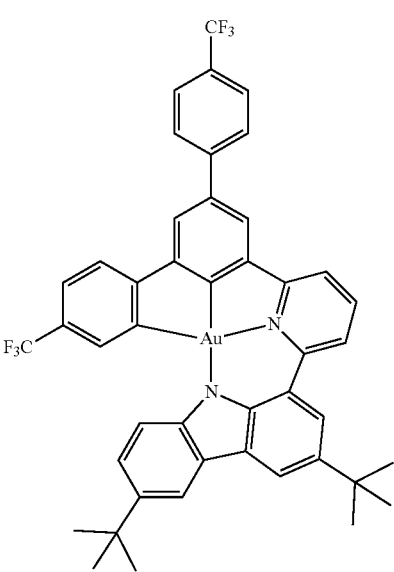

Compound 134
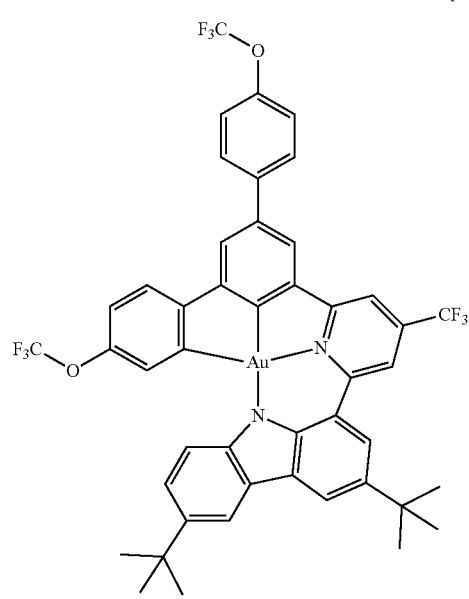
Compound 135
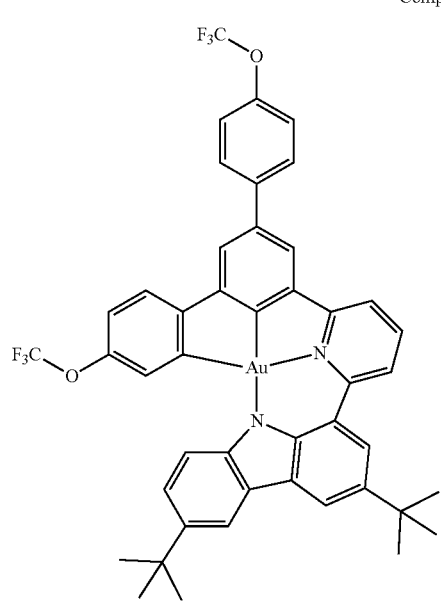
Compound 136
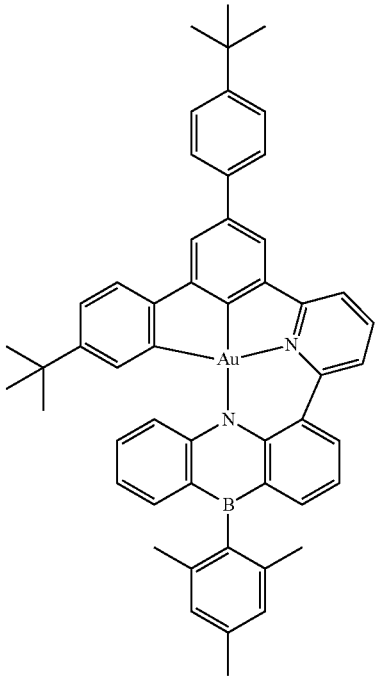
Compound 137
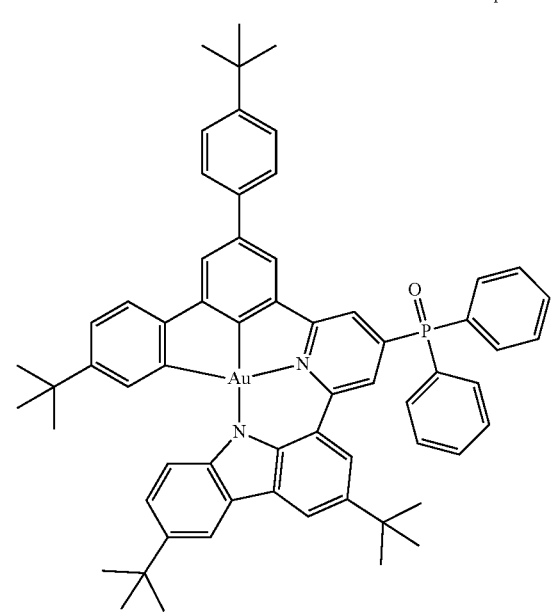

Compound 138
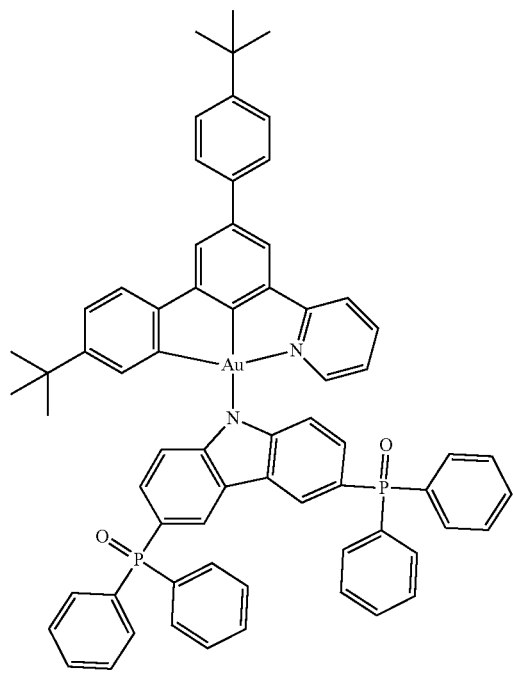
Compound 140
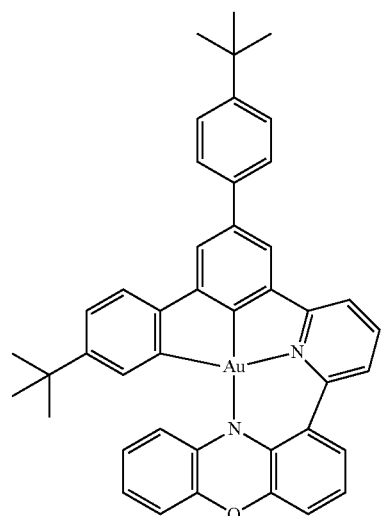
Compound 139
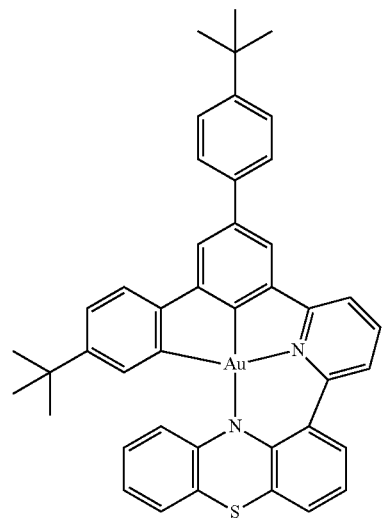
Compound 141
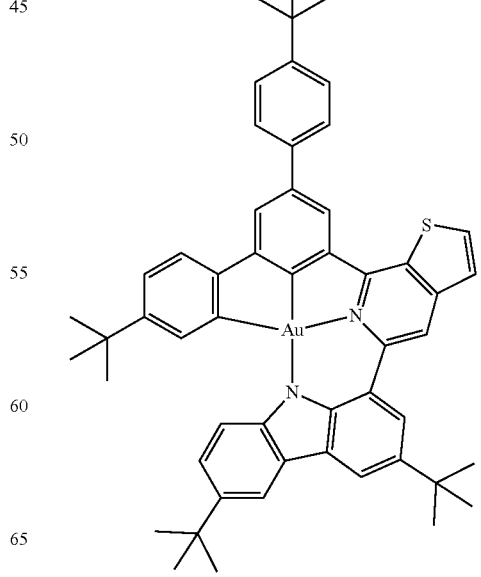

Compound 142
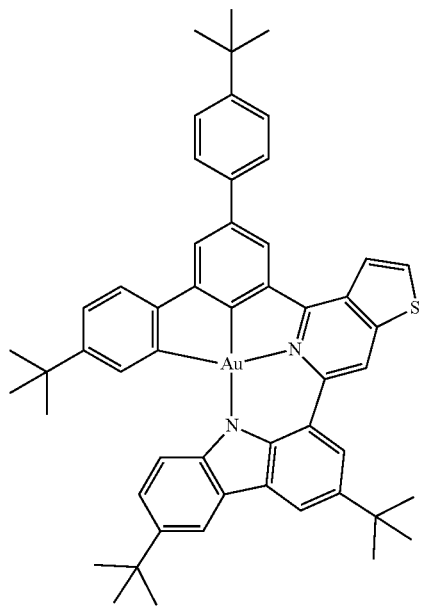
Compound 143
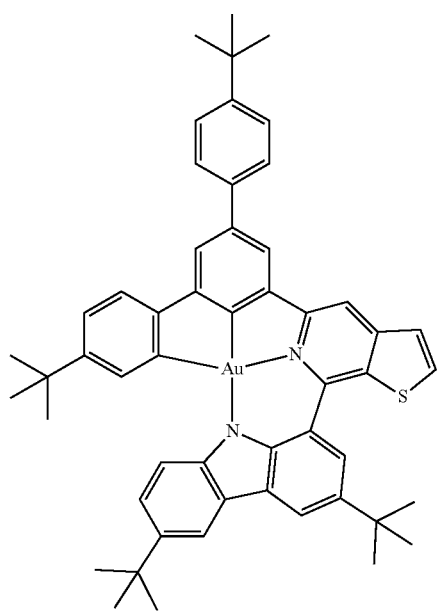
Compound 144
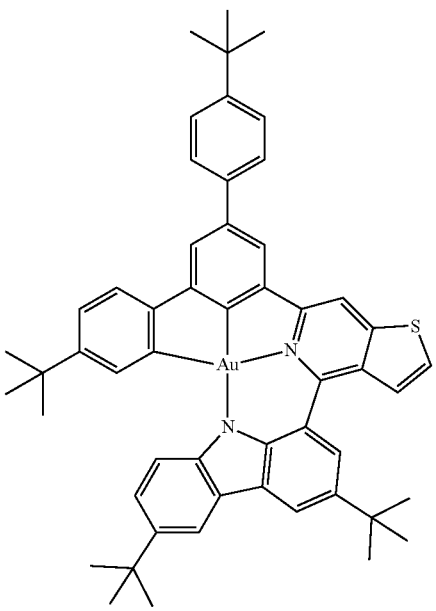
Compound 145
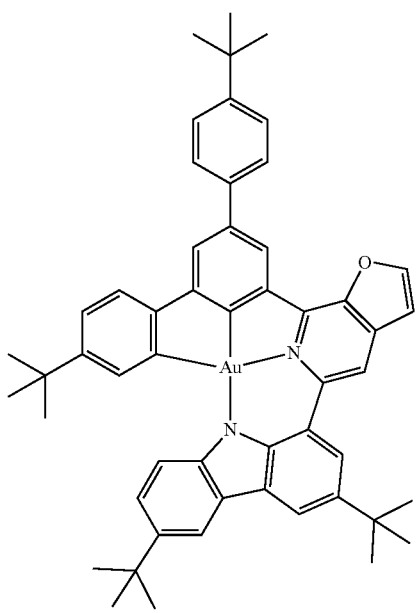

Compound 146
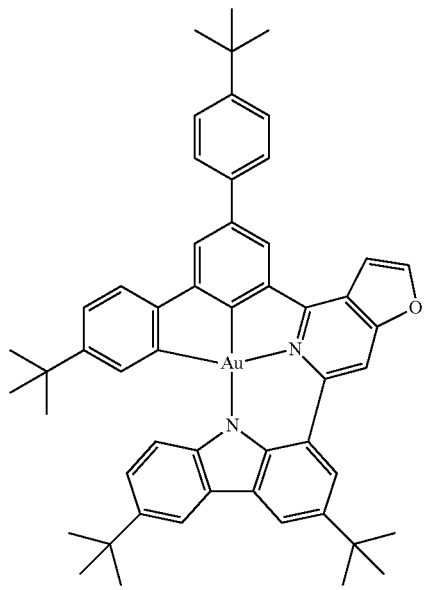
Compound 147
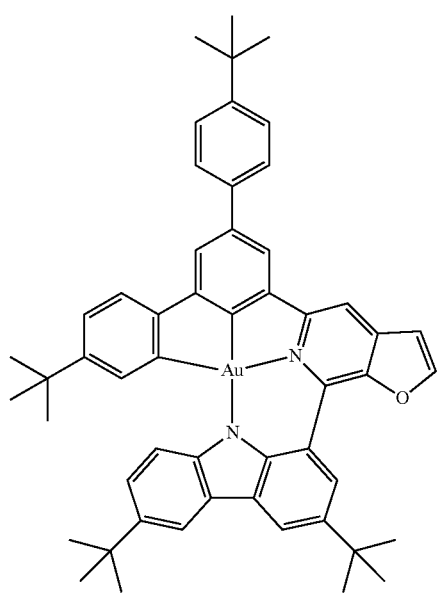
Compound 148
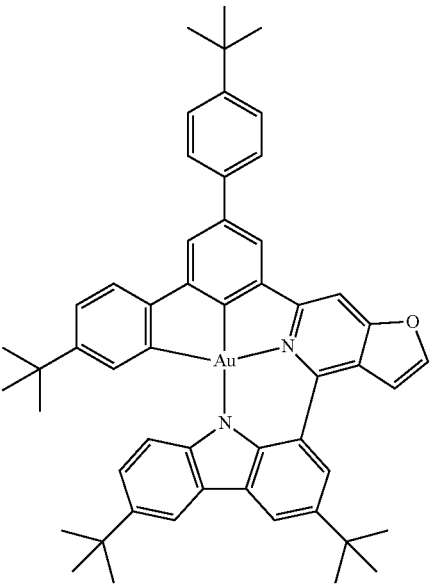
Compound 149
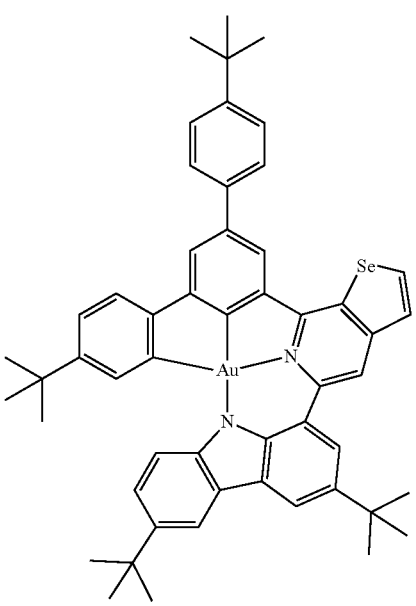

Compound 150
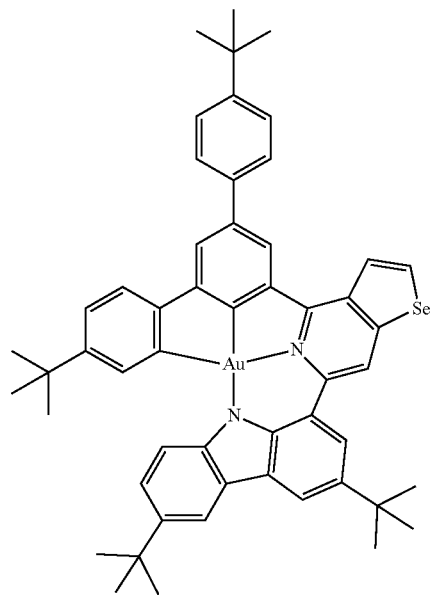
Compound 151
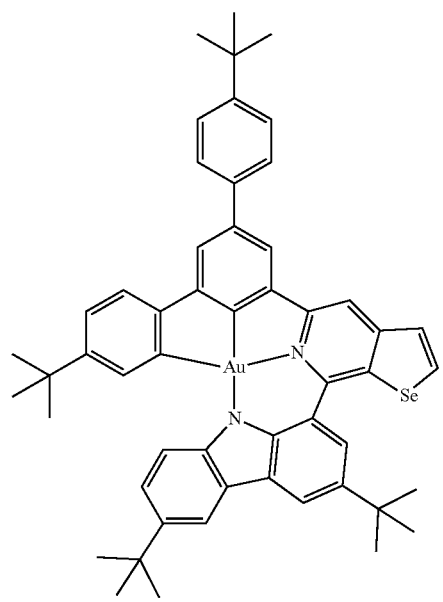
Compound 152
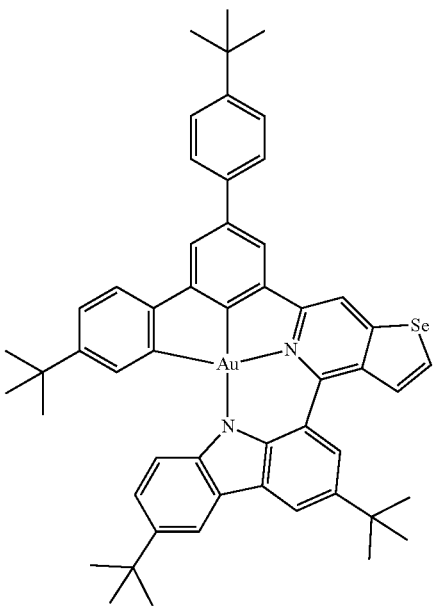
Compound 153
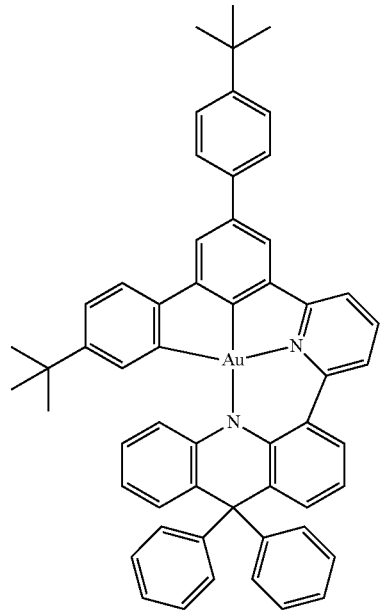

Compound 154
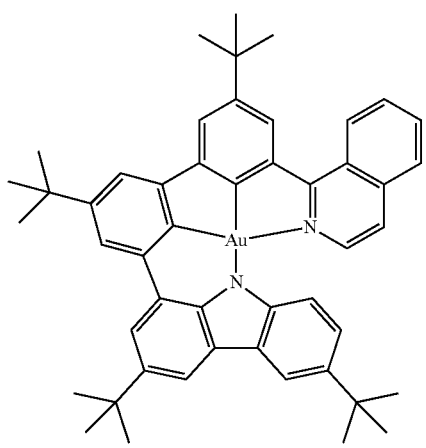
Compound 155
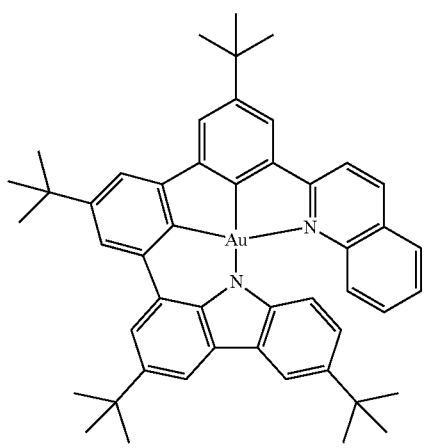
Compound 156
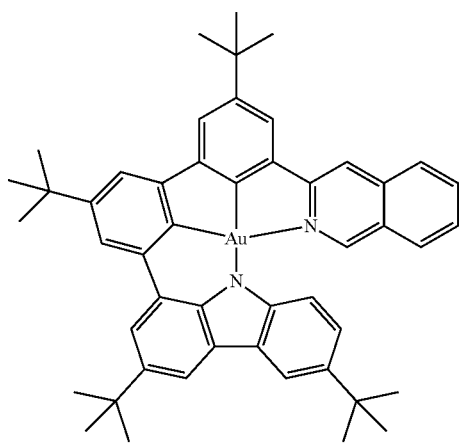
Compound 157
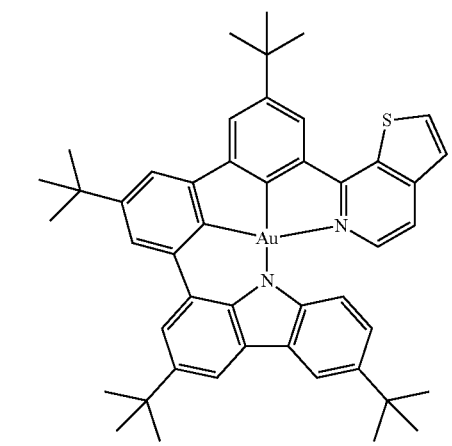
Compound 158
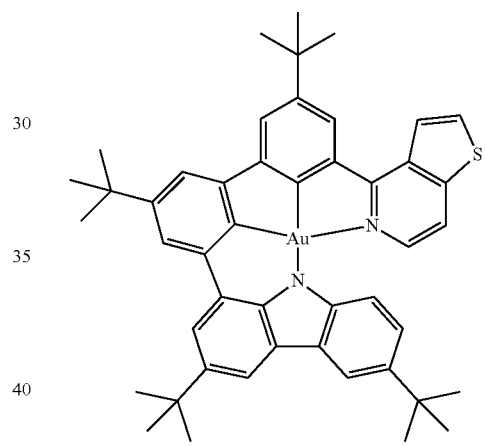
Compound 159
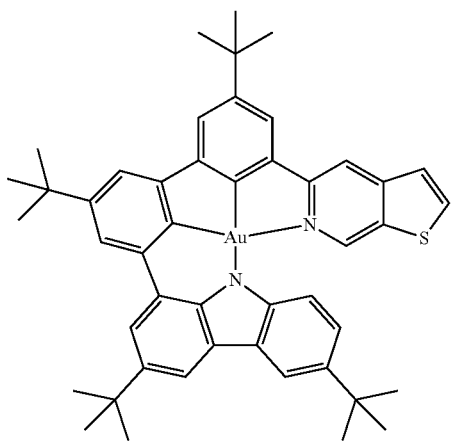

Compound 160
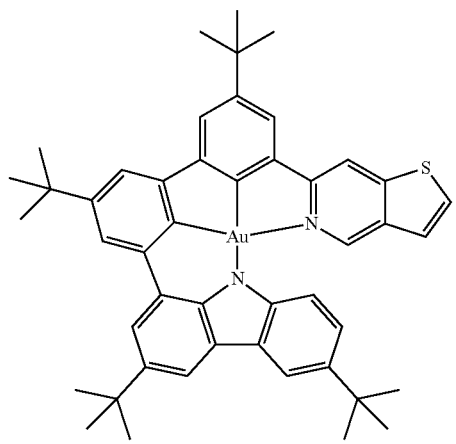
Compound 161
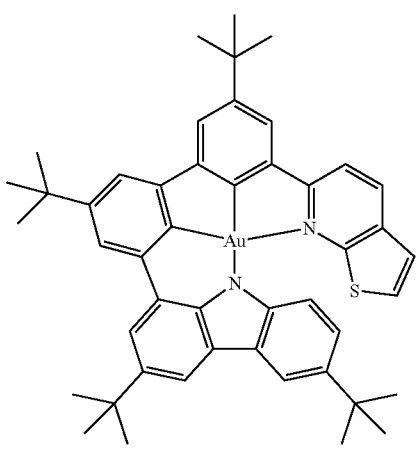
Compound 162
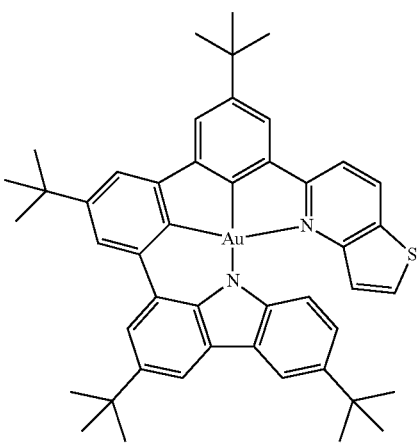
Compound 163
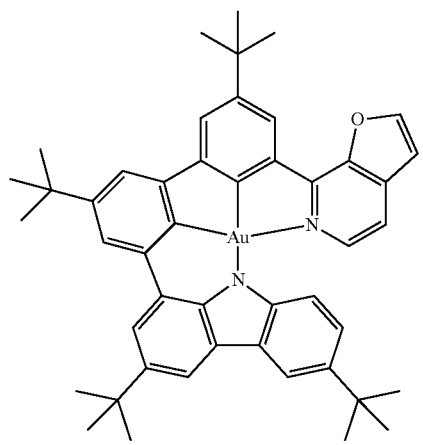
Compound 164
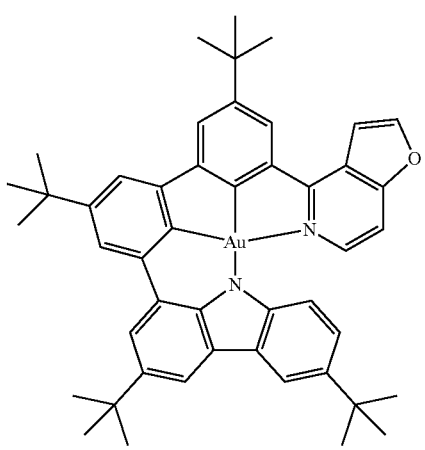
Compound 165
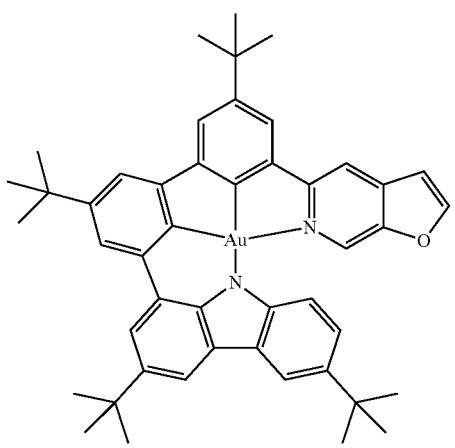

Compound 166
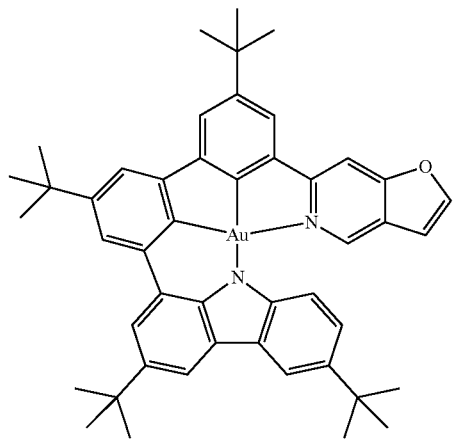
Compound 167
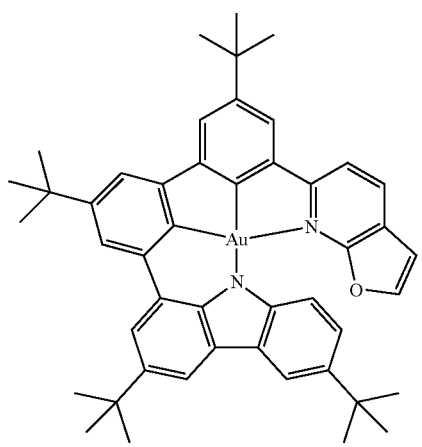
Compound 168
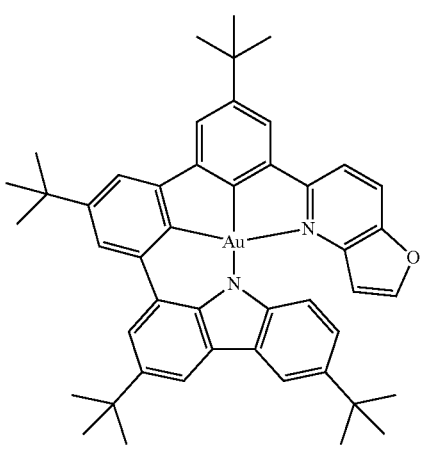
Compound 169
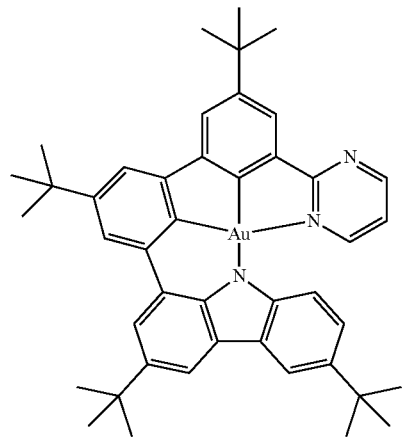
Compound 170
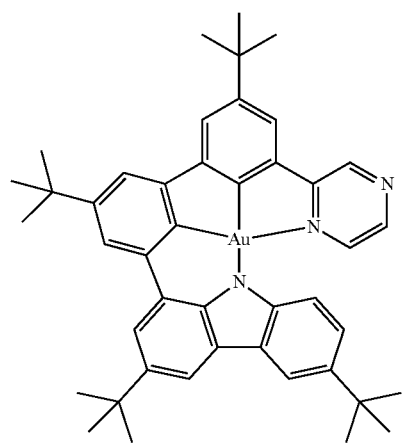
Compound 171
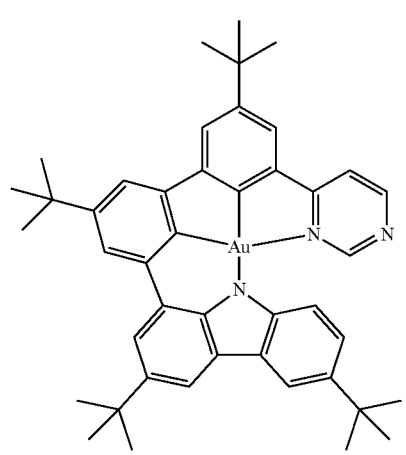

Compound 172
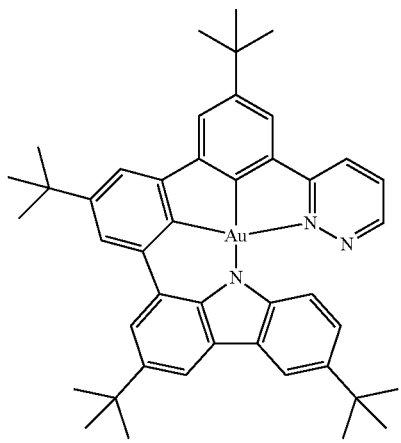
Compound 175
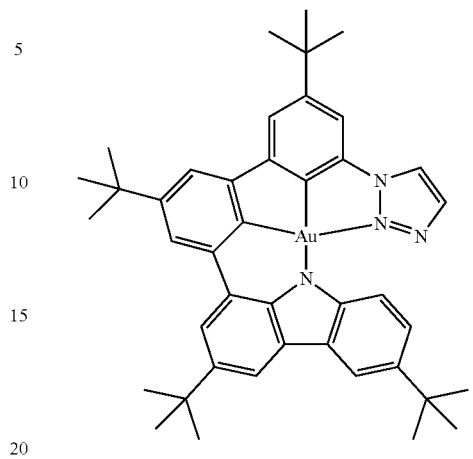
Compound 173
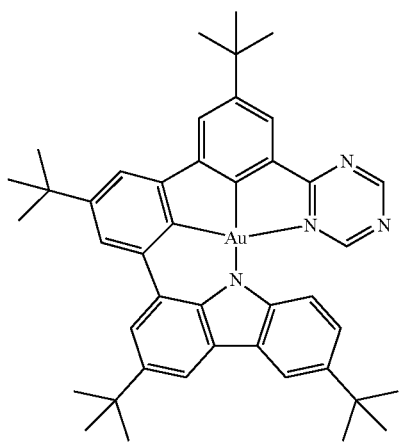
Compound 176
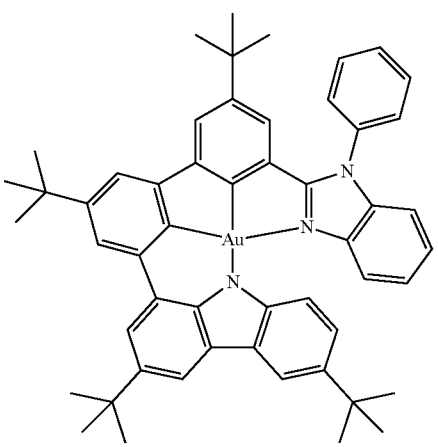
Compound 174
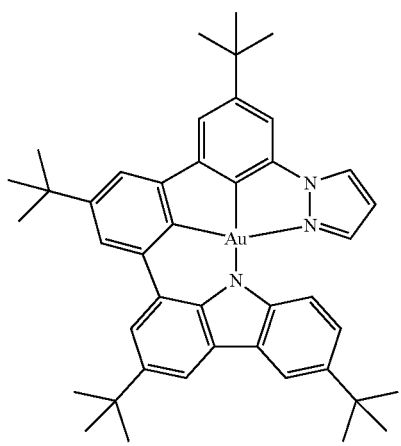
Compound 177
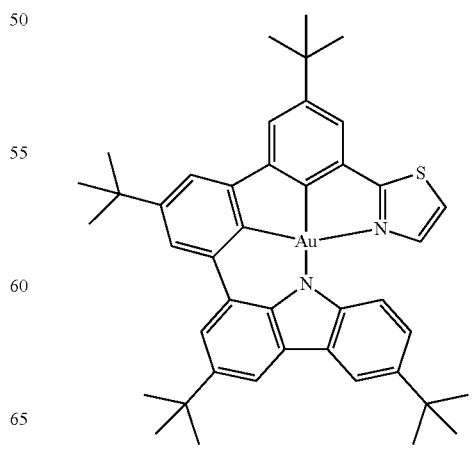

Compound 178
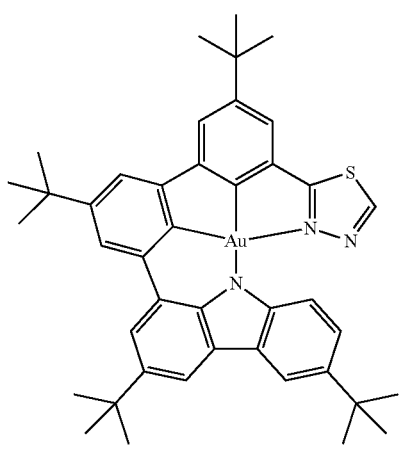
Compound 181
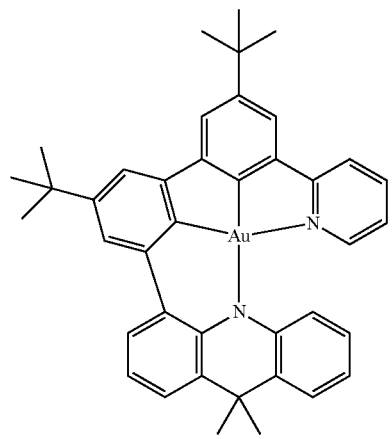
Compound 179
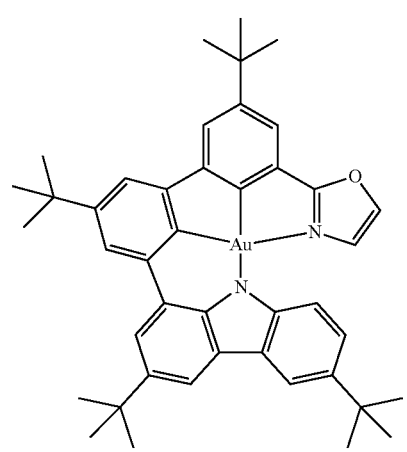
Compound 182
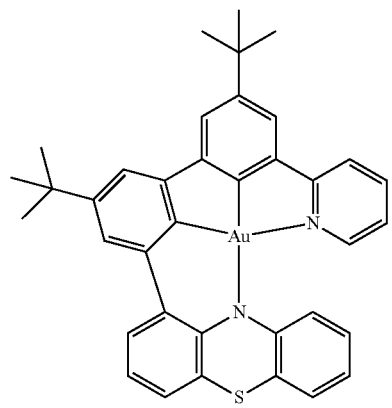
Compound 180
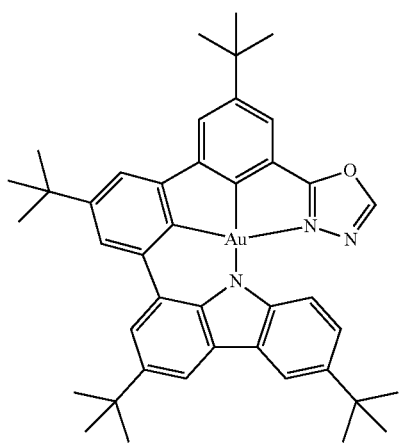
Compound 183
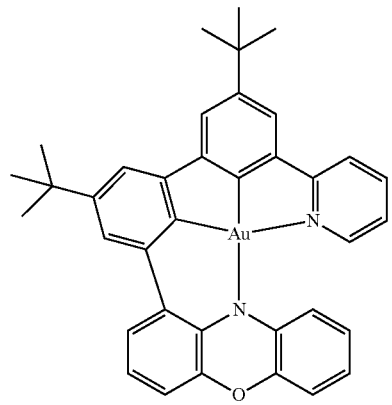

Compound 184
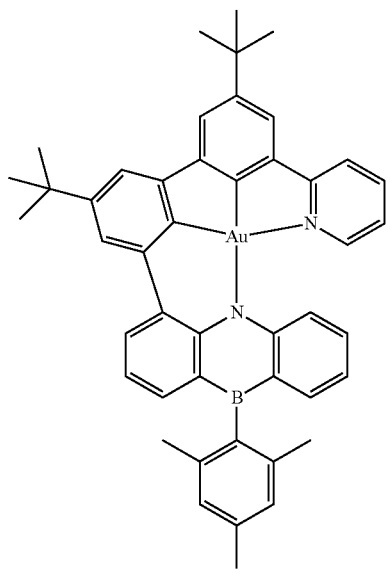
Compound 187
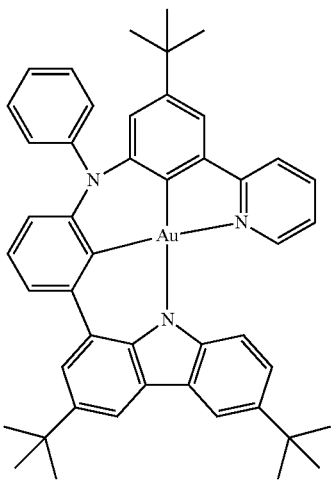
Compound 185
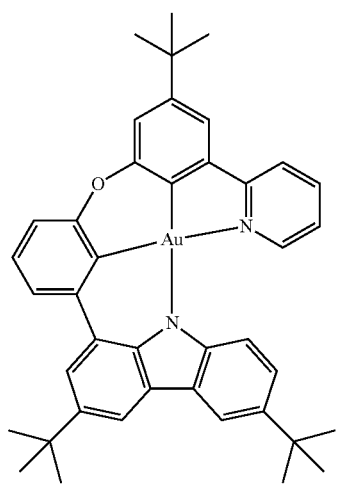
Compound 188
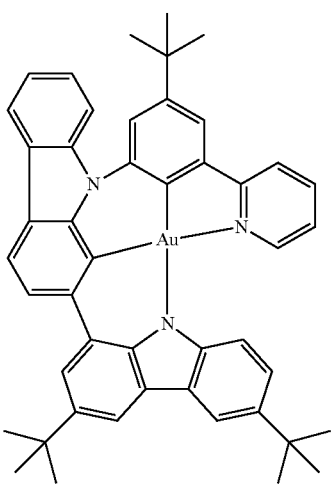
Compound 186
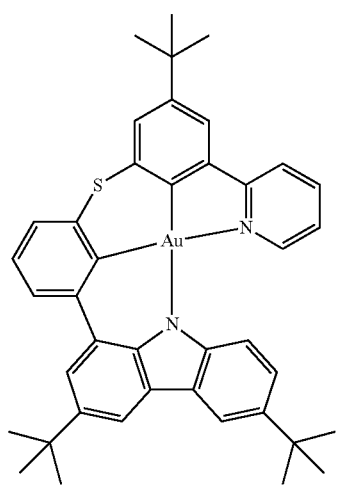
Compound 189

-continued
Compound 190
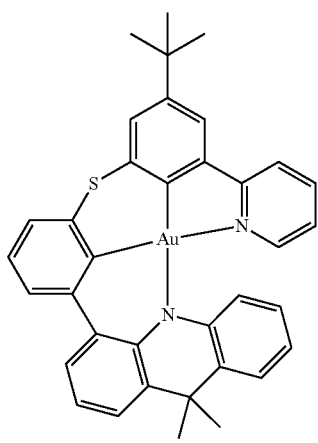
Compound 191
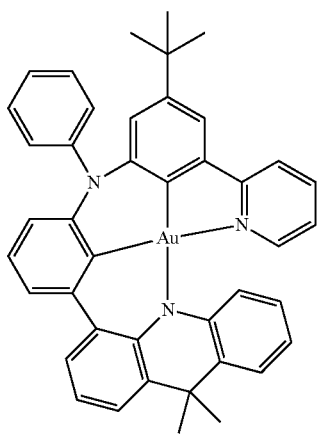
Compound 192
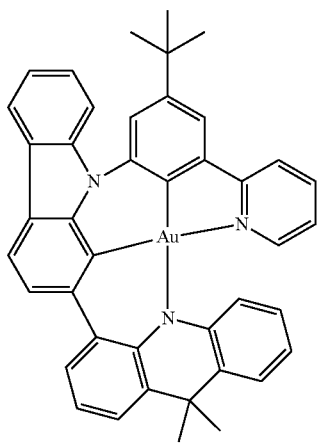
-continued
Compound 193
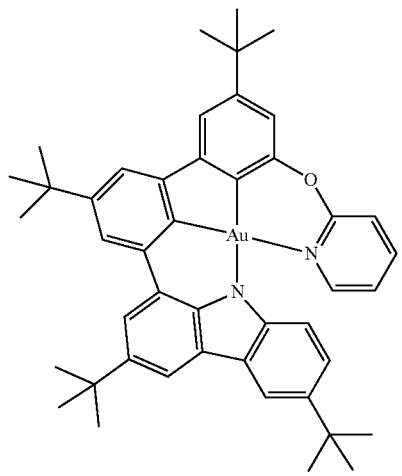
Compound 194
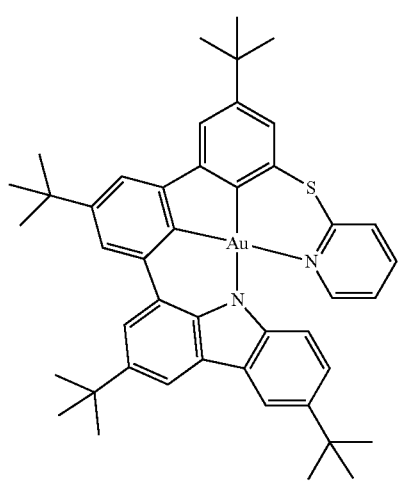
Compound 195
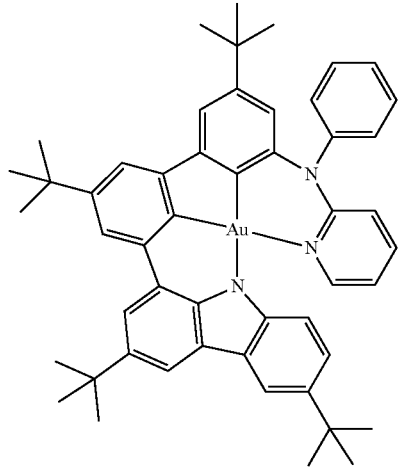

Compound 196
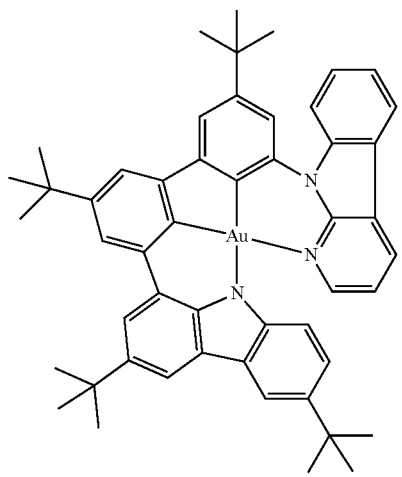
Compound 197
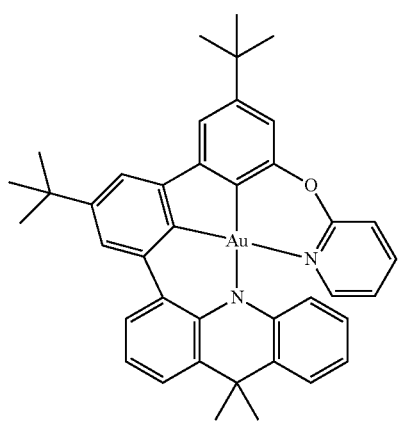
Compound 198
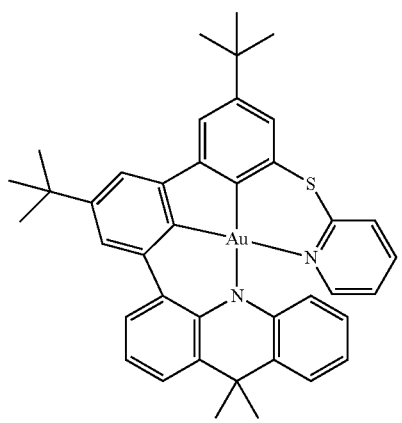
Compound 199
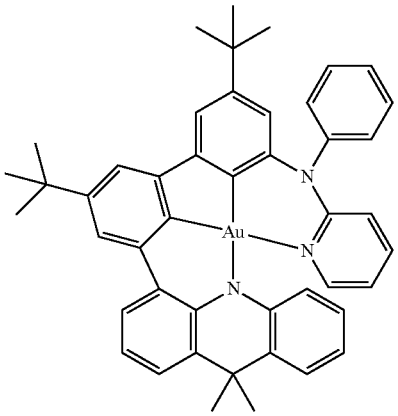
Compound 200
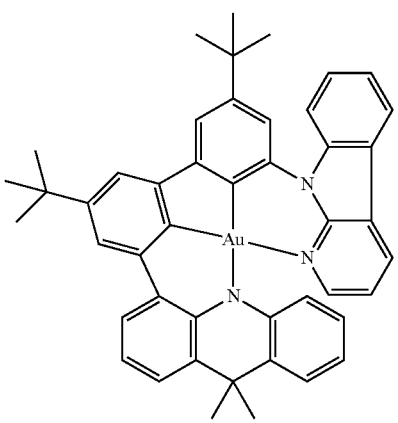
Compound 201
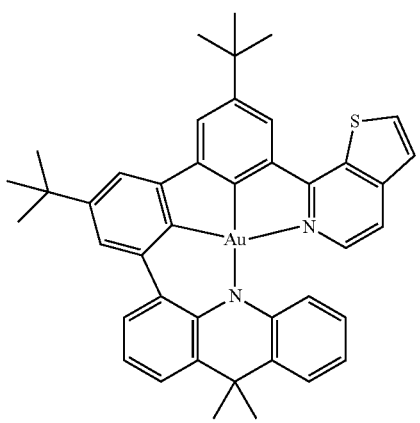

Compound 202
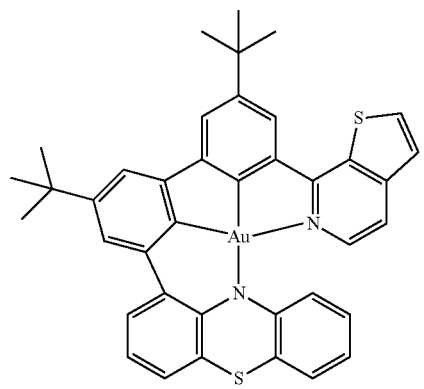
Compound 203
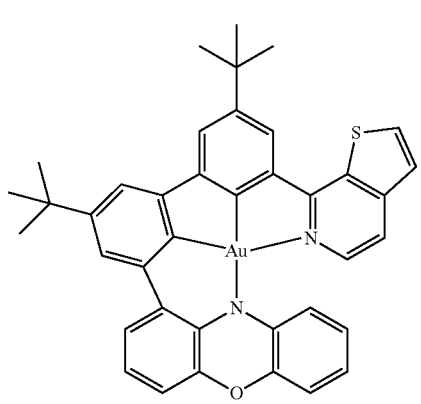
Compound 204
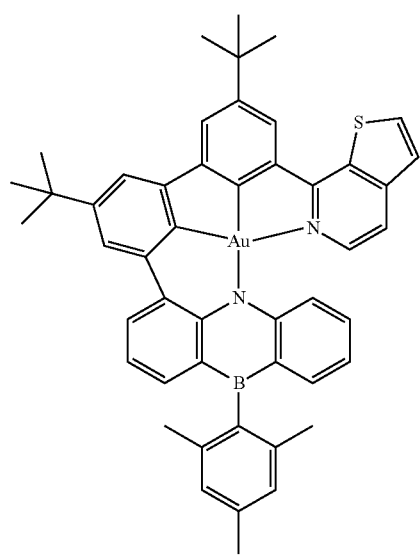
Compound 205
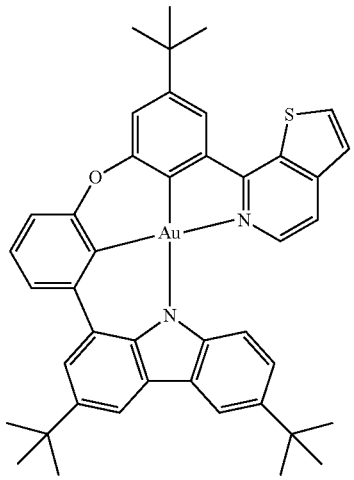
Compound 206
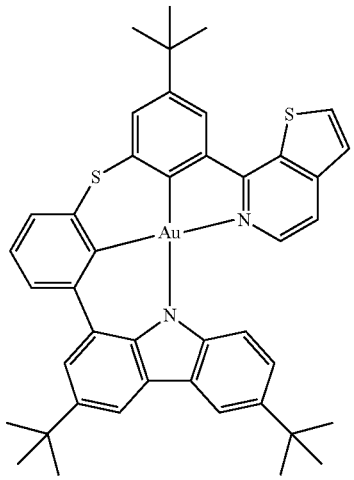
Compound 207
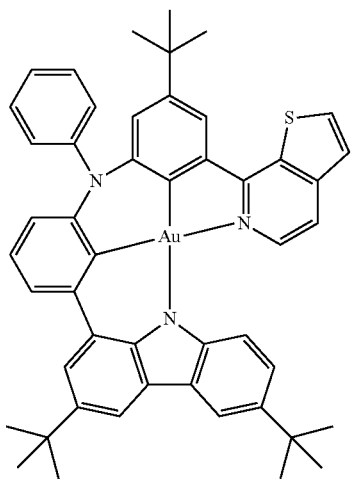

Compound 208
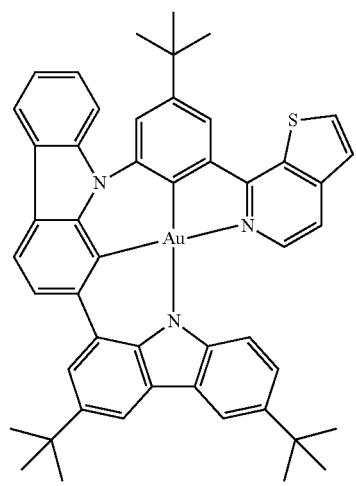
Compound 209
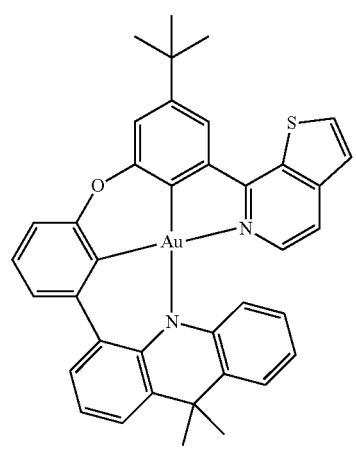
Compound 210
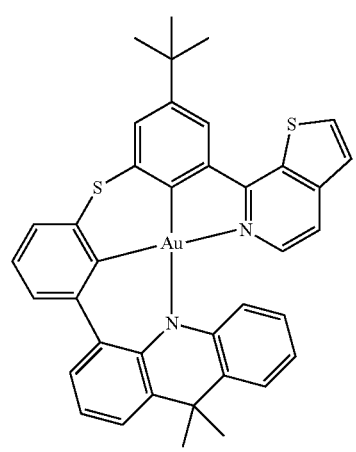
Compound 211
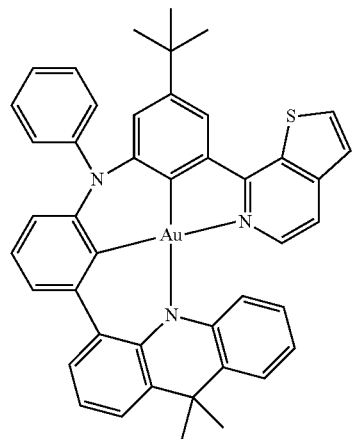
Compound 212
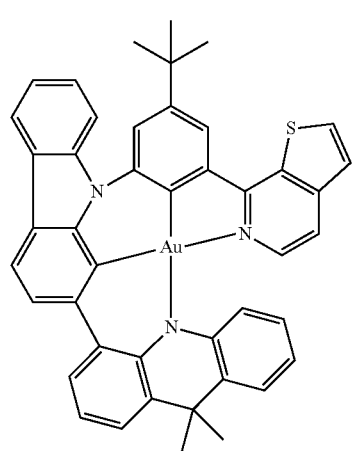
Compound 213
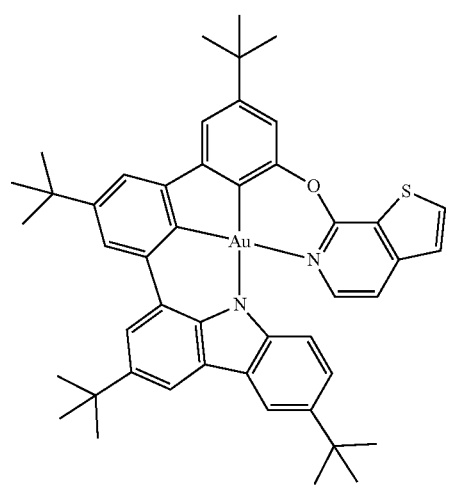

Compound 214
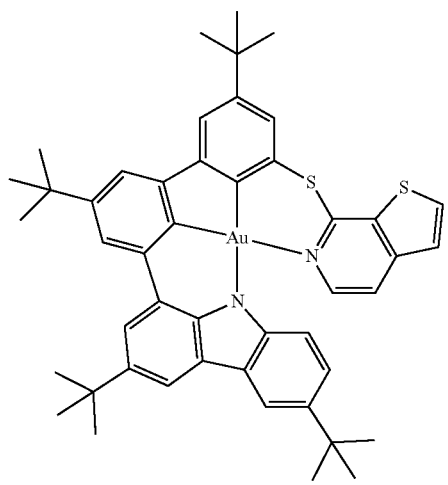
Compound 215
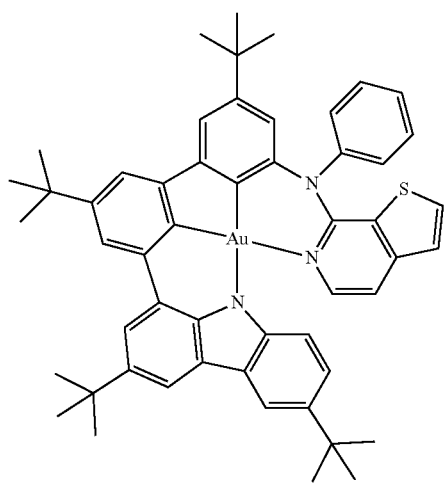
Compound 216
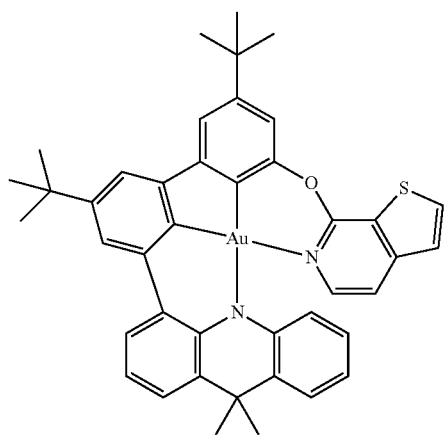
Compound 217
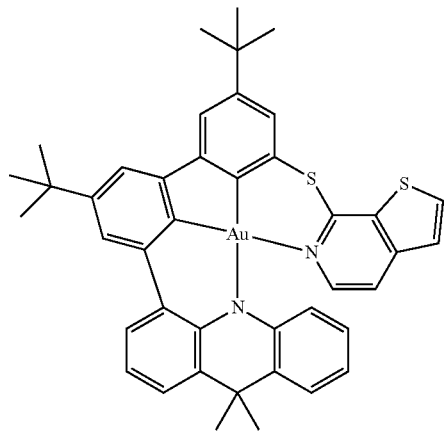
Compound 218
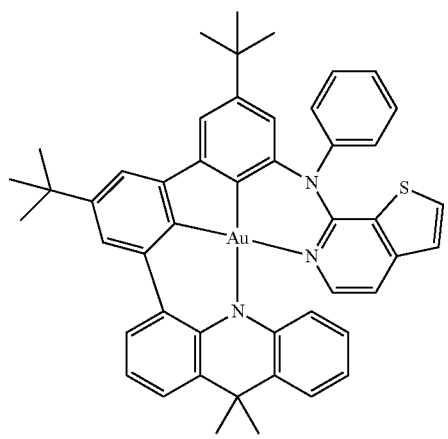
Compound 219
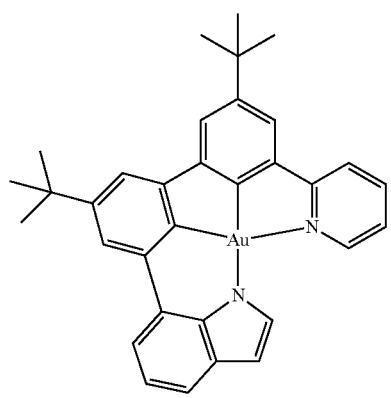

Compound 220

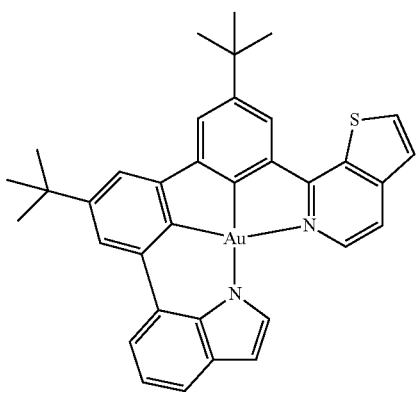

In some embodiments of the subject matter described herein, the luminescent tetradentate ligand-containing gold (III) compounds of formula (I) are prepared. The compounds are represented throughout by their monomeric structure. As is well known to those skilled in the art, the compounds may also be present as dimers, trimers, oligomers or dendrimers.

Figure 1:
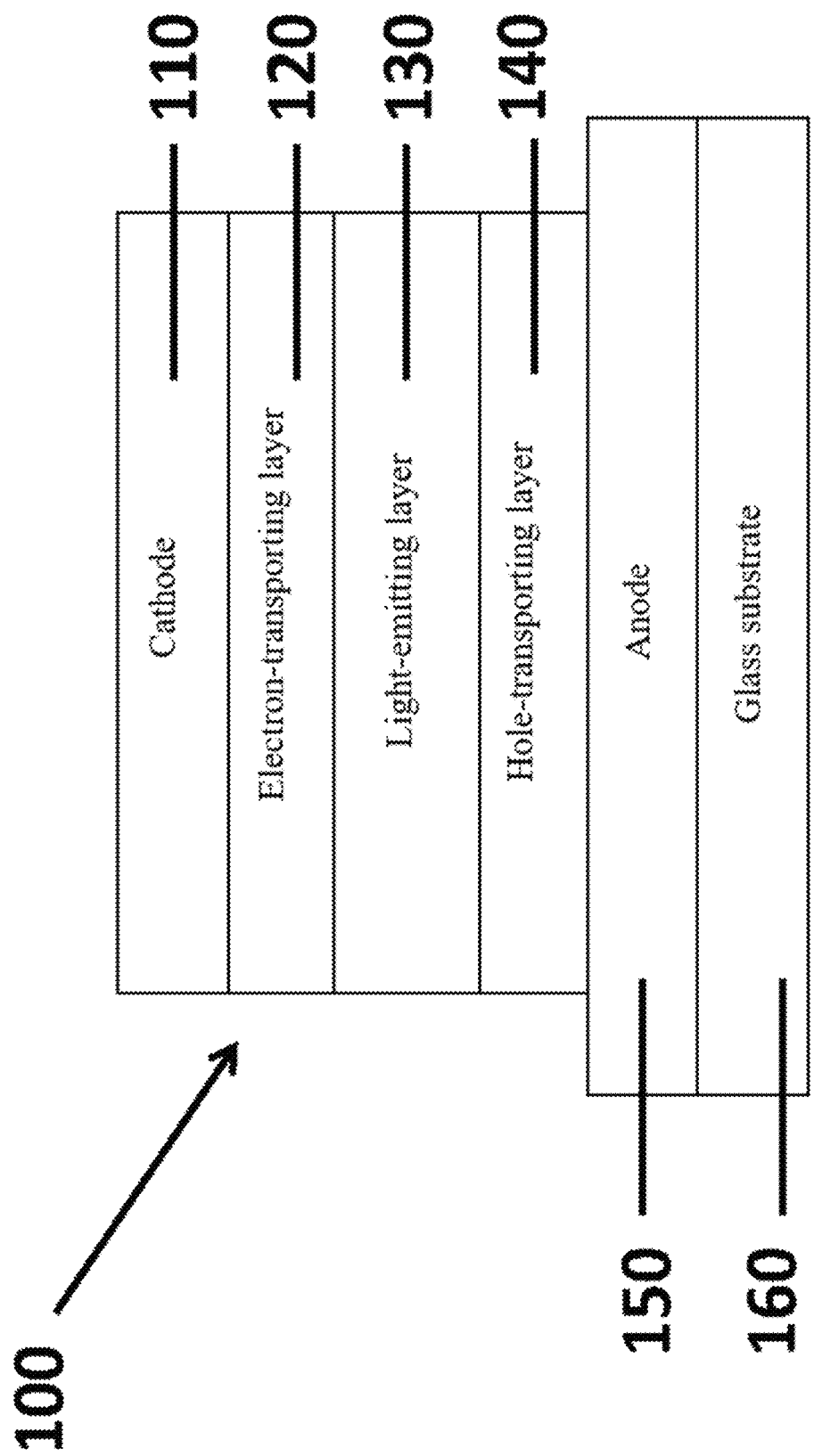
FIG. 1 is a schematic diagram of the basic structure of an organic EL device, in accordance with one or more embodiments herein.

The luminescent tetradentate ligand-containing gold(III) compounds can be used to form thin films by spin-coating, vacuum deposition or other known fabrication methods and be applied in OLEDs. With reference now to FIG. 1, the gold(III) compounds as in one or more embodiments herein can be fabricated into an OLED structure 100. The OLED structure 100 includes a cathode 110, an electron transport layer 120 ("ETL"), a light-emitting layer 130 (or "emissive layer"), a hole-transporting layer 140 ("HTL"), an anode 150, and a substrate 160. The light-emitting layer 130 includes a luminescent gold(III) compound as described herein. Although not shown in FIG. 1, in one or more embodiments, OLED 100 further includes a hole blocking layer and/or a carrier confinement layer to improve the device performance. Device structures with modifications to include various carrier blocking layers, carrier injection layers and interlayers can also be used to improve the device performance.

The cathode 110 and anode 150 are a pair of electrodes sandwiching these plurality of semiconductor layers that cause EL when voltage is applied to the OLED 100. The cathode 110 acts as a transmissive electron injector that injects electrons into the organic emissive layer 130 when the cathode is negatively biased. The cathode comprises a thin fluoride layer (which may be omitted) and a metal or metal alloy, preferably having a work function of less than 4 eV. The cathode 110 may be made of suitable materials such as, for example, Mg:Ag, Ca, Li:Al, Al, or Ba.

The anode 150 injects holes into the emissive layer when the anode is positively biased. The anode 150 is composed of a conductive and optionally transmissive layer. In one or more embodiments, viewing the emissive layer 130 through the substrate 160 is desirable, and the anode is transparent. In other embodiments, the emissive layer 130 is viewed through the top electrode and the transmissive characteristics of anode 150 are immaterial, and therefore any appropriate materials including metals or metal compounds having a work function of greater than 4.1 eV may be used. For example, appropriate metals include silver, gold, iridium, nickel, molybdenum, palladium, and platinum. In one or more embodiments, the anode 150 is transmissive, and suitable materials are metal oxides, including indium-tin oxide, aluminum- or indium-doped zinc oxide, tin oxide, magnesium-indium oxide, nickel-tungsten oxide, and cadmium-tin oxide. The preferred metals and metal oxides can be deposited by evaporation, sputtering, laser ablation, and chemical vapor deposition. The cathode 110 and anode 150 can have thicknesses between 100-200 nm.

In one or more embodiments, the anode 150 layer is positioned on top of a substrate 160. The substrate 160 is electrically insulated and is used to emit the light created by the OLED 100, in which it is typically made of transparent material. For example, the substrate 160 can be made of glass, plastic foil, or a transparent polymer. In one or more alternative embodiments, the substrate is opaque and comprises one or more semiconducting materials or ceramics. In one embodiment of the subject matter described herein, the emissive layer 130 is viewed through the substrate 160, or through both sides of the device, and substrate comprises a transparent glass substrate or a plastic foil. In other embodiments, the emissive layer 130 is viewed only through the top electrode, and substrate 160 comprises an opaque semiconductor or ceramic wafers.

The ETL 120 provides high electron affinity and high electron mobility to the OLED 100 for electrons to flow across the various OLED layers. To do this, the electron-transporting layer 120 includes materials or mixtures of materials having a high ionization potential and wide optical band gap. In one or more embodiments, the ETL 120 has a thickness between 30-80 nm. In one or more embodiments, additional electron transporting materials are added to ETL 120 to facilitate electron injection. The materials for the ETL 120 are selected to maximize OLED efficiency. As some non-limiting examples, suitable electron-transporting materials include but are not limited to 1,3,5-tris(phenyl-2-benzimidazolyl)-benzene (TPBI), 1,3,5-tri[(3-pyridyl)-phen-3-yl] benzene (TmPyPB), bathocuproine (BCP), bathophenanthroline (BPhen) and bis(2-methyl quinolinolate)-4-(phenylphenolate)aluminum (BAlq), tris-[2,4,6-trimethyl-3-(pyridin yl)phenyl]borane (3TPYMB), and 1,3-bis[3,5-di(pyridin-3-yl)phenyl]benzene (BmPyPhB). In one embodiment, the electron-transporting layer 120 is prepared as an organic film by thermal evaporation, spin-coating, ink-jet printing from a solution, or other known fabrication methods. Light-emitting layer or emissive layer 130 in FIG. 1 is formed by doping the phosphorescent gold(III) metal complex as a dopant into a host material. Suitable host materials should be selected so that the triplet excitons can be transferred efficiently from the host material to the phosphorescent dopant material. Suitable host materials include, but are not limited to, certain aryl amines, triazoles and carbazole compounds. Examples of desirable hosts include, but are not limited to, CBP, MCP, TCTA, 3-(4-biphenylyl)-4-phenyl-5-tert-butylphenyl-1,2,butylphenyl-1,2,4-triazole (TAZ), UGH2, and PVK. In certain embodiments, any one of the compounds 1 to 220 can be doped into a mixed host consisting of non-limiting examples of CBP, MCP, TCTA, TAZ, UGH2, PVK or a combination thereof.

In general, the emissive layer 130 is sandwiched between the hole-transporting layer 140 and the electron-transporting layer 120. To ensure an efficient exothermic energy transfer between the host material and the dopant material, the triplet energy of the host material must be larger than that of the dopant material. In addition, both the ionization potential and the electron affinity of the host material should be larger than those of the dopant material in order to achieve efficient Förster energy transfer from the host to the dopant. In order to confine triplet excitons within the emissive layer, the triplet energy of the hole-transporting material and electron-transporting material should be larger than that of the dopant material.

The HTL 140 is layered on top of the anode 150 and plays a role in the adjustment of electron/hole injection to attain transport balance of charge carriers in the emissive layer 130 of the OLED 100. In one or more embodiments, the HTL 140 has a thickness between 30-80 nm. The materials for the HTL 140 are selected to maximize OLED efficiency. As some non-limiting examples, the HTL 140 can include, but is not limited to, polycyclic aromatic compounds, for example, 4,4'-bis[N-(1-naphthyl)-N-phenylamino]biphenyl (NPB), 4,4'-bis[N-(3-methylphenyl)-N-phenylamino]biphenyl (TPD), 4,4',4''-tris[(3-methylphenyl)phenylamino] triphenylamine (MTDATA), and di-[4-(N,N-ditolyl-amino)phenyl]cyclohexane (TAPC). In addition, polymeric hole-transporting materials can be used, including PVK, polythiophene, polypyrrole, polyaniline, and copolymers including poly(3,4-ethylenedioxythiophene):poly(styrenesulfonate) (PEDOT:PSS).

In some embodiments of the subject matter described herein, luminescent gold(III) compounds are either the primary luminescent material or a secondary luminescent material in the device, as shown FIG. 1. In some embodiments of the subject matter described herein, the tetradentate ligand-containing gold(III) compounds are employed as electrophosphorescent dopants in multilayer OLED with an EQE of up to 20.6%. Advantageously, the tetradentate ligand-containing gold(III) compounds can be deposited in the OLEDs by spin-coating, screen printing, ink-jet printing and vacuum deposition. In addition, the incorporation of electron-transporting phosphine oxide moiety or its analogues helps to increase the overall device performance. The high solubility of the luminescent tetradentate ligand-containing gold(III) compounds in a variety of organic solvents permits simple and economic manufacturing and patterning of large-area displays.

In some embodiments of the subject matter described herein, the luminescent tetradentate ligand-containing gold (III) compounds of formula (I) are prepared in high purity. The synthetic method involves providing the luminescent tetradentate ligand-containing gold(III) compounds of formula (I) from the cyclometalated gold(III) precursor compounds or their equivalents. The gold(III) precursor compounds can be prepared by any methods known to those skilled in the art, for example, but are not limited to, the methods disclosed in Kröhnke, F. *Synthesis* 1 (1976); Wong, K. H.; Cheung, K. K.; Chan, M. C.; Che, C. M. *Organometallics*, 17, 5305 (1998); Yam, V W.-W.; Wong, K. M.-C.; Hung, L.-L.; Zhu, N. *Angew. Chem. Int. Ed.* 4, 3107 (205); Au, V.K.-M.; Wong, K.M.-C.; Zhu, N.; Yam, V W.-W. *Chem. Eur. J.* 17, 130 (2011); Roca, D.-A.; Smith, D. A.; Bochmann, M. *Chem. Commun.* 48, 7247 (2012); David, B.; Monkowius, U.; Rust, J.; Lehmann, C. W.; Hyzak, L.; Mohr, F. *Dalton Trans.* 43, 11059 (2014); Malty, A.; Sulicz, A. N.; Deligonul, N.; Zeler, M.; Hunter, A. D.; Gray, T. G. *Chem. Sci.* 6, 981 (2015); Kumar, R.; Linden, A.; Nevado, C. *Angew. Chem. Int. Ed.* 54, 14287 (2015).

In some parts of the subject matter described herein, the tetradentate ligand-containing gold(III) compounds can be further modified by incorporation of the substituents to the tetradentate ligand-containing gold(III) compounds.

In some parts of the subject matter described herein, purification can be carried out by any method or combination of methods, including chromatography, extraction, crystallization, sublimation or any combination thereof.

In one or more embodiments, the luminescent gold(III) compounds disclosed herein are deposited as a thin layer on a substrate layer. In one or more embodiments, the thickness of the deposited gold(III) compound is 10-20 nm, 21-30 nm, 31-40 nm, 41-50 nm, 51-60 nm, 61-70 nm, 71-80 nm, 81-90 nm, or 91-100 nm.

The present subject matter described herein will be illustrated more specifically by the following non-limiting examples, it being understood that changes and variations can be made therein without deviating from the scope and the spirit of the disclosure as hereinafter claimed. It is also understood that various theories as to why the disclosure works are not intended to be limiting.

6. EXAMPLES

The following are examples that illustrate embodiments for practicing the disclosure described herein. These examples should not be construed as limiting.

Example 1

Compounds 1-7 were prepared according to the following methodology as illustrated in Scheme 1. All the tetradentate ligand-containing gold(III) compounds were synthesized by the reaction of cyclometalated gold(III) precursor compounds or their equivalents with the corresponding heterocycles in the presence of a catalytic amount of palladium catalyst in base and organic solvent in one pot. For example, compound 1 was synthesized by stirring a mixture of [Au{C^(4-C$_6$H$_5$)C^NBr-6}Cl] (276 mg, 0.45 mmol) with 3,6-di-tert-butyl-1-(4,4,5,5-tetramethyl-1,3,2-dioxaborolan-2-yl)-9H-carbazole (138 mg, 0.45 mmol), palladium catalyst and base in degassed solvent at reflux temperature overnight (Scheme 1). After removing the solvent, the crude product was purified by dissolving in dichloromethane with slow diffusion of diethyl ether. The solid was then filtered and dried under vacuum to give a yellow solid (102 mg). NMR spectra were recorded on a Bruker AVANCE 500 or 600 (500 MHz, 600 MHz) Fourier-transform NMR spectrometer with chemical shifts reported relative to the tetramethylsilane (δ ppm). The results of the analyses confirm the high purity of all the compounds.

Scheme 1

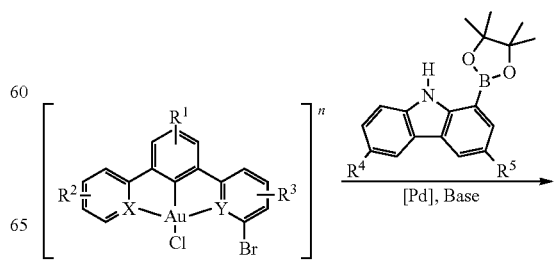

105
-continued
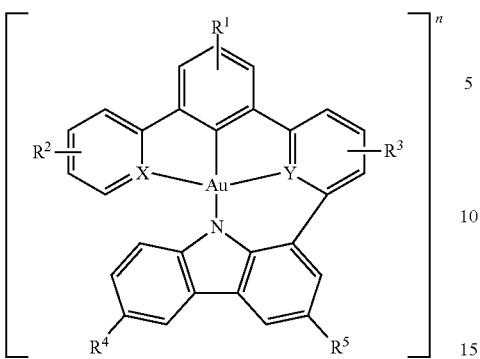
wherein:
Compound 1
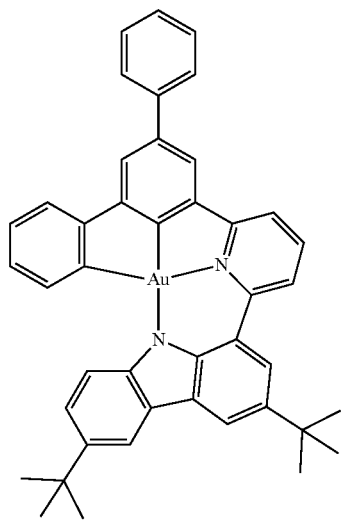
Compound 2
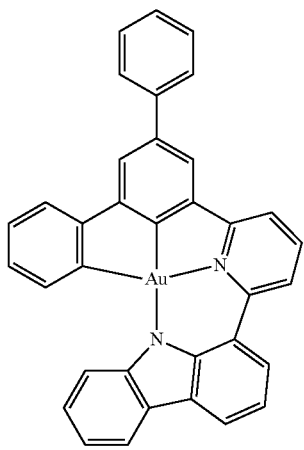
106
-continued
Compound 3
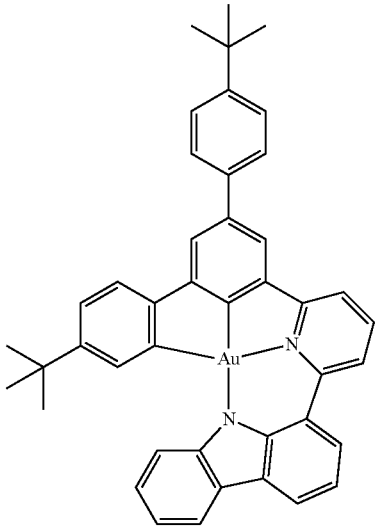
Compound 4
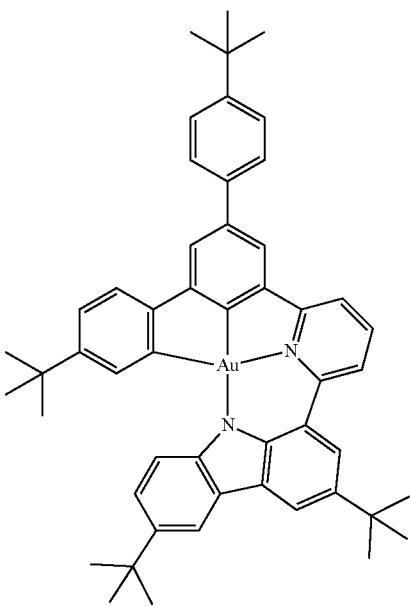

Compound 5

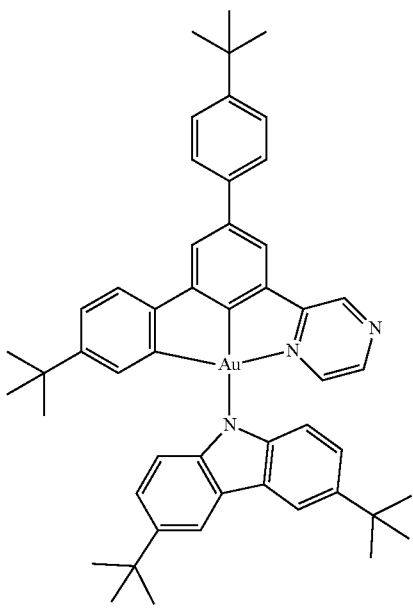

Compound 6

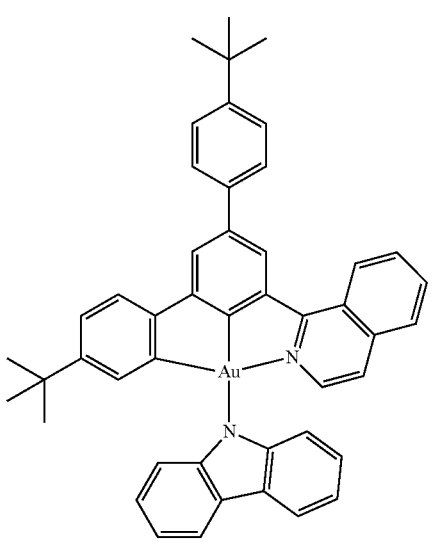

Compound 7

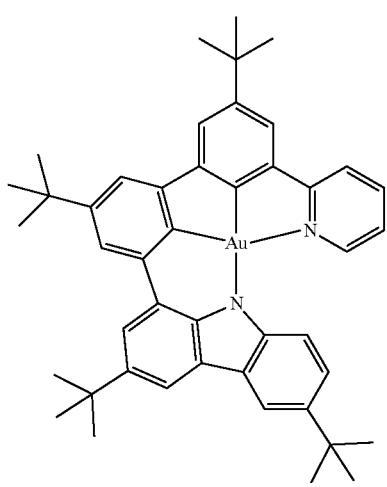

The characteristic spectroscopic properties of compounds 1-7 are as follows:

Compound 1: Yield: 102 mg, 89%. $^1$H NMR (500 MHz, CD$_2$Cl$_2$, 298 K, δ/ppm): δ8.42 (s, 1H), 8.35 (d, J=8.5 Hz, 1H), 8.22 (s, 1H), 8.16 (s, 1H), 7.94 (m, 1H), 7.85 (d, J=8.0 Hz, 1H), 7.80 (d, J=8.0 Hz, 1H), 7.66 (d, J=8.0 Hz, 1H), 7.51-7.31 (m, 9H), 7.23-7.18 (m, 1H), 7.00 (t, J=7.5 Hz, 1H), 1.53 (s, 18H). Positive ESI-MS: m/z 778.26 [M]$^+$.

Compound 2: Yield: 76 mg, 68%. $^1$H NMR (500 MHz, DMSO-d$_6$, 298 K, δ/ppm): δ8.86 (d, J=8.5 Hz, 1H), 8.55 (d, J=8.0 Hz, 1H), 8.50-8.42 (m, 3H), 8.29 (d, J=7.5 Hz, 1H), 8.20 (s, 1H), 7.98 (s, 1H), 7.91 (d, J=7.5 Hz, 2H), 7.86 (d, J=8.0 Hz, 1H), 7.83-7.79 (m, 2H), 7.58-7.53 (m, 2H), 7.48-7.35 (m, 3H), 7.30 (t, J=7.5 Hz, 1H), 7.22 (t, J=7.5 Hz, 1H), 7.07 (t, J=7.5 Hz, 1H).

Compound 3: Yield: 54 mg, 77%. $^1$H NMR (500 MHz, THF-d8, 298 K, δ/ppm): δ8.65 (d, J=8.5 Hz, 1H), 8.37 (d, J=7.5 Hz, 1H), 8.30 (d, J=8.0 Hz, 1H), 8.24-8.17 (m, 2H), 8.11 (d, J=7.5 Hz, 1H), 8.01-7.96 (m, 2H), 7.82 (s, 1H), 7.68 (s, 1H), 7.64 (d, J=7.5 Hz, 2H), 7.52-7.47 (m, 3H), 7.36-7.31 (m, 1H), 7.30-7.25 (m, 2H), 7.19-7.15 (m, 1H), 1.40 (s, 9H) 1.27 (s, 9H).

Compound 4: Yield: 72 mg, 81%. $^1$H NMR (500 MHz, THF-d$_8$, 298 K, δ/ppm): δ8.64 (d, J=8.0 Hz, 1H), 8.51 (d, J=1.6 Hz, 1H), 8.30 (s, 1H), 8.27 (d, J=1.6 Hz, 1H), 8.25-8.19 (m, 1H), 8.09 (d, J=8.0 Hz, 1H), 8.00 (d, J=1.6 Hz, 1H), 7.89 (d, J=8.4 Hz, 1H), 7.84 (s, 1H), 7.70-7.62 (m, 3H), 7.55-7.47 (m, 4H), 7.29 (dd, J=8.0 and 1.6 Hz, 1H), 1.62 (s, 9H), 1.54 (s, 9H), 1.43 (s, 9H), 1.31 (s, 9H). Positive ESI-MS: ink 890.38 [M]$^+$.

Compound 5: Yield: 69 mg, 71%. $^1$H NMR (500 MHz, CDCl$_3$, 298 K, δ/ppm): δ9.87 (s, 1H), 9.06 (s, 1H), 8.52 (s, 1H), 8.34 (s, 1H), 8.22 (s, 1H), 8.04 (s, 1H), 7.99-7.97 (d, J=8.6 Hz, 1H), 7.69 (s, 1H), 7.61-7.58 (m, 3H), 7.54-7.52 (d, J=8.2 Hz, 2H), 7.50-7.49 (d, J=8.0 Hz, 1H), 7.44-7.42 (d, J=7.4 Hz, 1H), 7.31-7.29 (d, J=7.9 Hz, 1H), 1.59 (s, 9H), 1.50 (s, 9H), 1.41 (s, 9H), 1.30 (s, 9H).

Compound 6: Yield: 32 mg, 59%. $^1$H NMR (500 MHz, CDCl3, 298 K, δ/ppm): δ8.73-8.70 (d, J=8.7 Hz, 1H), 8.37 (s, 1H), 8.29-8.27 (d, J=7.4 Hz, 1H), 8.21-8.19 (d, J=7.6 Hz, 1H), 7.96 (s, 1H), 7.92-7.90 (d, J=7.7 Hz, 1H), 7.84-7.82 (d, J=8.1 Hz, 1H), 7.79-7.77 (d, J=8.2 Hz, 1H), 7.72-7.68 (m, 2H), 7.53-7.49 (m, 1H), 7.41-7.39 (m, 2H), 7.37-7.32 (m, 4H), 7.24-7.21 (m, 4H), 1.40 (s, 9H), 1.20 (s, 9H).

Compound 7: Yield: 31 mg, 61%. $^1$H NMR (500 MHz, Acetone-d6, 298 K, δ/ppm): δ9.37-9.35 (d, J=5.4 Hz, 1H), 8.43-8.41 (d, J=7.9 Hz, 1H), 8.31-8.27 (m, 4H), 8.17 (s, 1H), 7.88-7.86 (d, J=11.1 Hz, 2H), 7.81-7.79 (m, 2H), 7.68-7.66 (t,J=6.4 Hz, 1H), 7.45-7.43 (dd, J=8.5 and 1.5 Hz, 1H), 1.56 (s, 9H), 1.51 (s, 9H), 1.47 (s, 9H), 1.47 (s, 9H).

Example 2

UV-Vis Absorption Properties

Figure 2:
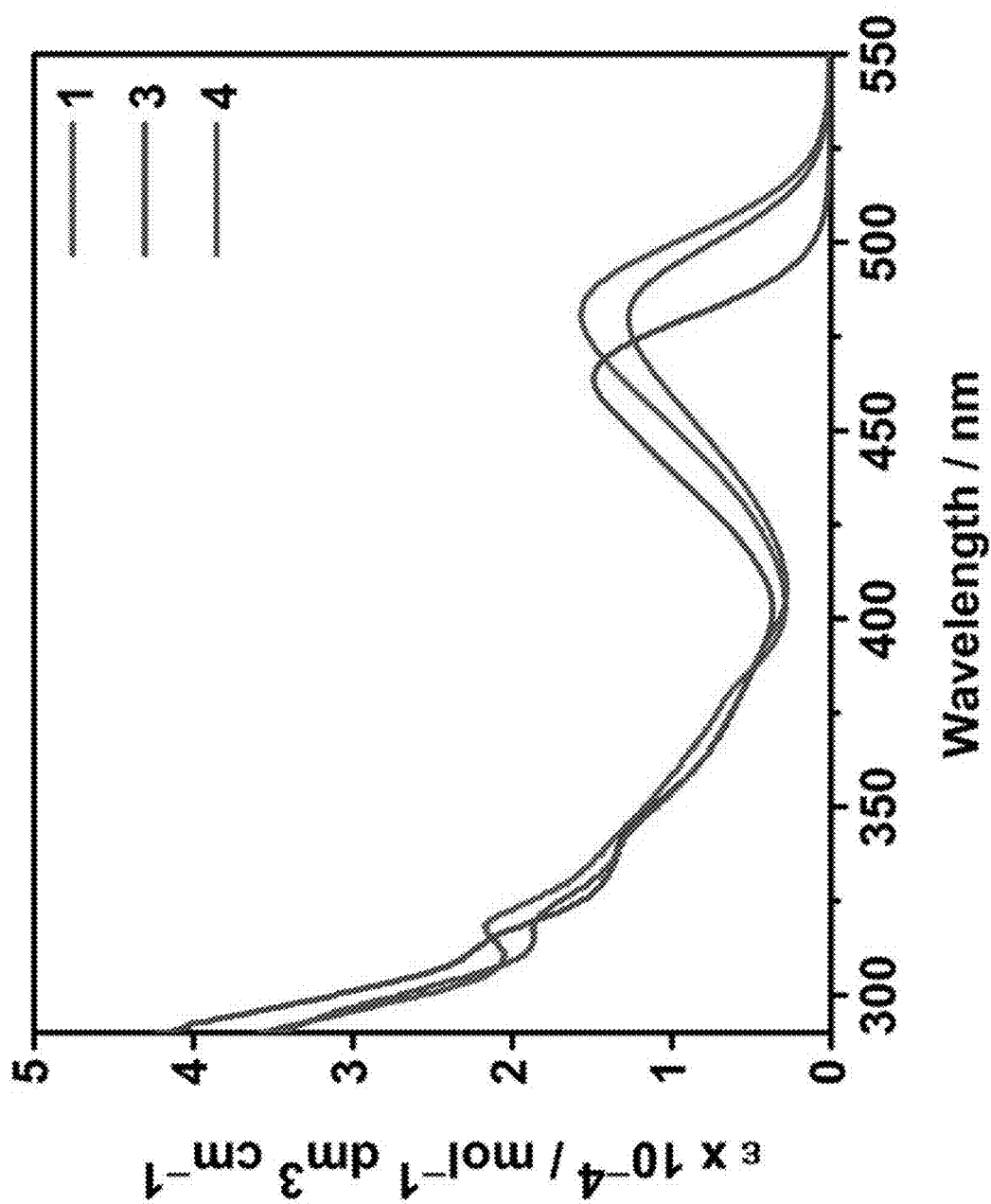
FIG. 2 shows the UV-visible absorption spectra of compounds 1, 3 and 4 in toluene at 298 K, in accordance with one or more embodiments herein.

The UV-vis absorption spectra of compounds 1, 3 and 4 in toluene solution at 298 K feature moderately intense vibronic-structured absorption bands at ca. 280-350 nm with extinction coefficients (ε) on the order of $10^4$ dm$^3$ mol$^{-1}$ cm$^{-1}$ (FIG. 2). These absorption bands are tentatively assigned as the intraligand (IL) [π→π*] transitions of the cyclometalating ligand and the carbazole moiety. On the other hand, broad and moderately intense structureless absorption bands at ca. 410-530 nm have been observed for all the complexes. These absorption bands are tentatively assigned as a mixture of metal-perturbed IL [π→π*] transitions of the cyclometalating ligands with some charge transfer character from the aryl ring to the pyridine unit and the IL charge transfer (ILCT) [π(carbazole)→π*(pyridine)] transitions. A metal-to-ligand charge transfer transition (MLCT) would not be likely due to the non-reducing nature of the gold(III) center to achieve Au(IV) higher oxidation state. The UV-vis absorption data of compounds 1, 3 and 4 in toluene solution at 298 K are summarized in TABLE 1.

TABLE 1

Photophysical data for compounds 1-4[a]

| Compound | Medium (T/K) | Absorption $\lambda_{max}$/nm ($\varepsilon_{max}$/dm³mol⁻¹cm⁻¹) | Emission $\lambda_{max}$/nm ($\tau_o$/μs) | $\Phi_{sol}$[b] | $\Phi_{film}$[c] |
|---|---|---|---|---|---|
| 1 | Toluene (298) | 318 (21590), 379 (6590), 480 (15670) | 554 (2.9) | 0.07 | 0.66 |
| 2 | — | — | 540 | — | 0.53[d] |
| 3 | Toluene (298) | 314 (21670), 345 (12500), 465 (14855) | 528 (2.5) | 0.04 | 0.55 |
| 4 | Toluene (298) | 320 (18535), 343 (12645), 482 (12640) | 549 (2.0) | 0.05 | 0.49 |

[a]Compound 2 is only sparingly soluble in toluene at 298K.
[b]The luminescence quantum yield, measured at room temperature using [Ru(bpy)₃Cl₂] in acetonitrile as the reference (excitation wavelength = 436 nm, $\Phi_{lum}$ = 0.06).
[c]$\Phi_{film}$ of gold(III) compound doped into 10% MCP excited at wavelength of 320 nm.
[d]$\Phi_{film}$ of gold(III) compound doped into 10% mCBP excited at wavelength of 320 nm.

Example 3

Emission Properties and Thermal Stabilities

Figure 3:
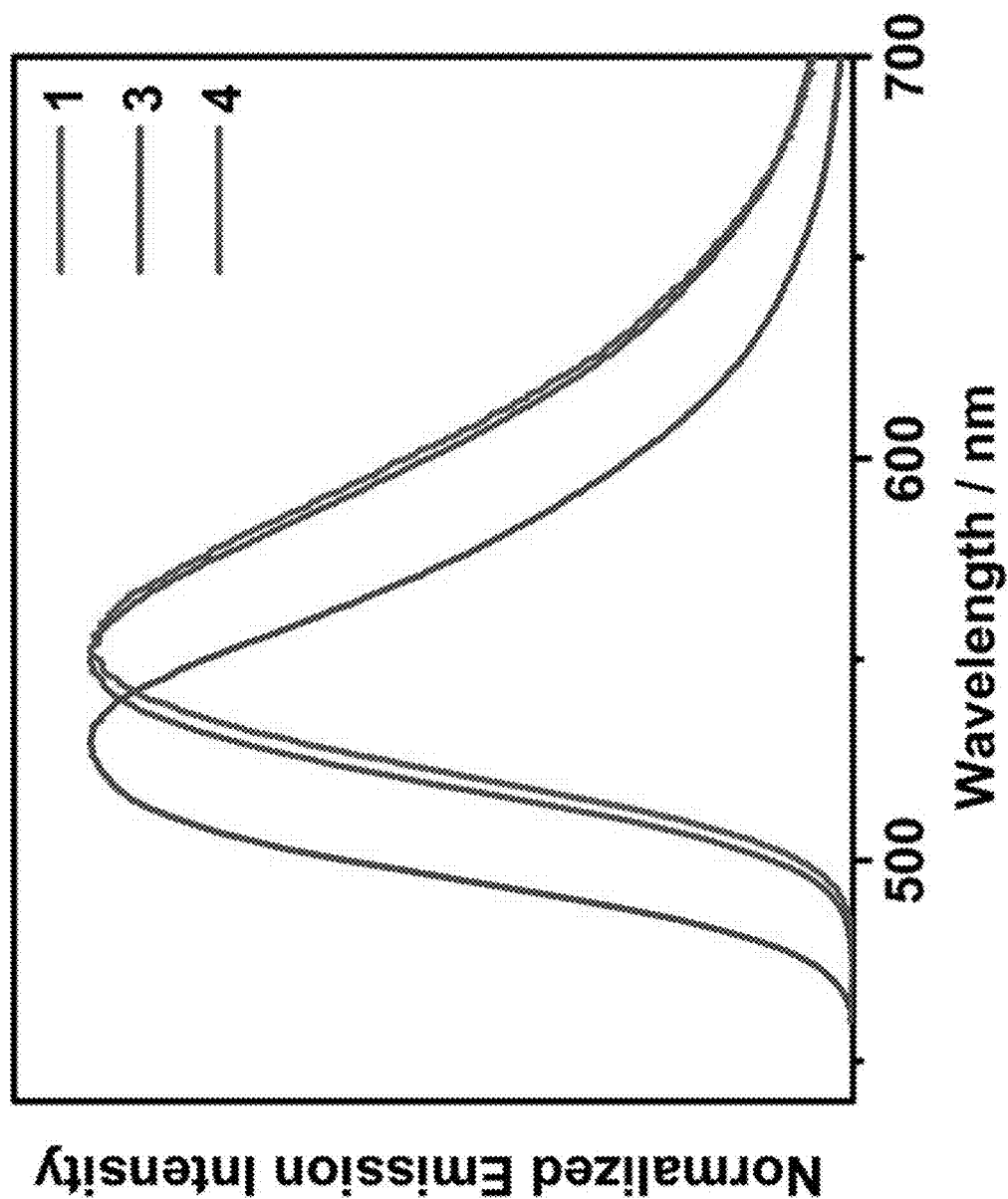
FIG. 3 shows the normalized photoluminescence (PL) spectra of compounds 1, 3 and 4 in toluene at 298 K, in accordance with one or more embodiments herein.

Upon irradiation, compounds 1, 3 and 4 display luminescence at ca. 528-554 nm with respectable PLQYs in both solution and solid-state thin films at room temperature (TABLE 1). The emission spectra of compounds 1, 3 and 4 in degassed toluene solution are shown in FIG. 3. Upon excitation at λ=436 nm in toluene solution at 298 K, broad structureless emission bands have been observed for all complexes. These emission bands are tentatively assigned as the ³ILCT [π(carbazole)→π*(pyridine)] transition. FIG. 4 shows the normalized emission spectra of thin films of compounds 1, 3, 4 and 7 doped in 10 wt % MCP at 298 K. The origins of these broad and structureless emission bands are tentatively assigned as the ³ILCT [π(carbazole)→π* (pyridine)] transition, possibly with mixing of some excimeric emission. The assignments can be further supported by their emission energies upon varying the dopant concentrations in MCP thin films. The emission bands of compound 1 doped in 5 wt % to 20 wt % MCP at 298 K are found to be red-shifted with increasing dopant concentration, which is characteristic of excimeric emission arising from the π-π stacking of the cyclometalating tetradentate ligand (FIG. 5 and TABLE 2). TGA have also be conducted for compounds 1-4. All of them exhibit high decomposition temperature (i.e. the temperature at which the material shows a 5% weight loss) of over 350 degree C. (FIGS. 6-9).

TABLE 2

Photophysical data for compound 1 doped in MCP thin film at 298K

| Dopant Concentration/wt % | Emission $\lambda_{max}$/nm | $\Phi_{film}$[a] |
|---|---|---|
| 5 | 541 | 0.64 |
| 10 | 551 | 0.66 |
| 15 | 555 | 0.61 |
| 20 | 560 | 0.51 |

[a]$\Phi_{film}$ of gold(III) compound excited at wavelength of 320 nm.

Example 4

OLED Fabrication and Characterization

A solution-processable OLED according to an embodiment of the disclosure was constructed in the following manner:

a) A transparent anode ITO-coated borosilicate glass substrate (38 mm×38 mm) with sheet resistance of 30Ω per square was ultrasonicated in the commercial detergent Decon 90, rinsed in deionized water having a resistivity of 18.2 Mega-ohm for 15 minutes, and then dried in an oven at 120 degree C. for an hour. The substrate was next subjected to an UV-ozone treatment in a Jelight 42-220 UVO-Cleaner equipped with a mercury grid lamp for 15 minutes in order to increase the work function of the ITO-coated glass substrate for better hole injection into the organic layer.

b) A 40-nm thick PEDOT:PSS hole-transporting layer was spin-coated by using a Laurell WS-400Ez-6NPP-Lit2 single wafer spin processor at 7000 rpm for 30 seconds onto the ITO-coated glass substrate of step (a) and baked at 110 degree C. for 10 minutes in air.

c) A 30-nm thick light-emitting layer was spin-coated by using a Laurell WS-400Ez-6NPP-Lit2 single wafer spin processor at 6000 rpm for 25 seconds onto PEDOT:PSS layer of step (b), and baked at 80 degree C. for 10 minutes in air, in which compound 1 was doped into light-emitting MCP layer at different concentrations in the range from 5 to 20 wt %;

d) The substrate was put into a vacuum chamber, and the chamber was pumped down from 1 bar to 5×10⁻⁶ mbar;

e) A 5-nm thick 3TPYMB hole blocking layer was deposited by thermal evaporation on doped MCP light-emitting layer of step (c).

f) A 30-nm TmPyPB electron-transporting layer was deposited by thermal evaporation on the 3TPYMB layer of step (e).

g) A 0.8-nm thick LiF layer and a 80 nm thick Al layer were deposited by thermal evaporation on the TmPyPB layer of step (f) to form an electron-injecting cathode.

3TPYMB, TmPyPB, LiF and Al were prepared by thermal evaporation from tantalum boats by applying current through the tantalum boats. Deposition rates were monitored with a quartz oscillation crystal and a Sigma SQM-242 quartz crystal card and controlled at 0.1-0.2 nm s⁻¹ for both organic and metal layers. Current density-voltage-luminance characteristics of organic EL devices were measured with a programmable Keithley model 2400 power source and a Spectrascan PR-655 colorimeter under ambient air conditions.

As depicted in FIG. 10, the EL spectra for all the devices are almost identical to their emission spectra in solution and solid-state thin films without any undesirable emission coming from the adjacent carrier-transporting layers or the host materials. With increasing the dopant concentration, the peak maximum has been slightly red-shifted from 544 nm to 556 nm, which is arising from the excimeric emission arising from the π-π stacking of the cyclometalating tetradentate ligand, in good agreement with the emission spectra of 1 in solid-state thin films. In addition, the optimized device doped with 15 wt % compound 1 demonstrates a high EQE of 6.7%, as shown in FIG. 11.

Example 5

The same materials and processing procedures were employed as described in Example 4 except that compound 3 was doped into MCP as light emissive layer. All the devices show a structureless green emission band with band maximum at 520 nm (FIG. 12). Notably, a smaller red shift of ~290 $cm^{-1}$ is observed, as compared to that for devices based on 1 (~397 $cm^{-1}$). Meanwhile, the optimized devices exhibit EQEs of up to 3.7% (FIG. 13).

Example 6

The same materials and processing procedures were employed as described in Example 4 except that compound 4 was doped into MCP as light emissive layer. All the devices show a structureless green emission band with band maximum at 544 nm and the EL maximum remains almost unchanged upon increasing the dopant concentration from 5 wt % to 20 wt % (FIG. 14). Meanwhile, the optimized devices exhibit EQEs of up to 7.4% (FIG. 15).

Example 7

A vacuum-deposited OLED according to an embodiment of the disclosure was constructed in the following manner:
  a) A transparent anode ITO-coated borosilicate glass substrate (38 mm×38 mm) with sheet resistance of 30Ω per square was ultrasonicated in the commercial detergent Decon 90, rinsed in deionized water having a resistivity of 18.2 Mega-ohm for 15 minutes, and then dried in an oven at 120 degree C. for an hour. The substrate was next subjected to an UV-ozone treatment in a Jelight 42-220 UVO-Cleaner equipped with a mercury grid lamp for 15 minutes in order to increase the work function of the ITO-coated glass substrate for better hole injection into the organic layer.
  b) The substrate was put into a vacuum chamber, and the chamber was pumped down from 1 bar to $5 \times 10^{-6}$ mbar;
  c) A 40-nm thick N,N'-bis(naphthalen-1-yl)-N,N'-bis(phenyl)-2,2'-dimethylbenzidine (α-NPD) hole-transporting layer was deposited by thermal evaporation onto the ITO-coated glass substrate of step (a);
  d) A 5-nm thick TCTA carrier confinement layer was deposited by thermal evaporation onto the α-NPD of step (c);
  e) A 20-nm thick light-emitting layer was deposited by thermal evaporation onto the TCTA layer of step (d), in which 2, 5, 8, 11, and 14% compound 1 was doped into light-emitting 3,3'-di(9H-carbazol-9-yl)biphenyl (mCBP) layer;
  f) A 50-nm thick 1,3,5-tris(6-(3-(pyridin-3-yl)phenyl) pyridine-2-yl)benzene (Tm3PyP26PyB) electron-transporting layer was deposited by thermal evaporation on doped mCBP light-emitting layer of step (e).
  g) A 1-nm thick LiF layer and a 150-nm thick Al layer were deposited by thermal evaporation on the Tm3PyP26PyB layer of step (f) to form an electron-injecting cathode.

All materials were prepared by thermal evaporation from tantalum boats by applying current through the tantalum boats. Deposition rates were monitored with a quartz oscillation crystal and a Sigma SQM-242 quartz crystal card and controlled at 0.1-0.2 nm $s^{-1}$ for both organic and metal layers. Current density-voltage-luminance characteristics of organic EL devices were measured with a programmable Keithley model 2400 power source and a Spectrascan PR-655 colorimeter under ambient air conditions.

FIG. 14 depicts the EQEs of the vacuum-deposited devices based on compound 1. Notably, high current efficiencies of 40.9 cd $A^{-1}$ and high EQEs of up to 13.1% can be realized for the optimized device doped with 8 wt % compound 1 (FIG. 16).

Example 8

The same materials and processing procedures were employed as described in Example 7 except that compound 2 was doped into mCBP as light emissive layer. The optimized devices doped with 5 wt % compound 2 exhibit high EQEs of 11.5% (FIG. 17).

Example 9

The same materials and processing procedures were employed as described in Example 7 except that compound 3 was doped into mCBP as light emissive layer. The optimized devices doped with 29 wt % compound 3 exhibit high EQEs of 15.2% (FIG. 18).

Example 10

The same materials and processing procedures were employed as described in Example 7 except that compound 4 was doped into mCBP as light emissive layer. The optimized devices doped with 5 wt % compound 4 exhibit high EQEs of 20.6% (FIG. 19).

Example 11

OLED Lifetime Measurement
A vacuum-deposited OLED according to an embodiment of the disclosure was constructed in the following manner:
  a) A transparent anode ITO-coated borosilicate glass substrate (38 mm×38 mm) with sheet resistance of 30Ω per square was ultrasonicated in the commercial detergent Decon 90, rinsed in deionized water having a resistivity of 18.2 Mega-ohm for 15 minutes, and then dried in an oven at 120 degree C. for an hour. The substrate was next subjected to an UV-ozone treatment in a Jelight 42-220 UVO-Cleaner equipped with a mercury grid lamp for 15 minutes in order to increase the work function of the ITO-coated glass substrate for better hole injection into the organic layer.
  b) The substrate was put into a vacuum chamber, and the chamber was pumped down from 1 bar to $5 \times 10^{-6}$ mbar;
  c) A 10-nm thick dipyrazino[2,31:2',3'-h]quinoxaline-2,3, 6,7,10,11-hexacarbonitrile (HATCN) hole-injection layer was deposited by thermal evaporation onto the ITO-coated glass substrate of step (a);
  d) A 40-nm thick α-NPD hole-transporting layer was deposited by thermal evaporation onto the HATCN of step (c);
  e) A 10-nm thick 9,9',9"-triphenyl-9H,9'H,9"H-3,3':6',3"-tercarbazole (TrisPCz) carrier confinement layer was deposited by thermal evaporation onto the α-NPD of step (d);

f) A 40-nm thick light-emitting layer was deposited by thermal evaporation onto the TrisPCz layer of step (e), in which 11% compound 1 was doped into light-emitting 2,6-di(9H-carbazol-9-yl)pyridine (PYD-2Cz) layer;

g) A 10-nm thick 2,4,6-tris[3-(diphenylphosphinyl)phenyl]-1,3,5-triazine (T2T) hole-blocking layer was deposited by thermal evaporation onto the doped PYD-2Cz layer of step (f);

h) A 40-nm thick 2,7-di(2,2'-bipyridin-5-yl)triphenylene (BPyTP2) electron-transporting layer was deposited by thermal evaporation on T2T layer of step (g);

i) A 1-nm thick LiF layer and a 150-nm thick Al layer were deposited by thermal evaporation on the BPyTP2 layer of step (h) to form an electron-injecting cathode.

All materials were prepared by thermal evaporation from tantalum boats by applying current through the tantalum boats. Deposition rates were monitored with a quartz oscillation crystal and a Sigma SQM-242 quartz crystal card and controlled at 0.1-0.2 nm s$^{-1}$ for both organic and metal layers. Devices were encapsulated in a glovebox under nitrogen. The operational lifetime of the vacuum-deposited device was measured by McScience OLED Lifetime Measurement System by accelerated lifetime testing under a constant driving current density of 10 mA cm$^{-2}$ under ambient conditions.

Example 12

The same materials and processing procedures were employed as described in Example 10 except that compound 4 was doped into PYD-2Cz as light emissive layer.

FIG. 20 depicts the relative luminance of devices as a function of time. Apparently, device based on compound 1 demonstrates a longer lifetime. Particularly, the estimated lifetime at $LT_{70}$ (i.e. the time required for the luminance to drop to 70% of its initial value) of device based on compound 1 is ~11,060 hours and that for device based on compound 4 is ~5250 hours. In addition, the estimated half-lifetime of device based on 1 is ~29,740 hours. The shorter operational lifetime of device based on compound 4 may be due to the formation of instable methyl radicals.

Throughout the specification, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. Similarly, the phrase "one or more embodiments" as used herein does not necessarily refer to the same embodiment and the phrase "at least one embodiment" as used herein does not necessarily refer to a different embodiment. The intention is, for example, that claimed subject matter includes combinations of example embodiments in whole or in part.

Example 13

The vacuum-deposited thin films of 11 v/v% 1, 3 and 4 doped in m-CBP have been investigated by angular-dependent PL measurements. The orientation order parameter (S) has been used to quantify the degree of molecular orientation, where S=0 is associated with a random molecular orientation and varies from S=−0.5 for perfect horizontal orientation to S=+1.0 for vertically-aligned molecules. FIG. 21 depicts the normalized PL intensities as a function of the emission angle for the thin films, while FIG. 22 depicts the two-dimensional distribution of the emission spectra vs the angle of the films, controlled by the automated rotating stage. The incorporation of $^t$Bu- groups onto the phenyl rings in 3 and 4 yields negative values of S=−0.31 and S=−0.30, respectively, in contrast to the positive values of S=+0.10 in the absence of such $^t$Bu- groups in 1. This implies a preferential horizontal orientation of 3 and 4, and a slightly vertical orientation of 1 in the films. Given that θ is the angle between the normal of a substrate and transition dipole moment, S=−0.31, S=−0.30 and S=+0.10 correspond to the horizontal transition dipole (Θ) of 0.87, 0.87 and 0.60, respectively. TABLE 3 summarizes the molecular orientation parameters of 1, 3 and 4. It is worth noting that the Θ value of 0.87 represents one of the highest values in the reported literature among both the phosphorescent and TADF emitters, which also reinforces our molecular design that the restricted rotation of the carbazolyl moiety in the tetradentate ligand would give a preferred molecular orientation. Thus, an understanding of the structure-property relationship of this class of complexes would lead to the identification of potential candidates with high Θ in thin films to improve the out-coupling efficiency in OLEDs.

TABLE 3

Molecular orientation parameters of 1, 3 and 4

| Complex | Order Parameter (S) | θ$^a$/° | Θ$^b$ | (h:v)$^b$ |
| --- | --- | --- | --- | --- |
| 1 | +0.10 | 50.8 | 0.60 | 0.60:0.40 |
| 3 | −0.31 | 69.2 | 0.87 | 0.87:0.13 |
| 4 | −0.30 | 68.6 | 0.87 | 0.87:0.13 |

$^a$θ represents the angle between the normal of a substrate and the transition dipole moment vector and is calculated by the equation $S = \frac{1}{2}\langle 3\cos^2\theta - 1\rangle$, with $\langle \ldots \rangle$ indicating an ensemble average.

$^b$Θ represents the ratio of the horizontal dipole to the total dipole of the emitters and is obtained by the equation Θ:(1 − Θ) = $\langle\sin^2\theta\rangle$ : $\langle\cos^2\theta\rangle$ = h:v.

Example 14

Table 2 shows performance data of vacuum-deposited OLEDs based on Compounds 1, 2, and 4 measured at 1000 cd/m$^2$.

TABLE 2

| Compound | Max. EQE (%) | EQE (%) at 1000 cd/m$^2$ |
| --- | --- | --- |
| 1 | 13.1 | 7.0 |
| 2 | 11.5 | 6.1 |
| 4 | 20.6 | 13.4 |

| Compound | $LT_{70}$ (Hours) at 1000 cd/m$^2$ | $LT_{50}$ (Hours) at 1000 cd/m$^2$ |
| --- | --- | --- |
| 1 | 221 | 593 |
| 4 | 105 | 189 |

TABLE 3

|  | Compound 1 | Compound 2 | Compound 4 |
|---|---|---|---|
| Type | Dopant | Dopant | Dopant |
| Deposition process and weight % | Vacuum - 8 wt % | Vacuum - 5 wt % | Vacuum - 8 wt % |
| CIE Color at 1,000 cd/m$^2$ | 0.45, 0.54 | 0.32, 0.60 | 0.41, 0.57 |
| Efficiency roll-off at 1,000 cd/m$^2$, % | 52 | 49 | 45 |
| Decomposition temperature $T_d$, °C | 398 | 360 | 354 |

TABLE 4

| Compound | (maximum Brightness) L [cd m$^{-2}$]$^a$ | CE [cd A$^{-1}$]$^b$ | | PE [lm W$^{-1}$]$^c$ | | EQE [%]$^d$ | | CIE [(x, y)]$^e$ |
|---|---|---|---|---|---|---|---|---|
| | | Max | at 1000 cd m$^{-2}$ | Max | at 1000 cd m$^{-2}$ | Max | at 1000 cd m$^{-2}$ | |
| 1 | 27,330 | 40.9 | 19.5 | 42.8 | 11.4 | 13.1 | 5.9 | 0.45, 0.54 |
| | Vacuum-deposited | | | | | | | |
| 2 | 13,410 | 39.6 | 19.7 | 35.5 | 13.0 | 11.5 | 5.8 | 0.32, 0.60 |
| | Vacuum-deposited | | | | | | | |
| 4 | 31,210 | 73.7 | 41.1 | 66.2 | 26.1 | 20.6 | 11.2 | 0.41, 0.57 |
| | Vacuum-deposited | | | | | | | |

Example 15

Amount Breakdown for Synthesizing 1 g of Au(III) Complex 1

Table 5 shows chemicals used for the synthesis of 3.3 g precursor ligand.

TABLE 5

| Chemicals | Amount Used |
|---|---|
| Carbazole | 2.0 g |
| tert-butylchloride | 4.9 mL |
| Aluminium chloride | 4.8 g |
| N-bromosuccinimide | 1.8 g |
| Bis(pinacolato)diboron | 5.6 g |
| Bis(triphenylphosphine) palladium(II) dichloride | 25 mg |
| Sodium Acetate | 2.7 g |
| Dichloromethane | 20 mL |
| Toluene | 50 mL |
| 1,4-dioxane | 50 mL |
| Silica gel | 1.25 kg |

Table 6 shows chemicals used for the synthesis of 2.1 g Au(III) precursor complex.

TABLE 6

| Chemicals | Amount Used |
|---|---|
| [1,1':3',1''-terphenyl]-5'-ylboronic acid | 1.2 g |
| 2,6-dibromopyridine | 1 g |
| Mecuric acetate | 1.4 g |
| Gold(III) potassium tetrachloride | 1.3 g |
| Acetonitrile | 10 mL |
| Dichloroethane | 20 mL |
| Silica gel | 1.25 kg |

Table 7 shows chemicals used for the synthesis of 1 g Au(III) complex 1.

TABLE 7

| Chemicals | Amount Used |
|---|---|
| Precursor ligand[1] | 1.4 g |
| Au(III) precursor complex[2] | 2.1 g |
| Bis(triphenylphosphine)palladium(II) dichloride | 72 mg |
| Potassium carbonate | 2.76 g |
| Tetrahydrofuran | 50 mL |
| Diethyl Ether | 50 mL |

The foregoing description of the specific embodiments will so fully reveal the general nature of the disclosure that others can, by applying knowledge within the skill of the relevant art(s) (including the contents of the documents cited and incorporated by reference herein), readily modify and/or adapt for various applications such specific embodiments, without undue experimentation, without departing from the general concept of the present disclosure. Such adaptations and modifications are therefore intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one skilled in the relevant art(s).

While various embodiments of the present disclosure have been described above, it should be understood that they have been presented by way of examples, and not limitation. It would be apparent to one skilled in the relevant art(s) that various changes in form and detail could be made therein without departing from the spirit and scope of the disclosure. Thus, the present disclosure should not be limited by any of the above-described exemplary embodiments, but should be defined only in accordance with the following claims and their equivalents.

What is claimed:

1. A method for preparing a luminescent compound with cyclometalated tetradentate ligand comprising the step of:

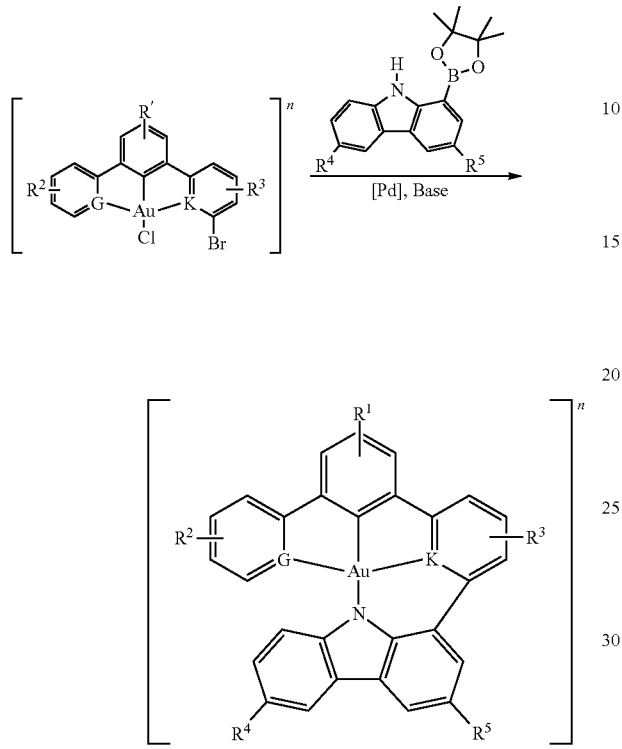

wherein:
(a) G and K are different from each other and independently selected from the group consisting of C and N;
(b) $R^1$, $R^2$, $R^3$, $R^4$ and $R^5$ groups are each independently selected from the group consisting of OR, $NR_2$, SR, C(O)R, C(O)OR, C(0)$NR_2$, CN, $CF_3$, $NO_2$, $SO_2$, SOR, $SO_2R$, $SO_3R$, halo alkyl, alkenyl, alkynyl, alkylaryl, aryl and cycloalkyl wherein one or more alkyl, alkenyl, alkynyl, alkylaryl, aryl or cycloalkyl is optionally substituted with one or more OR, $NR_2$, SR, C(O)R, C(O)OR, C(O)$NR_2$, CN, $CF_3$, $NO_2$, $SO_2$, SOR, $SO_2R$, $SO_3R$, halo, aryl, substituted aryl, heteroaryl, substituted heteroaryl or a heterocyclic group, wherein R is independently at each occurrence alkyl, alkynyl, alkylaryl, aryl or cycloalkyl; and
(c) n is zero, a positive integer or a negative integer.

2. The method according to claim 1, wherein the gold(III) metal center comprises a light-emitting layer of a light-emitting device.

3. The method according to claim 1, wherein the gold(III) metal group comprises a layer of a light-emitting device.

4. The gold(III) compound according to claim 1, wherein the gold(III) metal compound is a dopant included in the light-emitting layer or emissive layer of the light-emitting device.

5. The method according to claim 1, wherein the gold(III) metal compound is a dopant included in a light-emitting device.

6. The method according to claim 1, wherein the luminescent compound with cyclometalated tetradentate ligand comprises:

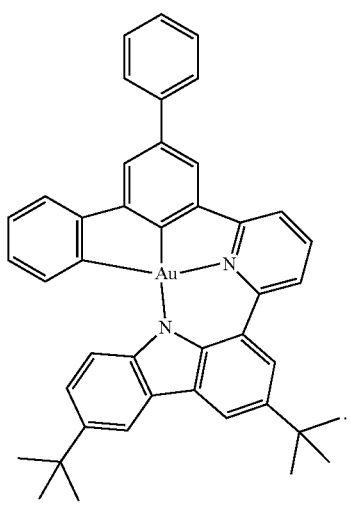

7. The method according to claim 1, wherein the luminescent compound with cyclometalated tetradentate ligand comprises:

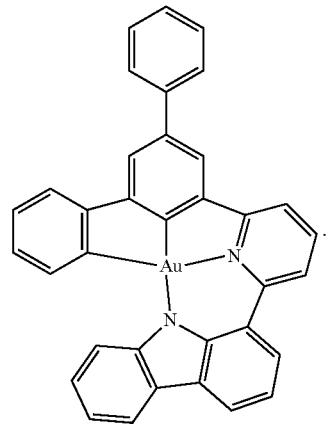

8. The method according to claim 1, wherein the luminescent compound with cyclometalated tetradentate ligand comprises:

9. The method according to claim 1, wherein the luminescent compound with cyclometalated tetradentate ligand comprises:

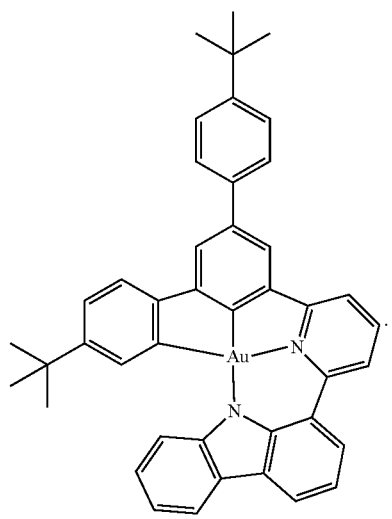

10. The method according to claim 1, wherein the luminescent compound with cyclometalated tetradentate ligand comprises:

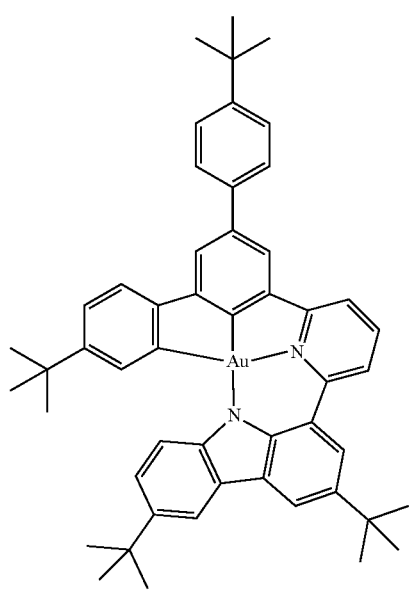

11. The method according to claim 1, wherein the luminescent compound with cyclometalated tetradentate ligand comprises:

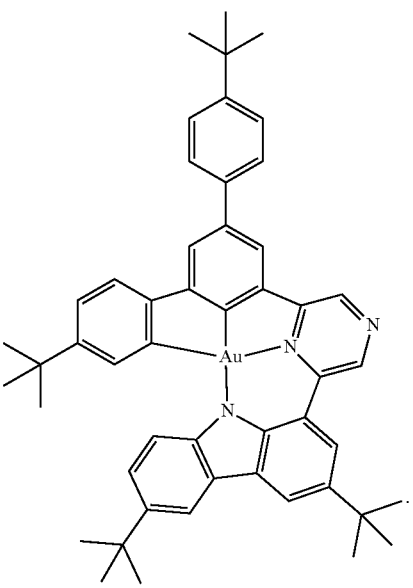

12. The method according to claim 1, wherein the luminescent compound with cyclometalated tetradentate ligand comprises:

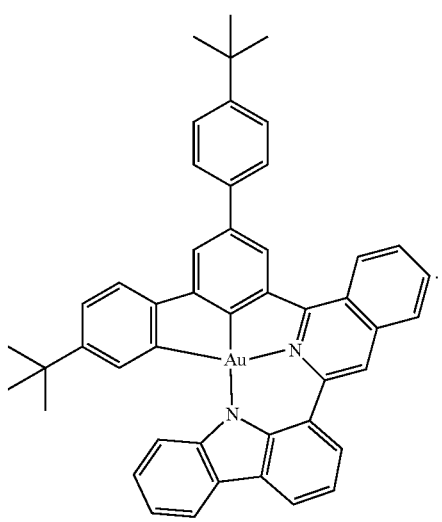

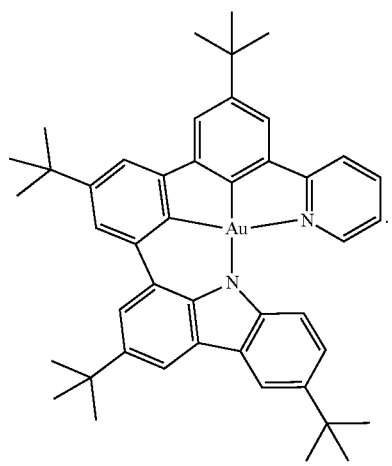
* * * * *